(12) United States Patent
Young et al.

(10) Patent No.: US 11,974,441 B2
(45) Date of Patent: Apr. 30, 2024

(54) MEMORY ARRAY INCLUDING EPITAXIAL SOURCE LINES AND BIT LINES

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chih-Yu Chang, New Taipei (TW); Chi On Chui, Hsinchu (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/138,152

(22) Filed: Dec. 30, 2020

(65) Prior Publication Data

US 2022/0052075 A1 Feb. 17, 2022

Related U.S. Application Data

(60) Provisional application No. 63/065,128, filed on Aug. 13, 2020.

(51) Int. Cl.
*H10B 51/20* (2023.01)
*H01L 29/06* (2006.01)
*H10B 51/10* (2023.01)

(52) U.S. Cl.
CPC ......... *H10B 51/20* (2023.02); *H01L 29/0653* (2013.01); *H01L 29/0669* (2013.01); *H10B 51/10* (2023.02)

(58) Field of Classification Search
CPC .......... H01L 27/1159; H01L 27/11597; H01L 29/0653; H01L 29/0669; H01L 29/0673; H10B 51/10; H10B 51/20; H10B 51/30
See application file for complete search history.

(56) References Cited

U.S. PATENT DOCUMENTS

| 7,009,250 B1 * | 3/2006 | Mouli | H01L 29/785 257/E29.28 |
| 8,785,981 B1 * | 7/2014 | Chang | H01L 29/66439 438/303 |

(Continued)

FOREIGN PATENT DOCUMENTS

| CN | 112310083 A * | 2/2021 | .......... H01L 27/1159 |
| KR | 20190024625 A | 3/2019 | |

(Continued)

*Primary Examiner* — Matthew E Warren
(74) *Attorney, Agent, or Firm* — Slater Matsil, LLP

(57) ABSTRACT

A 3D memory array in which epitaxial source/drain regions which are horizontally merged and vertically unmerged are used as source lines and bit lines and methods of forming the same are disclosed. In an embodiment, a memory array includes a first channel region over a semiconductor substrate; a first epitaxial region electrically coupled to the first channel region; a second epitaxial region directly over the first epitaxial region in a direction perpendicular to a major surface of the semiconductor substrate; a dielectric material between the first epitaxial region and the second epitaxial region, the second epitaxial region being isolated from the first epitaxial region by the dielectric material; a gate dielectric surrounding the first channel region; and a gate electrode surrounding the gate dielectric.

20 Claims, 57 Drawing Sheets

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,529,720 B2 | 1/2020 | Sills et al. |
| 10,818,324 B2 | 10/2020 | Castro et al. |
| 11,056,400 B2 | 7/2021 | Cheng et al. |
| 2018/0269229 A1 | 9/2018 | Or-Bach et al. |
| 2019/0058052 A1* | 2/2019 | Frougier ............ H01L 29/78696 |
| 2019/0081155 A1* | 3/2019 | Xie .................. H01L 29/66553 |
| 2020/0013896 A1 | 1/2020 | Xu et al. |
| 2020/0135937 A1 | 4/2020 | Kong et al. |
| 2020/0161339 A1 | 5/2020 | Lee et al. |
| 2020/0411531 A1 | 12/2020 | Sio et al. |
| 2021/0398989 A1* | 12/2021 | Lin .................... H01L 29/7869 |

FOREIGN PATENT DOCUMENTS

| | | | |
|---|---|---|---|
| TW | 201830667 A | 8/2018 | |
| WO | WO-2019168541 A1 * | 9/2019 | ............. B82Y 10/00 |

\* cited by examiner

MEMORY ARRAY INCLUDING EPITAXIAL SOURCE LINES AND BIT LINES

This application claims the benefit of U.S. Provisional Application No. 63/065,128, filed on Aug. 13, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 24A, 24B, 24C, 25A, 25B, 25C, 26A, 26B, 26C, 27A, 27B, 27C, 28A, 28B, 28C, 29A, 29B, 29C, 29D, 30A, 30B, 30C, 31A, 31B, 31C, 31D, and 32 illustrate varying views of manufacturing a semiconductor device including a memory array in accordance with some embodiments.

DETAILED DESCRIPTION

Figure 1A:
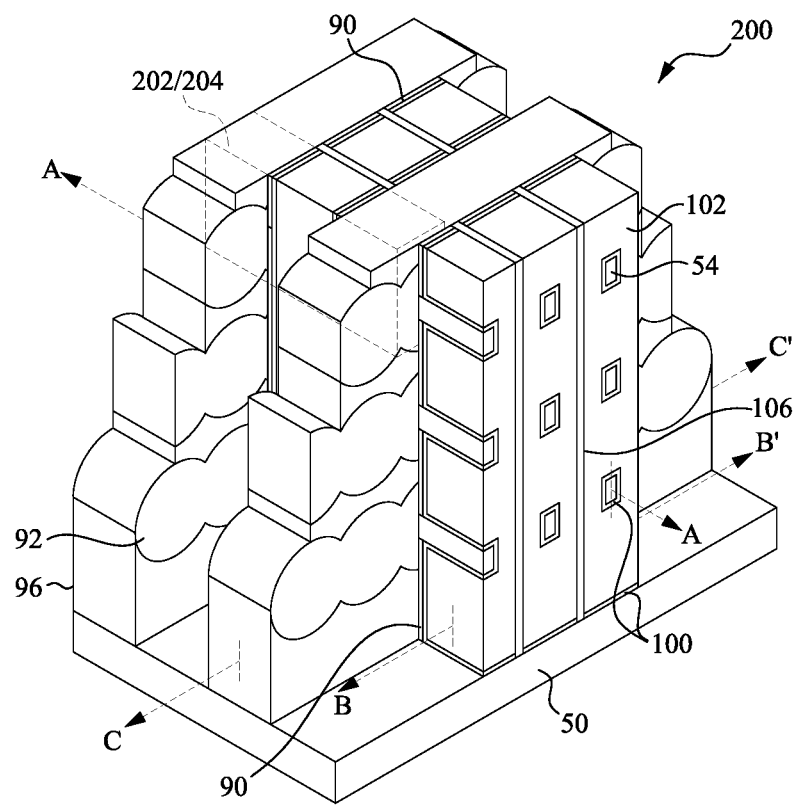
FIGS. 1A and 1B illustrate a perspective view and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array in which epitaxially grown source/drain regions merge in a horizontal direction and are isolated in a vertical direction and methods of forming the same. The method may include forming channel regions, which may be nanostructures or the like. Portions of the channel regions may be etched and the source/drain regions may be epitaxially grown from remaining portions of the channel regions. The channel regions may be formed such that source/drain regions which are adjacent in a horizontal direction merge with one another, while source/drain regions which are adjacent in a vertical direction remain unmerged. The source/drain regions may then be etched to form a staircase structure such that separate connections may be made to each set of merged source/drain regions. The source/drain regions may be used as source lines and bit lines in the 3D memory array. This method for forming the 3D memory array is compatible with existing nanostructure field-effect transistors (nanoFET) processes and allows for the 3D memory array to be formed in a reduced area, increasing device density and reducing costs.

Embodiments are described below in a particular context, namely, a die comprising nano-FETs. Various embodiments may be applied, however, to dies comprising other types of transistors (e.g., fin field effect transistors (FinFETs), planar transistors, or the like) in lieu of or in combination with the nano-FETs.

Figure 1B:
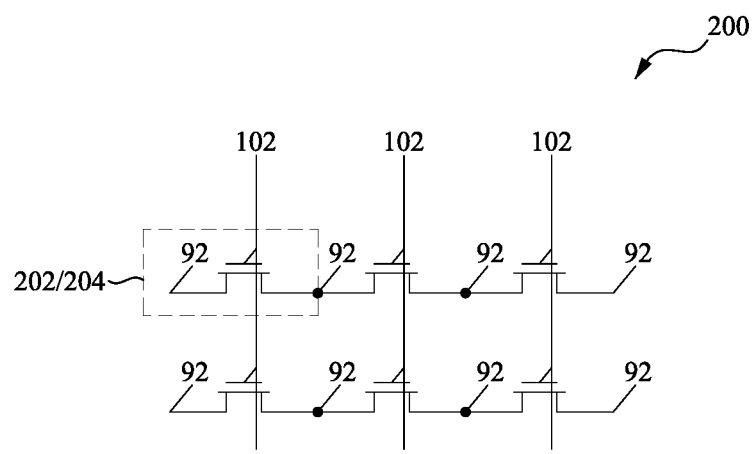

FIGS. 1A and 1B illustrate examples of a memory array 200, according to some embodiments. FIG. 1A illustrates an example of a portion of the memory array 200 in a three-dimensional view, in accordance with some embodiments, and FIG. 1B illustrates a circuit diagram of the memory array 200. The memory array 200 includes a plurality of memory cells 202, which may be arranged in a grid of rows and columns. The memory cells 202 may further stacked vertically to provide a three dimensional memory array, thereby increasing device density. In some embodiments, the memory array 200 may be disposed in the back end of line (BEOL) of a semiconductor die. For example, the memory array 200 may be disposed in the interconnect layers of the semiconductor die, such as above one or more active devices (e.g., transistors) formed on a semiconductor substrate.

In some embodiments, the memory array 200 is a flash memory array, such as a NOR flash memory array or the like. Each of the memory cells 202 may include a transistor 204 with a gate dielectric layer 100. The gate dielectric layer 100 may serve as a gate dielectric. In some embodiments, a gate electrode 102 of each transistor 204 may correspond to or be electrically coupled to a respective word line. A first epitaxial source/drain region 92 of each transistor 204 may correspond to or be electrically coupled to a respective bit line, and a second epitaxial source/drain region 92 of each transistor 204 may correspond to or be electrically coupled to a respective source line. The memory cells 202 in a same horizontal row of the memory array 200 may share a common epitaxial source/drain region 92 corresponding to a common source line and a common epitaxial source/drain region 92 corresponding to a common bit line, while the memory cells 202 in a same vertical column of the memory array 200 may share a common gate electrode 102 corresponding to a common word line.

The memory array 200 includes a plurality of vertically stacked epitaxial source/drain regions 92 with a first ILD 96 being disposed between vertically adjacent ones of the epitaxial source/drain regions 92. The epitaxial source/drain regions 92 extend in a direction parallel to a major surface of an underlying substrate 50. The epitaxial source/drain regions 92 may have a staircase configuration such that lower epitaxial source/drain regions 92 are longer than and extend laterally past endpoints of upper epitaxial source/drain regions 92. For example, in FIG. 1A, multiple stacked layers of the epitaxial source/drain regions 92 are illustrated with topmost epitaxial source/drain regions 92 being the shortest and bottommost epitaxial source/drain regions 92 being the longest. Respective lengths of the epitaxial source/drain regions 92 may increase in a direction towards the underlying substrate. In this manner, a portion of each of the epitaxial source/drain regions 92 may be accessible from above the memory array 200, and conductive contacts may be made to an exposed portion of each of the epitaxial source/drain regions 92.

The memory array 200 further includes a plurality of gate electrodes 102. The gate electrodes 102 may each extend in a direction perpendicular to the epitaxial source/drain region 92. Dielectric materials 106 are disposed between and isolate adjacent ones of the gate electrodes 102. Pairs of the epitaxial source/drain regions 92 along with an intersecting gate electrode 102 define boundaries of each memory cell 202, and dielectric materials 106 are disposed between and isolate adjacent pairs of the epitaxial source/drain regions 92. In some embodiments, alternating stacks of the epitaxial source/drain regions 92 may be electrically coupled to ground and a voltage source.

The memory array 200 may also include nanostructures 54. The nanostructures 54 may provide channel regions for the transistors 204 of the memory cells 202. For example, when an appropriate voltage (e.g., higher than a respective threshold voltage ($V_{th}$) of a corresponding transistor 204) is applied through a gate electrode 102, a nanostructure 54 that intersects the gate electrode 102 may allow current to flow from a first epitaxial source/drain region 92 on a first side of the nanostructure 54 to a second epitaxial source/drain region 92 on a second side of the nanostructure 54 opposite the first side of the nanostructure 54.

The gate dielectric layers wo are disposed between the gate electrodes 102 and the nanostructures 54, and the gate dielectric layers wo provide gate dielectrics for the transistors 204. In some embodiments, the gate dielectric layers wo comprise ferroelectric (FE) materials, such as hafnium oxide, hafnium zirconium oxide, silicon-doped hafnium oxide, or the like. Accordingly, the memory array 200 may be referred to as a ferroelectric random access memory (FERAM) array. Alternatively, the gate dielectric layers wo may be multilayer structures, different ferroelectric materials, different types of memory layers (e.g., capable of storing a bit), or the like. Using ferroelectric materials for the gate dielectric layers wo may result in a threshold voltage ($V_{th}$) shift and provide memory reliability and improved performance.

In embodiments in which the gate dielectric layers 100 comprise FE materials, the gate dielectric layers 100 may be polarized in one of two different directions. The polarization direction may be changed by applying an appropriate voltage differential across the gate dielectric layers 100 and generating an appropriate electric field. Depending on a polarization direction of a particular gate dielectric layer 100, a threshold voltage of a corresponding transistor 204 varies and a digital value (e.g., a 0 or a 1) can be stored. For example, when a gate dielectric layer 100 has a first electrical polarization direction, the corresponding transistor 204 may have a relatively low threshold voltage, and when the gate dielectric layer 100 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a gate dielectric layer 100 corresponding to the memory cell 202. The write voltage can be applied, for example, by applying appropriate voltages to a gate electrode 102 (e.g., through a corresponding word line) and the corresponding epitaxial source/drain regions 92 (e.g., through corresponding bit and source lines). By applying the write voltage across the gate dielectric layer 100, a polarization direction of the gate dielectric layer 100 can be changed. As a result, the corresponding threshold voltage of the corresponding transistor 204 can be switched from a low threshold voltage to a high threshold voltage or vice versa and a digital value can be stored in the memory cell 202. Because the gate electrodes 102 intersect the epitaxial source/drain regions 92, individual memory cells 202 may be selected for the write operation.

To perform a read operation on the memory cell 202, a read voltage (e.g., a voltage between the low and high threshold voltages) is applied to the corresponding gate electrode 102 (e.g., through the corresponding word line). Depending on the polarization direction of the corresponding gate dielectric layer 100, the transistor 204 of the memory cell 202 may or may not be turned on. As a result, the corresponding epitaxial source/drain region 92 (e.g., the corresponding epitaxial source/drain region electrically coupled to the source line) may or may not be discharged through the corresponding epitaxial source/drain region 92 (e.g., the corresponding epitaxial source/drain region electrically coupled to ground), and the digital value stored in the memory cell 202 can be determined. Because the gate electrodes 102 intersect the epitaxial source/drain regions 92, individual memory cells 202 may be selected for the read operation.

FIG. 1A further illustrates reference cross-sections of the memory array 200 that are used in later figures. Cross-section A-A' is along longitudinal axes of the nanostructures 54 and in a direction parallel to the direction of current flow across the nanostructures 54 of the transistors 204. Cross-section B-B' is perpendicular to the cross-section A-A' and extends through the gate electrodes 102 in a direction parallel to longitudinal axes of the epitaxial source/drain regions 92. Cross-section C-C' is parallel to the cross-section B-B' and extends through the epitaxial source/drain regions 92. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 32 are cross-sectional and top-down views of intermediate stages in the manufacturing of the memory array 200, in accordance with some embodiments. FIGS. 2, 3, 4A, 5A, 6A, 7A, 8, 9A, 9B, 10A, 11A, 12A, 13A, 14A, 15A, 16A, 17A, 18A, 19A, 20A, 21A, 22A, 24A, 25A, 26A, 27A, 28A, 29A, 30A, and 31A illustrate reference cross-section A-A' illustrated in FIG. 1A. FIGS. 4B, 5B, 6B, 7B, 10B, 11B, 12B, 13B, 14B, 15B, 15E, 15F, 16B, 17B, 18B, 19B, 20B, 21B, 22B, 24B, 25B, 26B, 27B, 28B, 29B, 30B, and 31B illustrate reference cross-section B-B' illustrated in FIG. 1A. FIGS. 10C, 11C, 12C, 13C, 14C, 15C, 16C, 17C, 18C, 19C, 20C, 21C, 22C, 29C, 30C, and 31C illustrate reference cross-section C-C' illustrated in FIG. 1A. FIGS. 4C, 5C, 6C, 7C, 10D, 11D, 12D, 13D, 14D, 15D, 16D, 17D, 18D, 19D, 20D, 21D, 22D, 23, 24C, 25C, 26C, 27C, 28D, 29D, 30D, 31D, and 32 illustrate a top-down view.

Figure 2:
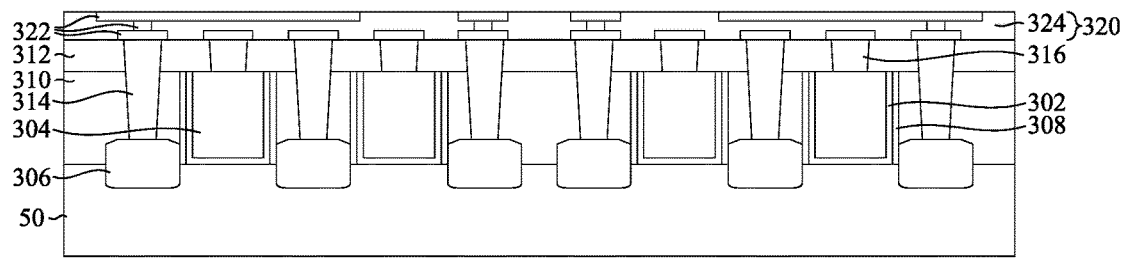
FIGS. 2, 3, 4A, 4B, 4C, 5A, 5B, 5C, 6A, 6B, 6C, 7A, 7B, 7C, 8, 9A, 9B, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 15E, 15F, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 22A, 22B, 22C, 22D, and 23 illustrate varying views of manufacturing a semiconductor device including a memory array in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or un-doped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may comprise fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first ILD 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 including one or more stacked dielectric layers 324 and conductive features 322 formed in the one or more dielectric layers 324 is over the second ILD 312, the source/drain contacts 314, and the gate contacts 316. The interconnect structure 320 may be electrically connected to the gate contacts 316 and the source/drain contacts 314 to form functional circuits. In some embodiments, the functional circuits formed by the interconnect structure 320 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits. The transistors, the ILDs, and the interconnect structure 320 formed over the substrate 50 may be omitted from subsequent drawings for the purposes of simplicity and clarity. The substrate 50 along with the transistors (e.g., the source/drain regions 306, the gate dielectric layers 302, and the gate electrodes 304), the gate spacers 308, the first ILD 310, the second ILD 312, and the interconnect structure 320 may be a CMOS under array (CUA), a logic die, or the like.

In some embodiments, the substrate 50 may include an n-type region and a p-type region (not separately illustrated). The n-type region can be for forming n-type devices, such as NMOS transistors, e.g., n-type nano-FETs, and the p-type region can be for forming p-type devices, such as PMOS transistors, e.g., p-type nano-FETs. The n-type region may be physically separated from the p-type region, and any number of device features (e.g., other active devices, doped regions, isolation structures, etc.) may be disposed between the n-type region and the p-type region. Any number of n-type regions and p-type regions may be provided.

Figure 3:
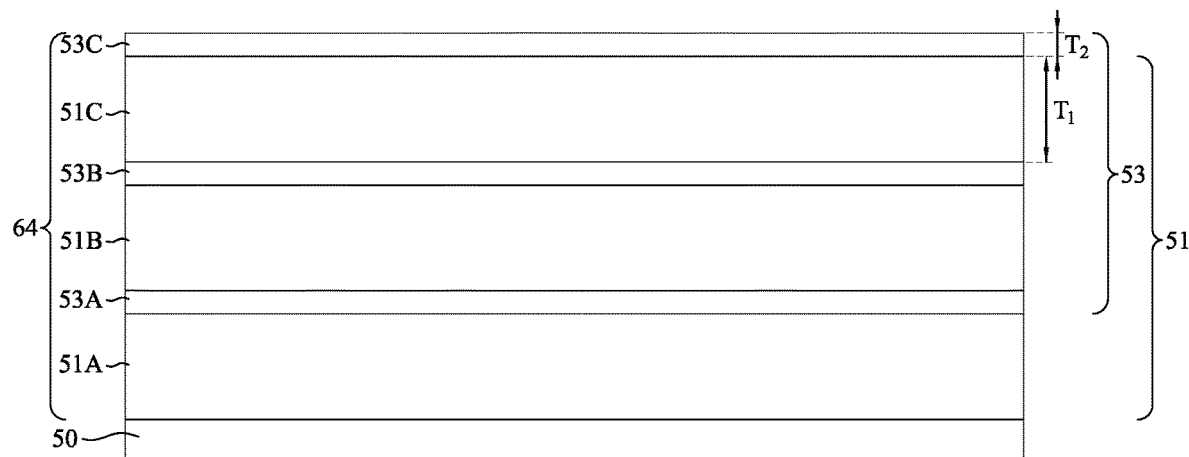

In FIG. 3, a multi-layer stack 64 is formed over the structure of FIG. 2. The transistors, the ILDs, and the interconnect structure 320 may be omitted from subsequent drawings for the purposes of simplicity and clarity. Although the multi-layer stack 64 is illustrated as contacting the substrate 50, any number of intermediate layers may be disposed between the substrate 50 and the multi-layer stack 64. For example, one or more interconnect layers comprising conductive features in insulting layers (e.g., low-k dielectric layers) may be disposed between the substrate 50 and the multi-layer stack 64. In some embodiments, the conductive features may be patterned to provide power, ground, and/or signal lines for the active devices on the substrate 50 and/or the memory array 200 (see FIGS. 1A and 1B). In some embodiments, the multi-layer stack 64 may be formed directly over the substrate 50.

The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the first semiconductor layers 51 will be removed and the second semiconductor layers 53 will be patterned to form channel regions of nano-FETs in both the p-type region and the n-type region. In some embodiments the second semiconductor layers 53 may be removed and the first semiconductor layers 51 may be patterned to form channel regions of nano-FETs in either the n-type region, the p-type region, or both the n-type region and the p-type region. In embodiments in which the channel regions are formed from the first semiconductor layers 51 or the second semiconductor layers 53 in both the n-type region and the p-type region, the channel regions in both the n-type region and the p-type region may have a same material composition (e.g., silicon or the another semiconductor material) and may be formed simultaneously.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In some embodiments, the first semiconductor layers 51 may be formed of first semiconductor materials, such as silicon germanium or the like, and the second semiconductor layers 53 may be formed of second semiconductor materials, such as silicon, silicon carbon, silicon germanium, germanium, or the like. In embodiments in which the first semiconductor materials and the second semiconductor materials are formed of silicon germanium, the first semiconductor materials and the second semiconductor materials may have different concentrations of silicon and germanium from one another such that the first semiconductor materials and the second semiconductor materials can be selectively etched with respect to one another. The multi-layer stack 64 is illustrated as having a one of the first semiconductor layers 51 as a bottommost semiconductor layer for illustrative purposes. In some embodiments, the multi-layer stack 64 may be formed such that the bottommost layer is one of the second semiconductor layers 53.

The first semiconductor materials and the second semiconductor materials may be materials having a high-etch selectivity to one another. As such, the first semiconductor layers 51 of the first semiconductor materials may be removed without significantly removing the second semiconductor layers 53 of the second semiconductor materials, thereby allowing the second semiconductor layers 53 to be patterned to form channel regions of the nano-FETs. Similarly, in embodiments in which the second semiconductor layers 53 of the second semiconductor material are removed, the second semiconductor layers 53 of the second semiconductor material may be removed without significantly removing the first semiconductor layers 51 of the first semiconductor material, thereby allowing the first semiconductor layers 51 to be patterned to form channel regions of the nano-FETs.

The first semiconductor layers 51 may be formed with thicknesses $T_1$ ranging from about 100 nm to about 500 nm, while the second semiconductor layers 53 may be formed with thicknesses $T_2$ ranging from about 10 nm to about 50 nm. In some embodiments, a ratio of the thicknesses $T_1$ of the first semiconductor layers 51 to the thicknesses $T_2$ of the second semiconductor layers 53 may range from about 2 to about 10. Forming the first semiconductor layers 51 and the second semiconductor layers 53 with the prescribed thicknesses may help to allow horizontally adjacent ones of subsequently formed epitaxial source/drain regions (such as the epitaxial source/drain regions 92, discussed below with respect to FIGS. 10A through 10D) to merge, while vertically adjacent ones of the subsequently formed epitaxial source/drain regions are unmerged. This allows for the horizontally merged epitaxial source/drain regions to be used as source lines and bit lines and prevents shorts between vertically adjacent epitaxially source/drain regions. Using the merged epitaxial source/drain regions as source lines and bit lines reduces device size, improves device density, and reduces costs.

Figure 4A:
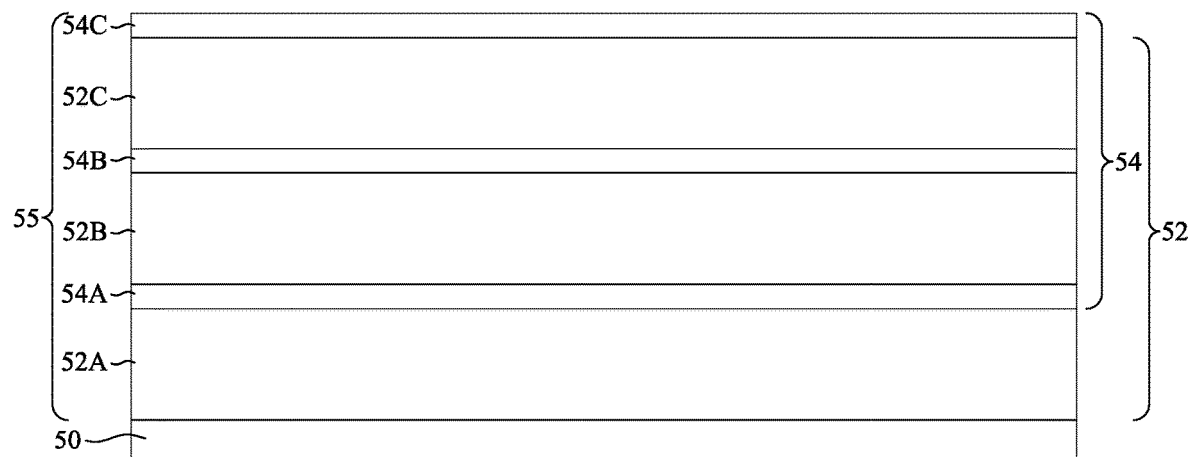
Figure 4B:
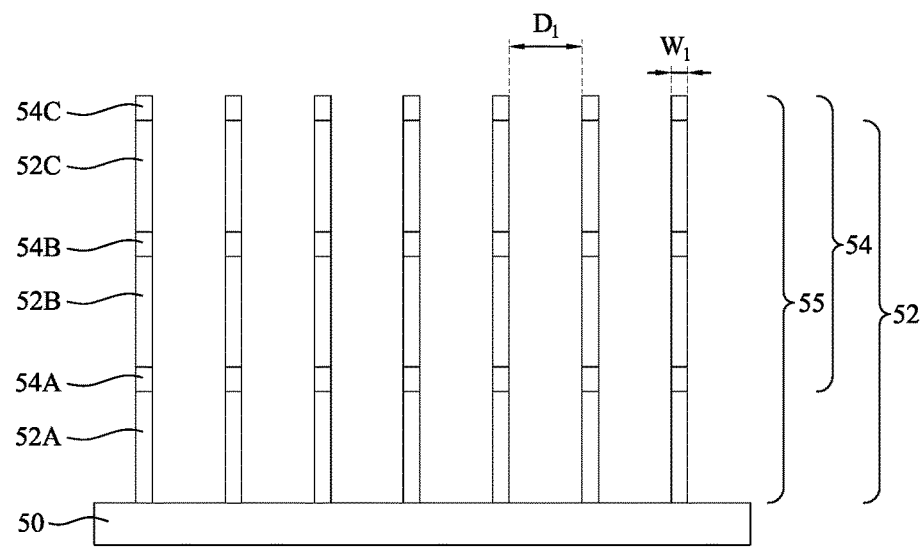
Figure 4C:
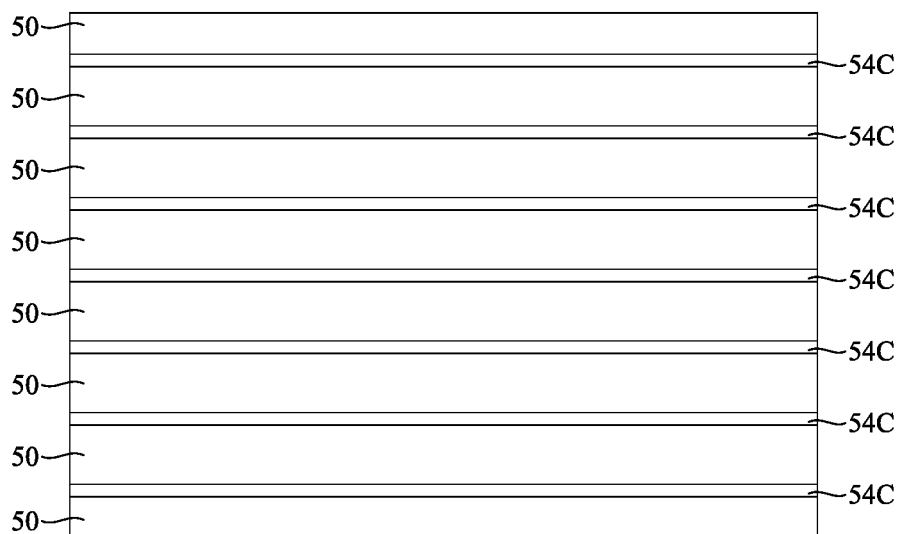

In FIGS. 4A through 4C, nanostructures 55 are formed in the multi-layer stack 64. In some embodiments, the nanostructures 55 may be formed in the multi-layer stack 64 by etching trenches in the multi-layer stack 64. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may define first nanostructures 52A-C (collectively referred to as the first nanostructures 52) from the first semiconductor layers 51 and may define second nanostructures 54A-C (collectively referred to as the second nanostructures 54) from the second semiconductor layers 53. The first nanostructures 52 and the second nanostructures 54 may be collectively referred to as the nanostructures 55.

The nanostructures 55 may be patterned by any suitable method. For example, the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55.

In some embodiments, the nanostructures 55 in the n-type region and the p-type region may have substantially equal widths; however, widths of the nanostructures 55 may be greater in either the n-type region or the p-type region. Further, while each of the nanostructures 55 are illustrated as having a consistent width throughout, in some embodiments, the nanostructures 55 may have tapered sidewalls such that a width of each of the nanostructures 55 continuously increases in a direction towards the substrate 50. In such embodiments, each of the nanostructures 55 may have a different width and be trapezoidal in shape.

The nanostructures 55 may have widths $W_1$ ranging from about 10 nm to about 50 nm. The nanostructures 55 may be separated by distances $D_1$ ranging from about 50 nm to about 100 nm. Forming the first nanostructures 55 with the prescribed widths and pitches may help to allow horizontally adjacent ones of subsequently formed epitaxial source/drain regions (such as the epitaxial source/drain regions 92, discussed below with respect to FIGS. 10A through 10D) to merge, while vertically adjacent ones of the subsequently formed epitaxial source/drain regions are unmerged. This allows for the horizontally merged epitaxial source/drain regions to be used as source lines and bit lines and prevents shorts between vertically adjacent epitaxially source/drain regions. Using the merged epitaxial source/drain regions as source lines and bit lines reduces device size, improves device density, and reduces costs.

The process described above with respect to FIGS. 3 through 4C is just one example of how the nanostructures 55 may be formed. In some embodiments, the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and the resulting first nanostructures 52) and the second semiconductor layers 53 (and the resulting second nanostructures 54) are illustrated and discussed herein as comprising the same materials in the p-type region and the n-type region for illustrative purposes only. As such, in some embodiments one or both of the first semiconductor layers 51 and the second semiconductor layers 53 may be different materials or formed in a different order in the p-type region and the n-type region.

Further in FIGS. 4A through 4C, appropriate wells (not separately illustrated) may be formed in the nanostructures 55. In embodiments with different well types, different implant steps for the n-type region and the p-type region may be achieved using a photoresist or other masks (not separately illustrated). For example, a photoresist may be formed over the nanostructures 55 and the substrate 50 in the n-type region and the p-type region. The photoresist is patterned to expose the p-type region. The photoresist can be formed by using a spin-on technique and can be patterned using acceptable photolithography techniques. Once the photoresist is patterned, an n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process. This process may then be repeated to perform a p-type impurity implant in the n-type region with a photoresist being formed and patterned to substantially prevent p-type impurities from being implanted into the p-type region. The p-type impurities may be boron, boron fluoride, indium, or the like implanted in the region to a concentration in a range from about $10^{13}$ atoms/cm$^3$ to about $10^{14}$ atoms/cm$^3$. After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5A:
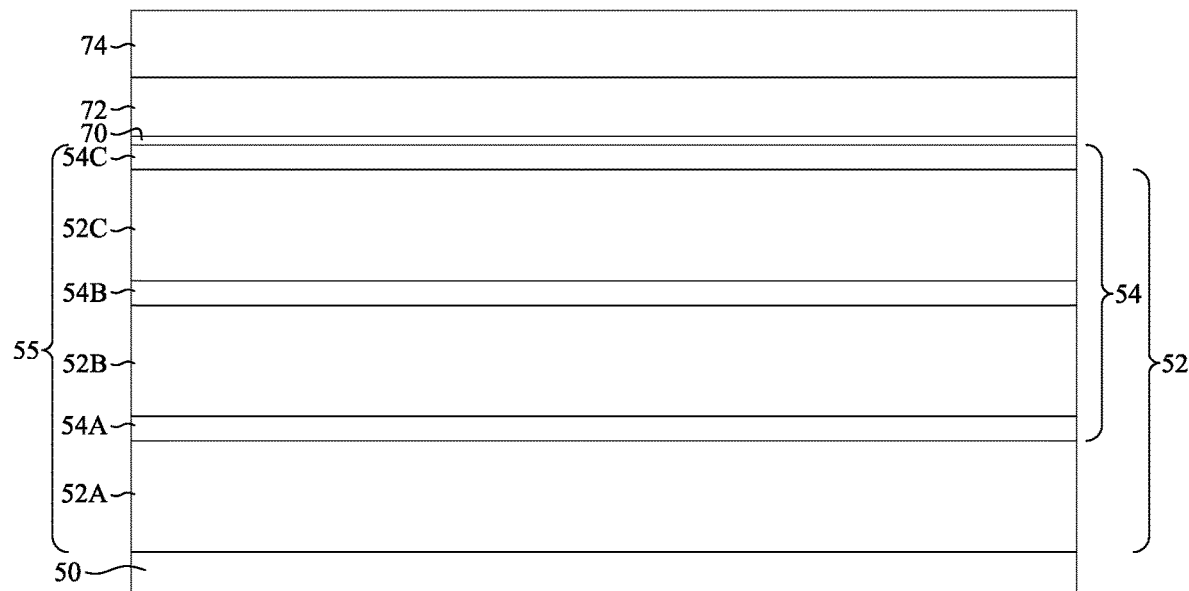
Figure 5B:
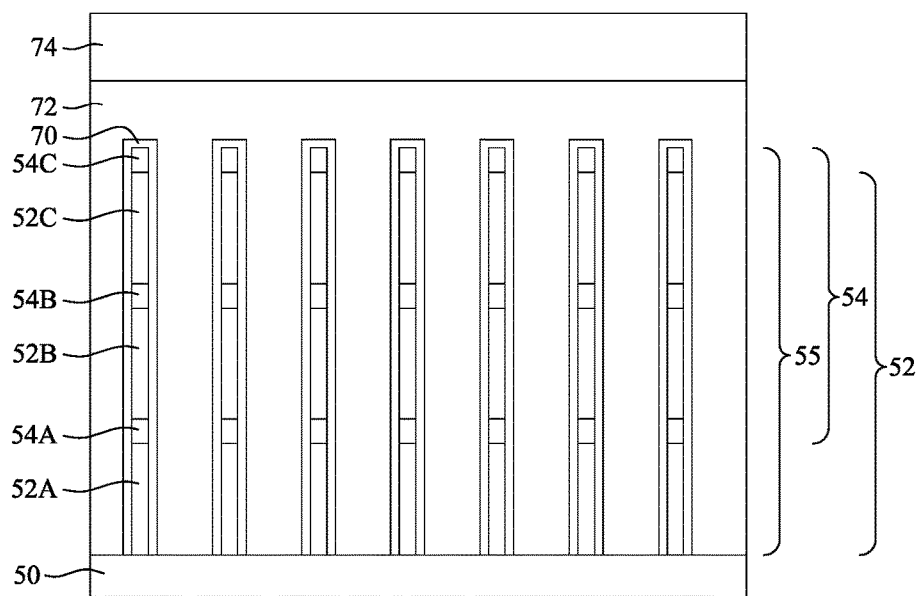
Figure 5C:

In FIGS. 5A through 5C, a dummy dielectric layer 70 is formed on the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region and the p-type region. It is noted that the dummy dielectric layer 70 is shown covering only the nanostructures 55 for illustrative purposes only. In some embodiments, the dummy dielectric layer 70 may be deposited such that the dummy dielectric layer 70 covers the substrate 50, such that the dummy dielectric layer 70 extends between the dummy gate layer 72 and the substrate 50.

Figure 6A:
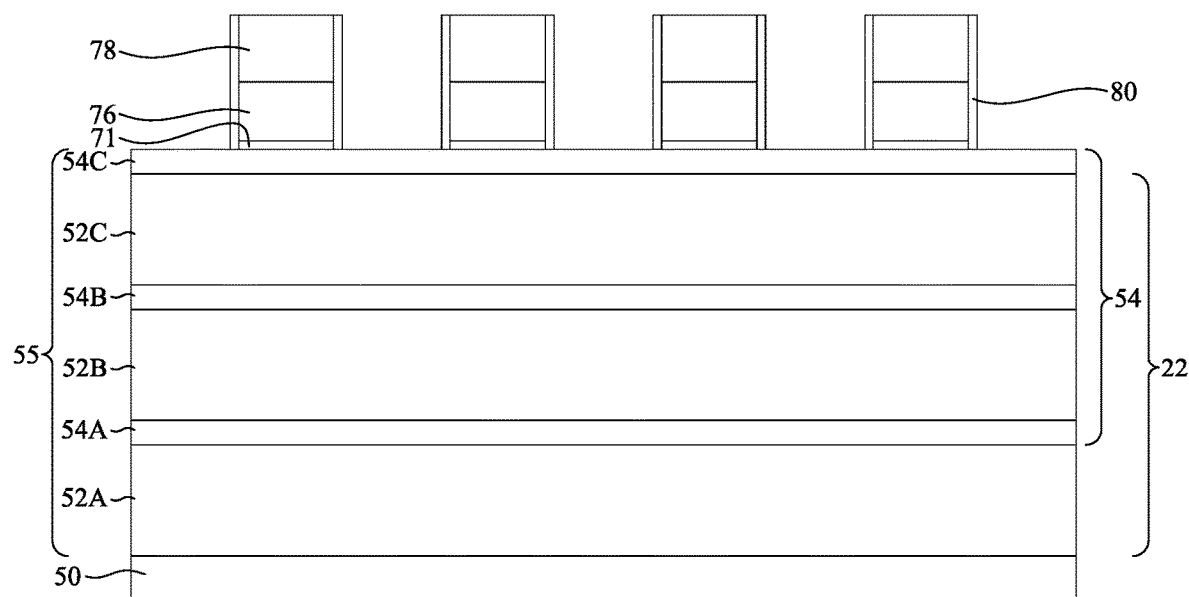
Figure 6B:
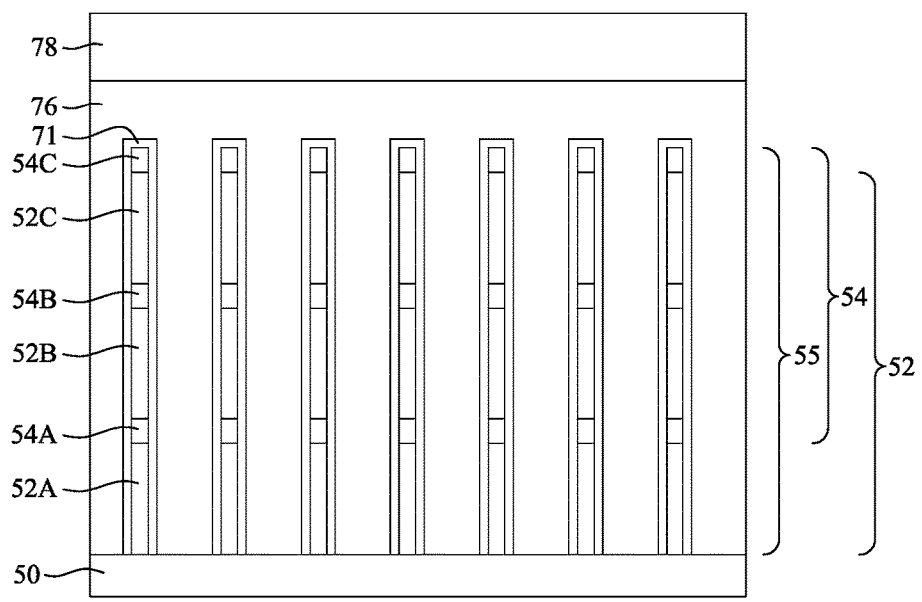
Figure 6C:
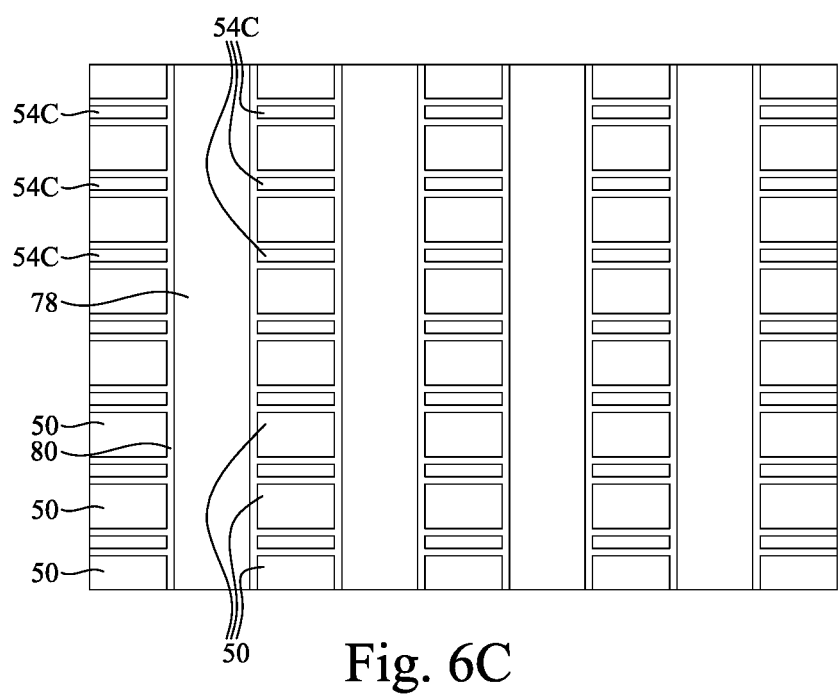

In FIGS. 6A through 6C, the mask layer 74 (see FIGS. 5A through 5C) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective nanostructures 55.

Further in FIGS. 6A through 6C, first spacers 80 are formed over the nanostructures 55, adjacent the dummy gate dielectrics 71, the dummy gates 76, and the masks 78. The first spacers 80 may act as spacers for forming self-aligned source/drain regions. The first spacers 80 may be formed by depositing a first spacer layer (not separately illustrated) on top surfaces of the substrate 50; top surfaces and sidewalls of the nanostructures 55 and the masks 78; and sidewalls of the dummy gates 76 and the dummy gate dielectric 71. The first spacer layer may be formed of silicon oxide, silicon nitride, silicon oxynitride, or the like, using techniques such as thermal oxidation or deposited by CVD, ALD, or the like.

After the first spacer layer is formed, implants for lightly doped source/drain (LDD) regions (not separately illustrated) may be performed. In embodiments with different device types, similar to the implants discussed above in FIGS. 4A through 4C, a mask, such as a photoresist, may be formed over the n-type region, while exposing the p-type region, and appropriate type (e.g., p-type) impurities may be implanted into the exposed nanostructures 55 in the p-type region. The mask may then be removed. Subsequently, a mask, such as a photoresist, may be formed over the p-type region while exposing the n-type region, and appropriate type impurities (e.g., n-type) may be implanted into the exposed nanostructures 55 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

The first spacer layer may then be etched to form the first spacers 80. As will be discussed in greater detail below, the first spacers 80 act to self-align subsequently formed source drain regions, as well as to protect sidewalls of the nanostructure 55 during subsequent processing. The first spacer layer may be etched using a suitable etching process, such as an isotropic etching process (e.g., a wet etching process), an anisotropic etching process (e.g., a dry etching process), or the like. As illustrated in FIG. 6A, the first spacers 80 may be disposed on sidewalls of the masks 78, the dummy gates 76, and the dummy gate dielectrics 71. As illustrated in FIG. 6C, the first spacers 80 may be further disposed on sidewalls of the nanostructures 55.

It is noted that the above disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type and p-type devices may be formed using different structures and steps.

Figure 7A:
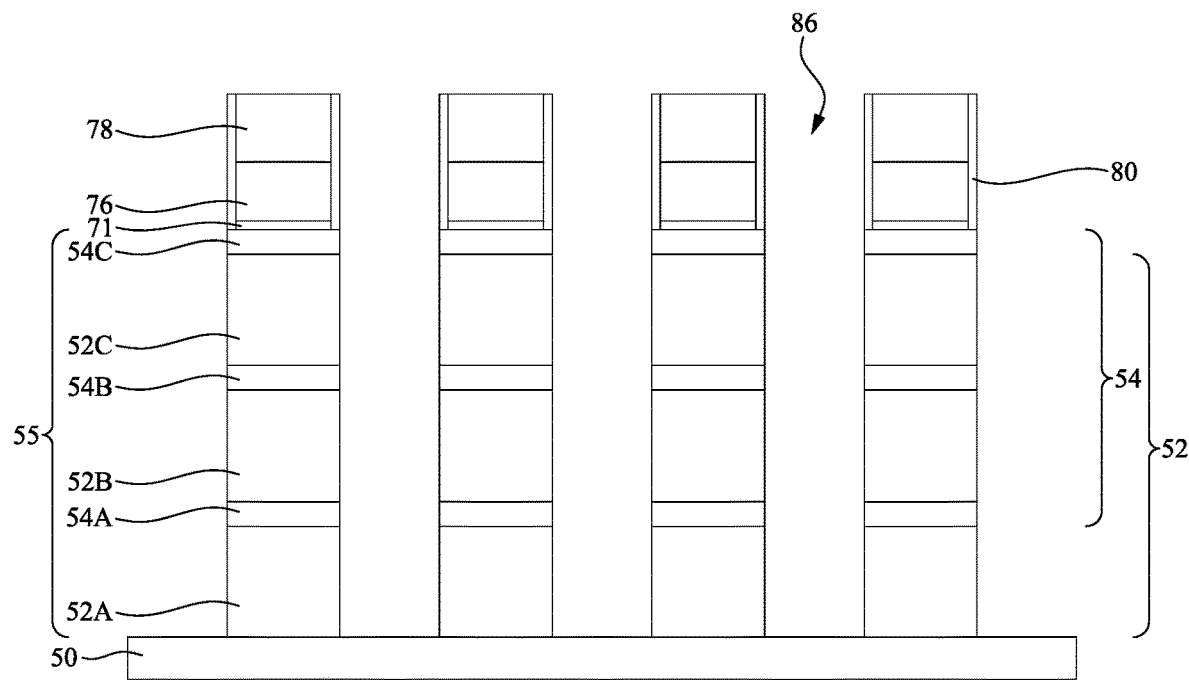
Figure 7B:
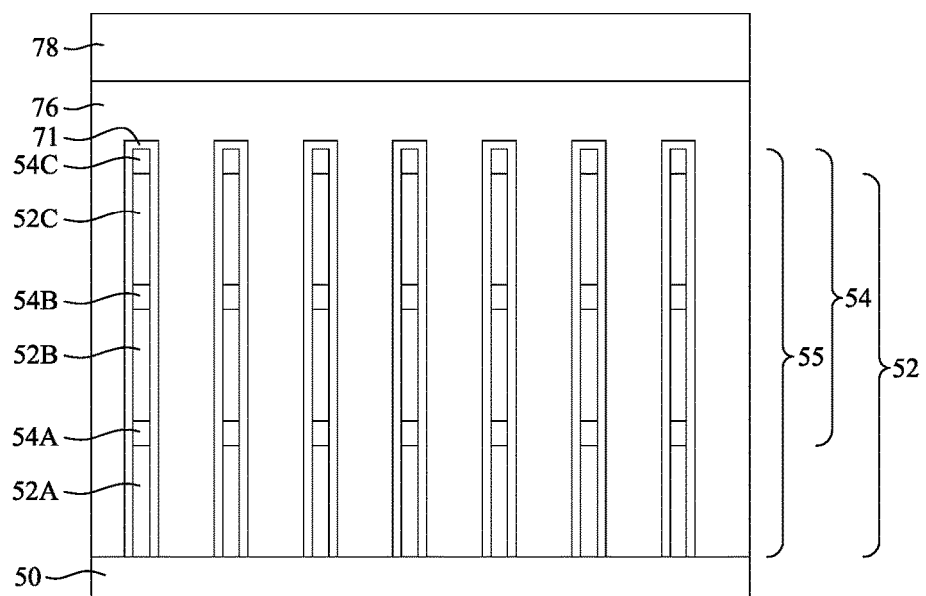
Figure 7C:
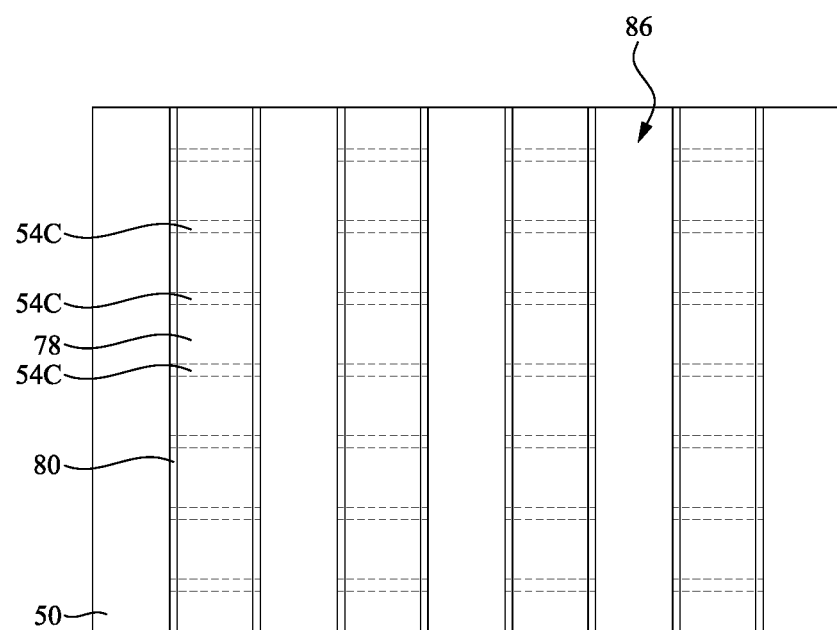

In FIGS. 7A through 7C, first recesses 86 are formed in the nanostructures 55. In some embodiments, the first recesses 86 may also extend at least partially into the substrate 50. Epitaxial source/drain regions will be subsequently formed in the first recesses 86. The first recesses 86 may extend through the first nanostructures 52 and the second nanostructures 54. As illustrated in FIG. 7A, the first recesses 86 may extend to top surfaces of the substrate 50. The first recesses 86 may be formed by etching the nanostructures 55 using anisotropic etching processes, such as RIE, NBE, or the like. The first spacers 80 and the masks 78 mask portions of the nanostructures 55 during the etching processes used to form the first recesses 86. A single etch process or multiple etch processes may be used to etch each layer of the nanostructures 55. Timed etch processes may be used to stop the etching of the first recesses 86 after the first recesses 86 reach a desired depth.

Figure 8:
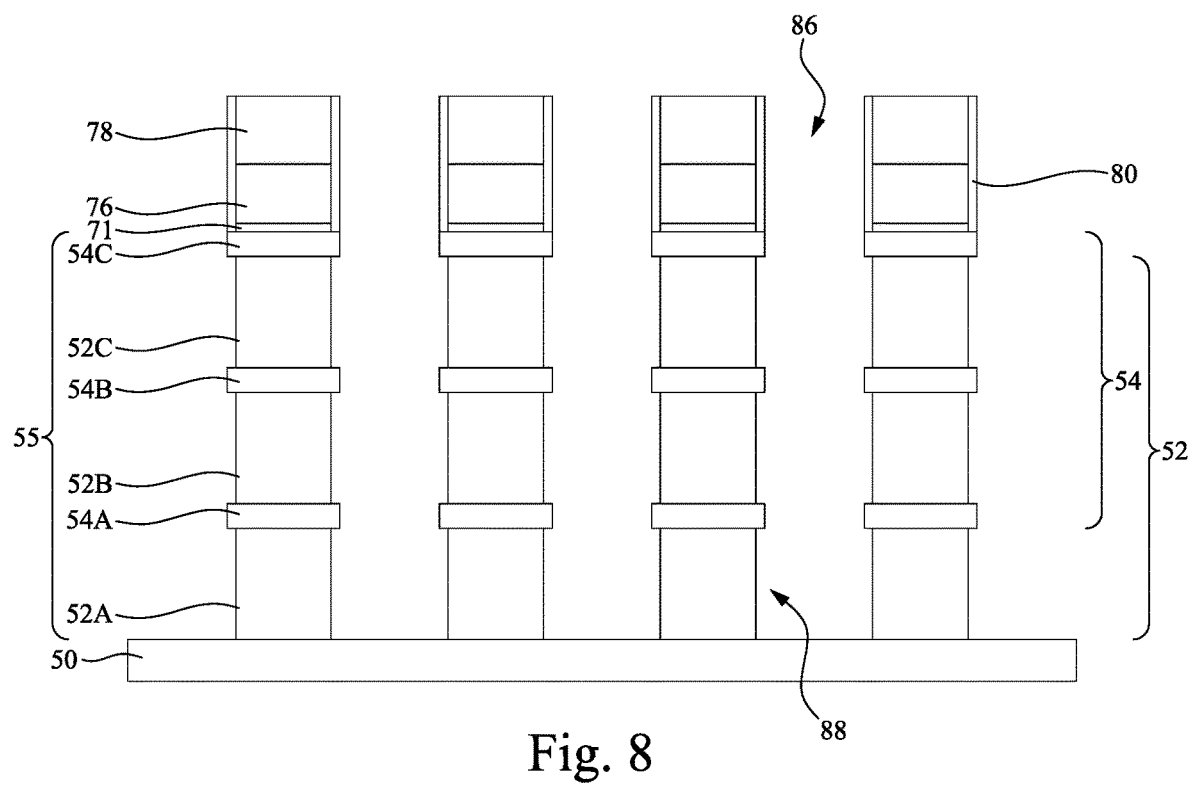

In FIG. 8, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 adjacent the sidewall recesses 88 are illustrated as being straight in FIG. 8, the sidewalls may be concave or convex. The sidewalls may be etched using isotropic etching processes, such as wet etching or the like. In an embodiment in which the first nanostructures 52 include, e.g., silicon germanium, and the second nanostructures 54 include, e.g., silicon or silicon carbide, a wet or dry etch process with hydrogen fluoride, another fluorine-based etchant, or the like may be used to etch sidewalls of the first nanostructures 52.

Figure 9A:
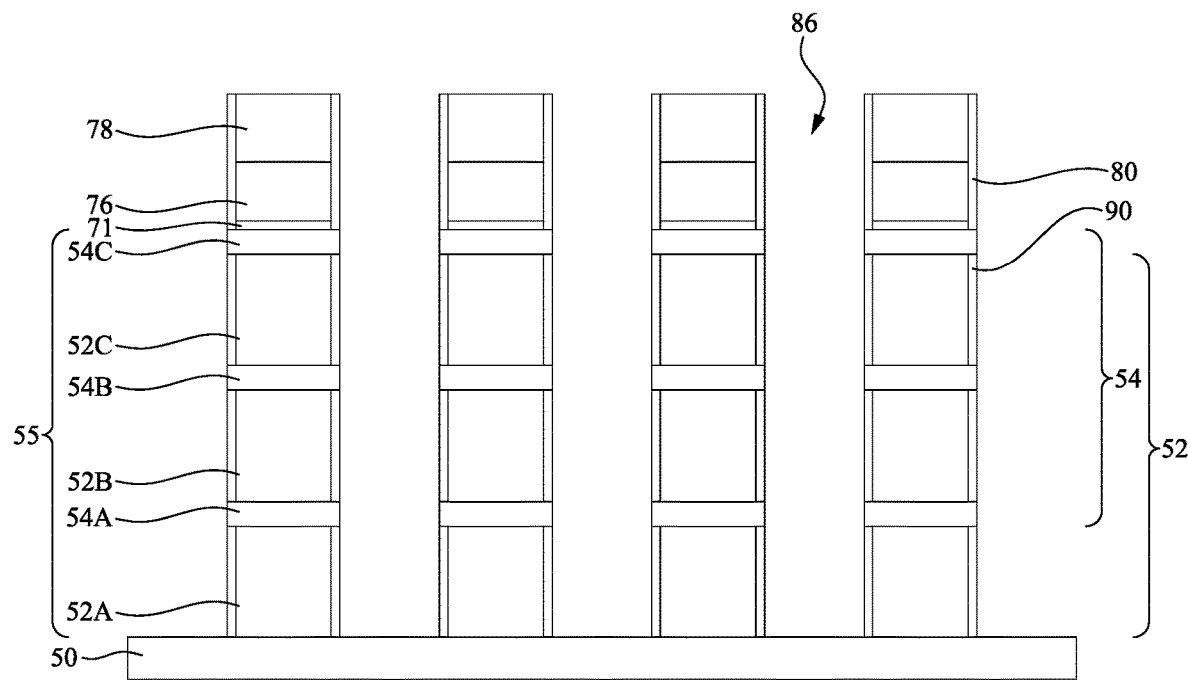
Figure 9B:
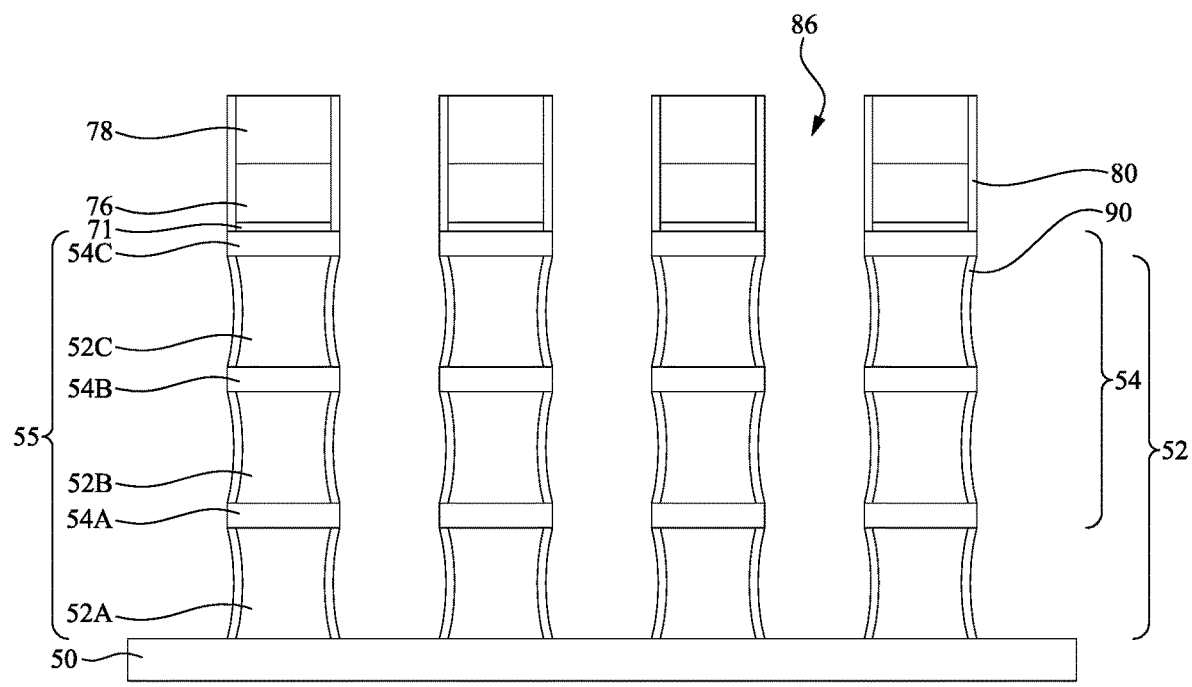

In FIGS. 9A and 9B, first inner spacers 90 are formed in the sidewall recess 88. The first inner spacers 90 may be formed by depositing an inner spacer layer (not separately illustrated) over the structures illustrated in FIG. 8. The first inner spacers 90 act as isolation features between subsequently formed source/drain regions and a gate structure. As will be discussed in greater detail below, the source/drain regions will be formed in the first recesses 86, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Moreover, although the outer sidewalls of the first inner spacers 90 are illustrated as being straight in FIG. 9A, the outer sidewalls of the first inner spacers 90 may be concave or convex. As an example, FIG. 9B illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 10A through 10D) by subsequent etching processes, such as etching processes used to form gate structures.

Figure 10A:
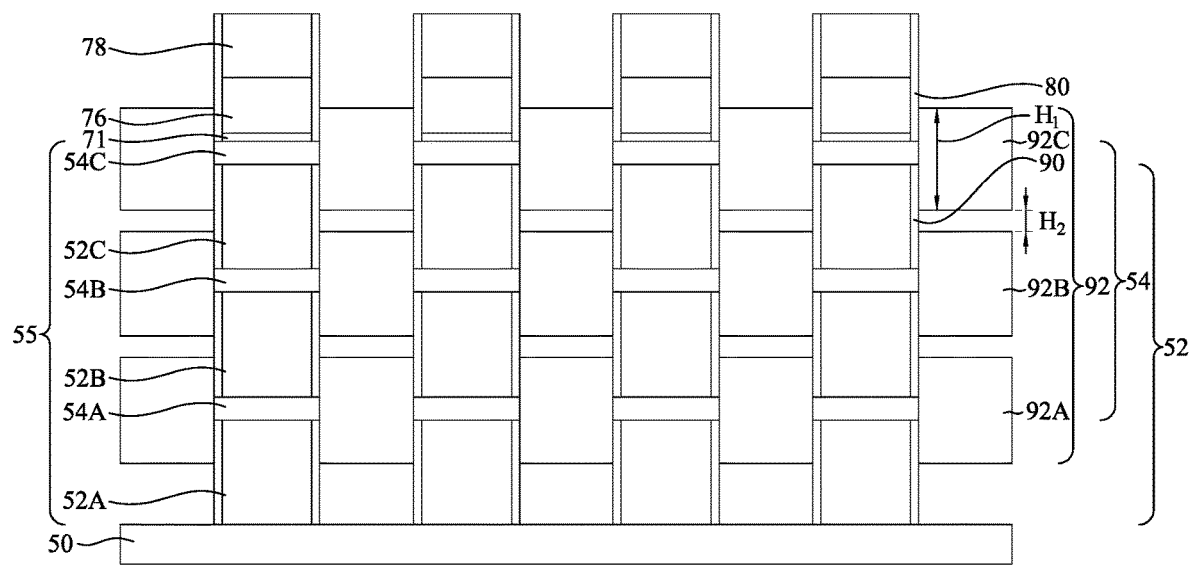
Figure 10B:
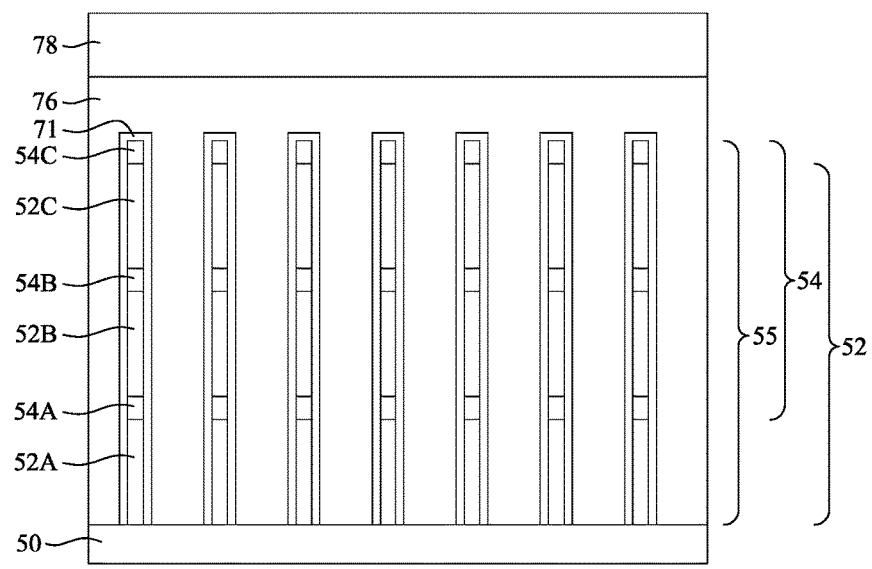

In FIGS. 10A through 10D, epitaxial source/drain regions 92A-C are formed in the first recesses 86. The epitaxial source/drain regions 92A-C may be collectively referred to as epitaxial source/drain regions 92. In some embodiments, the epitaxial source/drain regions 92 may exert stress on the second nanostructures 54, thereby improving performance. As illustrated in FIG. 10A, the epitaxial source/drain regions 92 are formed in the first recesses 86 such that each dummy gate 76 is disposed between respective neighboring pairs of the epitaxial source/drain regions 92. In some embodiments, the first spacers 80 are used to separate the epitaxial source/drain regions 92 from the dummy gates 76 and the first inner spacers 90 are used to separate the epitaxial source/drain regions 92 from the first nanostructures 52 by appropriate lateral distances so that the epitaxial source/drain regions 92 do not short out with subsequently formed gates of the resulting nano-FETs.

Figure 10C:
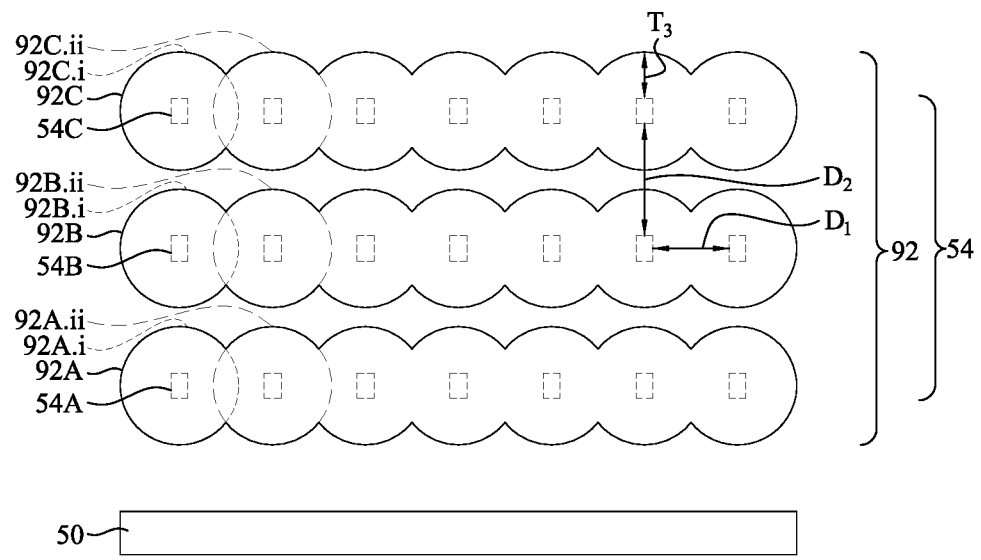
Figure 10D:
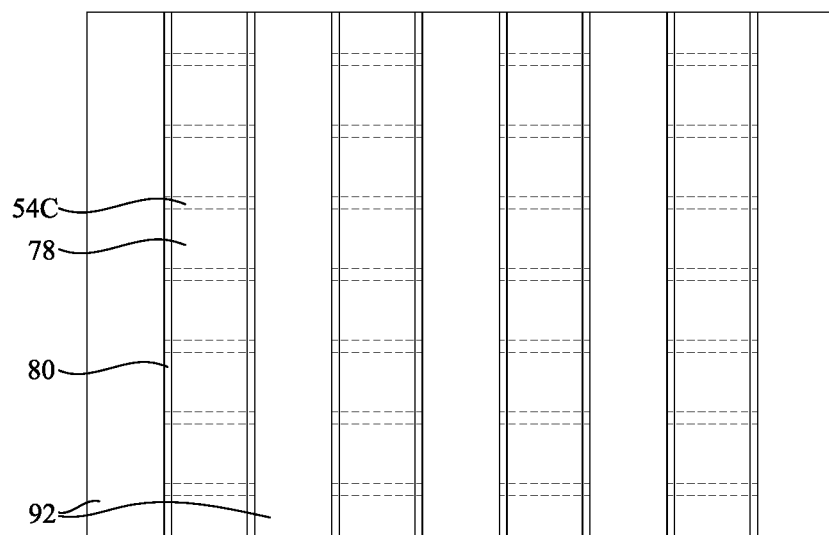

As illustrated in FIGS. 10A, 10C, and 10D, the epitaxial source/drain regions 92A-C (collectively referred to as epitaxial source/drain regions 92) may be epitaxially grown from the second nanostructures 54A-C, respectively. The epitaxial source/drain regions 92 may be grown such that horizontally adjacent epitaxial source/drain regions 92 (e.g., epitaxial source/drain regions 92 which are adjacent to one another in a direction parallel to a major surface of the substrate 50), exemplified by epitaxial source/drain regions 92A.i and 92A.ii, epitaxial source/drain regions 92B.i and 92B.ii, epitaxial source/drain regions 92C.i and 92C.ii, and corresponding dashed lines, merge with one another. On the other hand, vertically adjacent epitaxial source/drain regions 92 (e.g., epitaxial source/drain regions 92 which are directly over/under one another in a direction perpendicular to the major surface of the substrate 50), exemplified by the epitaxial source/drain regions 92A-C, remain separated from one another. The epitaxial source/drain regions 92 may extend from sidewalls of the second nanostructures 54 and may extend along sidewalls of the first inner spacers 90 and the first spacers 80.

The epitaxial source/drain regions 92 may be epitaxially grown to have thicknesses $T_3$ ranging from about 30 nm to about 200 nm. The epitaxial source/drain regions 92 may have heights $H_1$ ranging from about 50 nm to about 400 nm and may be separated from one another by gaps 93 having heights $H_2$ ranging from about 50 nm to about 200 nm. The spacing and dimensions of the first nanostructures 52 and the second nanostructures 54 may be selected along with the thickness $T_3$ in order to allow the horizontally adjacent epitaxial source/drain regions 92 to merge with one another, while the vertically adjacent epitaxial source/drain regions 92 remain unmerged. In some embodiments, this may be accomplished by forming the first semiconductor layers 51 with thicknesses $T_1$ greater than distances $D_1$ between adjacent ones of the nanostructures 55, such that horizontally adjacent ones of the second nanostructures 54 are spaced closer together than vertically adjacent ones of the second nanostructures 54. Horizontally adjacent second nanostructures 54 may be separated from one another by distances $D_1$ ranging from about 50 nm to about 200 nm, while vertically adjacent second nanostructures 54 may be separated from one another by distances $D_2$ which are more than the distances $D_1$ and range from about 100 nm to about 500 nm. This allows for the horizontally merged epitaxial source/drain regions 92 to be used as source lines and bit lines and prevents shorts between vertically adjacent epitaxially source/drain regions 92. Using the merged epitaxial source/drain regions 92 as source lines and bit lines reduces device size, improves device density, and reduces costs.

Although the epitaxial source/drain regions 92 are illustrated as having rectangular shapes in the cross-sectional view illustrated in FIG. 10A and round shapes in the cross-sectional view illustrated in FIG. 10C, the epitaxial source/drain regions 92 may have any appropriate cross-sectional shapes, such as hexagonal, octagonal, or other shapes. In some embodiments, the epitaxial source/drain regions 92 may have facets. In some embodiments, the epitaxial source/drain regions 92 in both the n-type region and the p-type region may include materials such as silicon, silicon carbide, phosphorous doped silicon carbide, silicon phosphide, silicon-germanium, boron doped silicon-germanium, germanium, germanium tin, or the like The epitaxial source/drain regions 92 in the n-type region, e.g., the NMOS region, may be formed by masking the p-type region, e.g., the PMOS region. Then, the epitaxial source/drain regions 92 are epitaxially grown in the first recesses 86 in the n-type region. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like.

The epitaxial source/drain regions 92 in the p-type region, e.g., the PMOS region, may be formed by masking the n-type region, e.g., the NMOS region. Then, the epitaxial source/drain regions 92 are epitaxially grown in the first recesses 86 in the p-type region. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like.

The epitaxial source/drain regions 92, second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 11A:
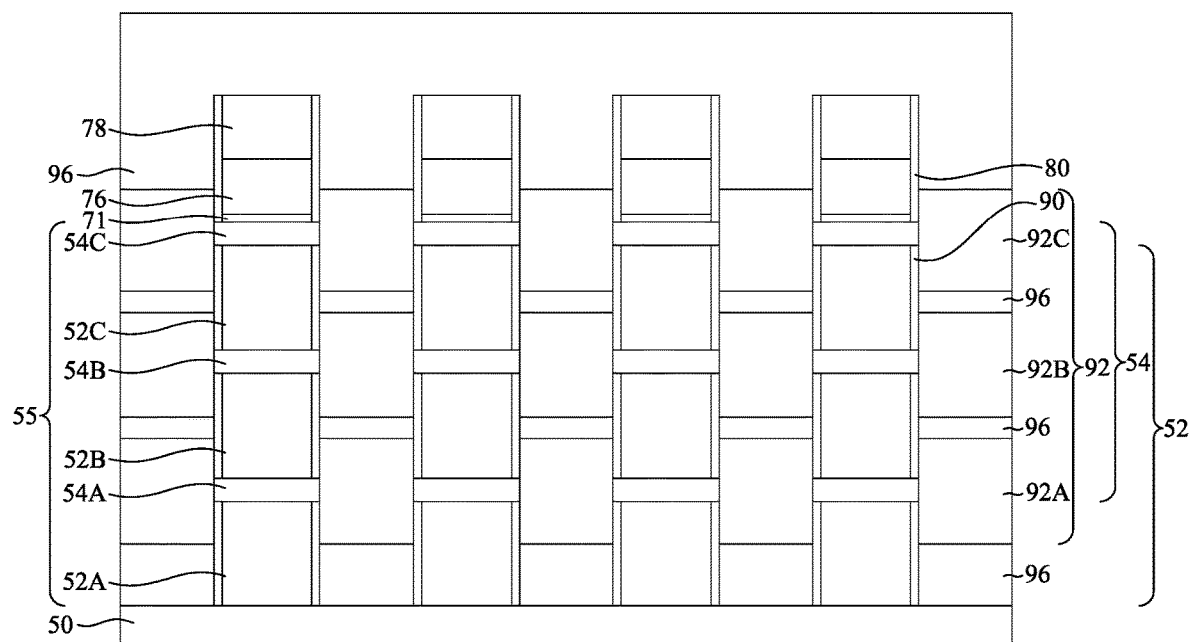
Figure 11B:
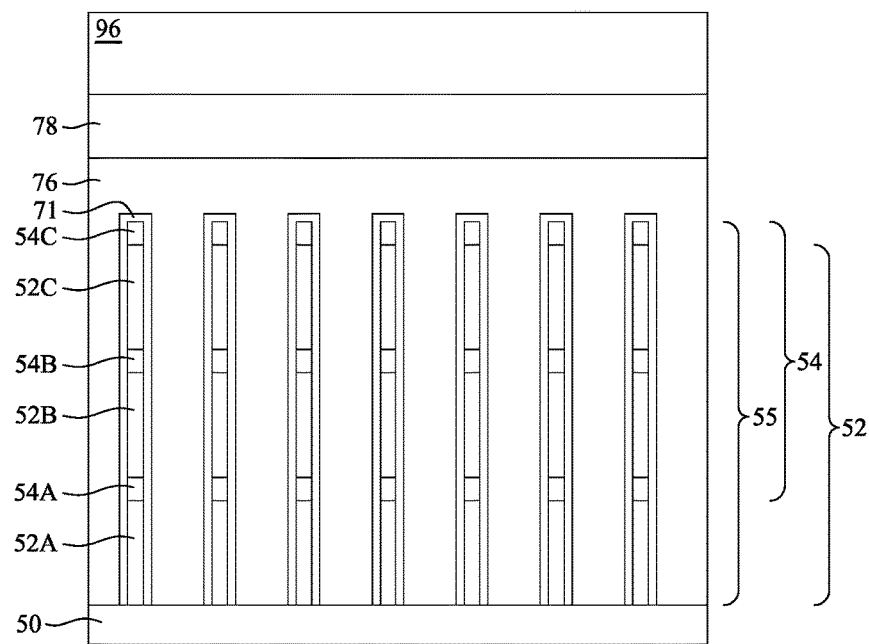
Figure 11C:
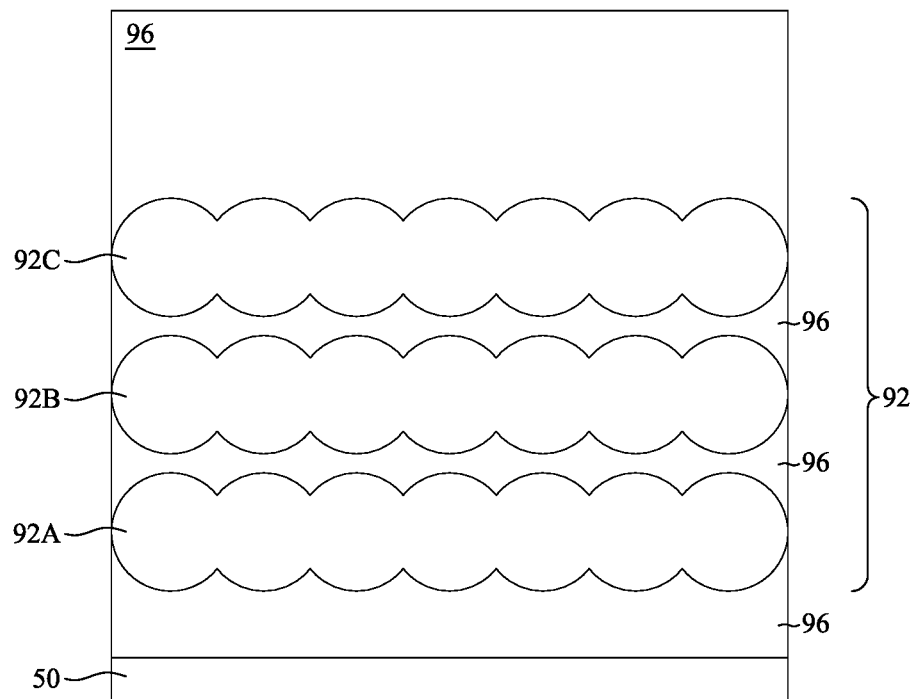
Figure 11D:
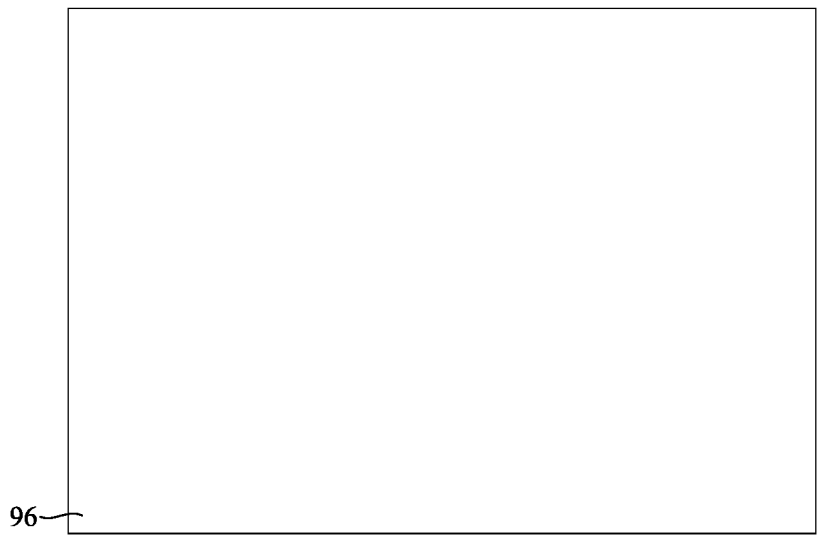
Figure 12A:
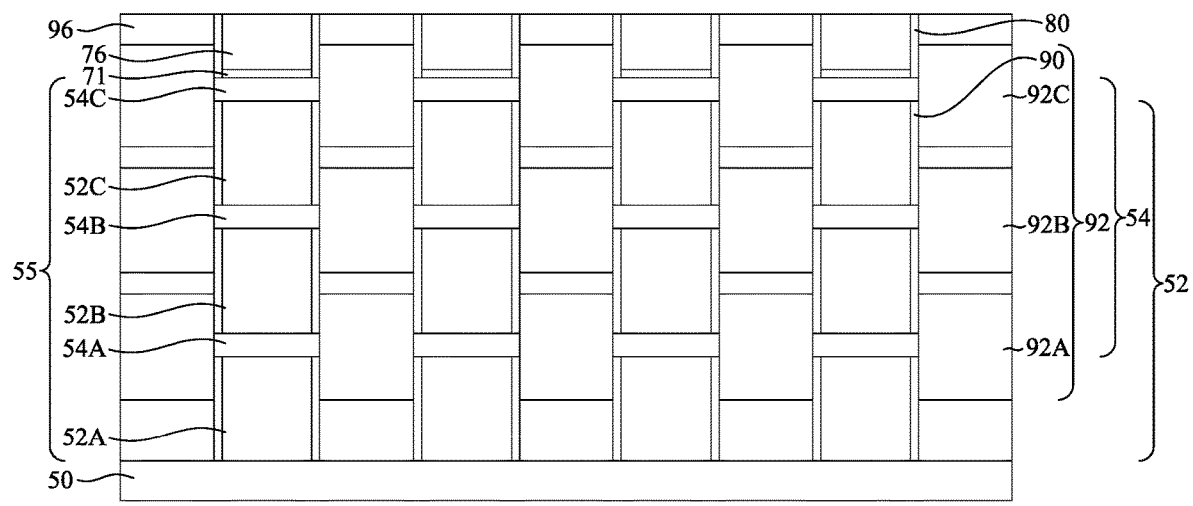
Figure 12B:
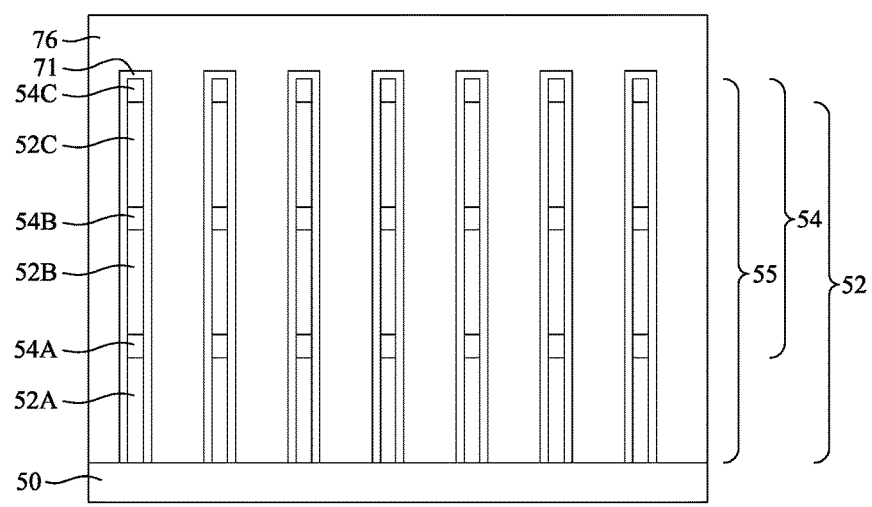
Figure 12C:
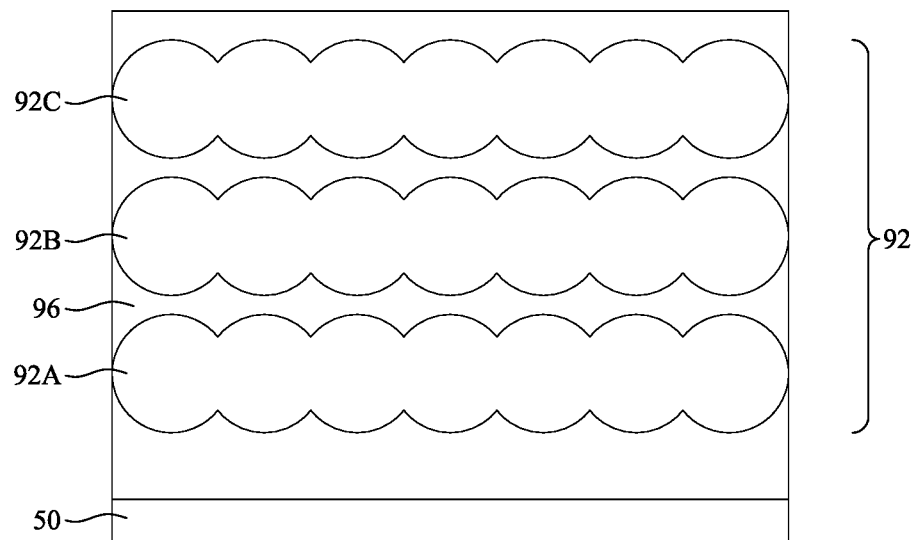
Figure 12D:
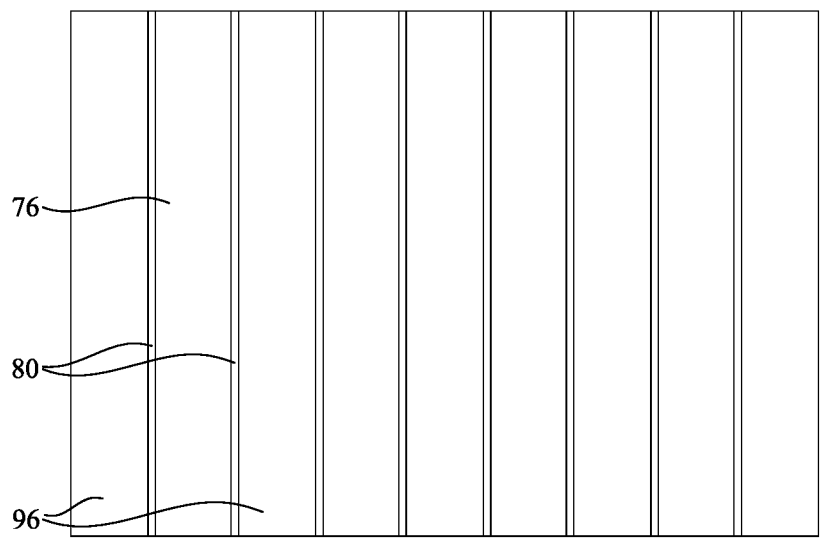
Figure 13A:
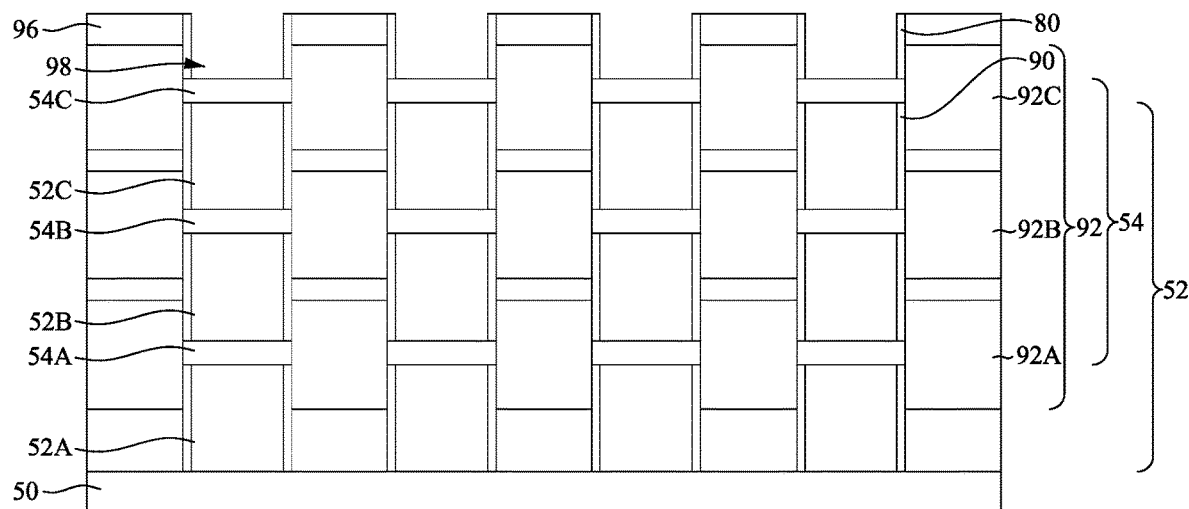
Figure 13B:
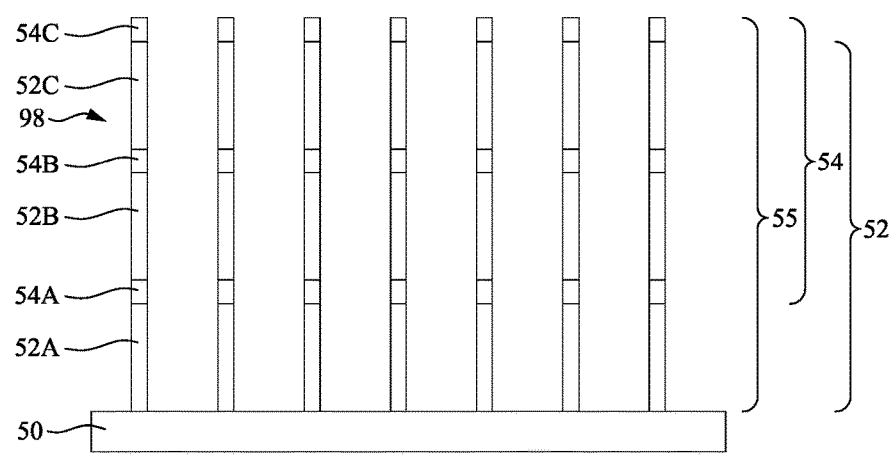
Figure 13C:
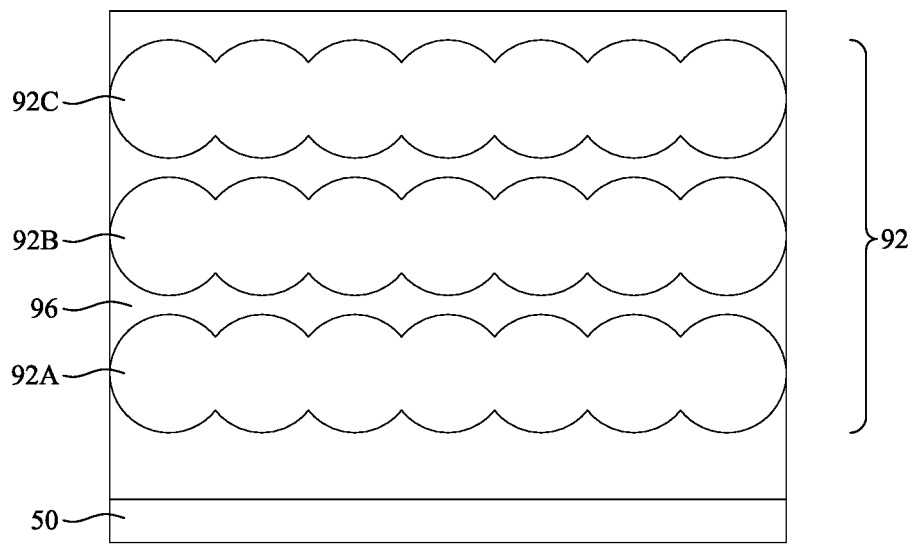
Figure 13D:
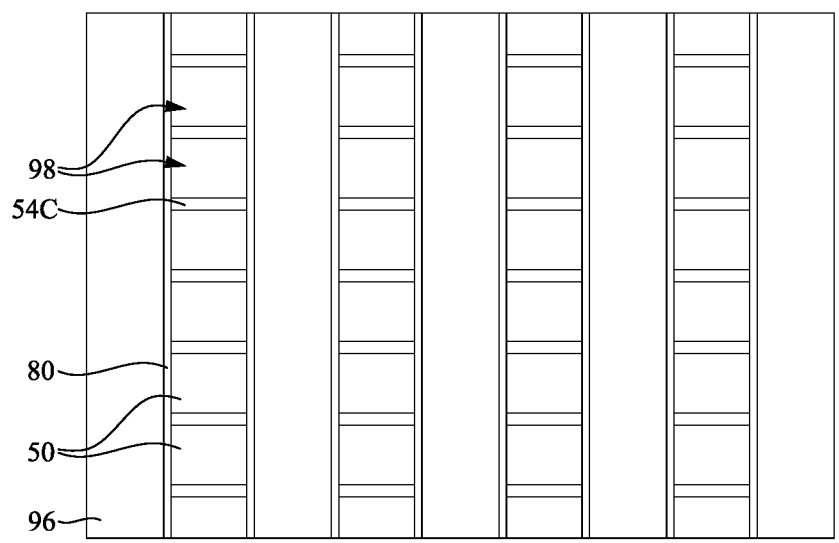

In FIGS. 11A through 11D, a first interlayer dielectric (ILD) 96 is deposited over the structure illustrated in FIGS. 10A through 10D, respectively. The first ILD 96 may be formed of a dielectric material, and may be deposited by any suitable method, such as CVD, plasma-enhanced CVD (PECVD), ALD, or the like. The dielectric materials may include silicon nitride, silicon oxide, silicon carbonitride, silicon oxycarbonitride, silicon carbide, silicon oxynitride, or the like. Other insulation materials formed by any acceptable process may be used. As illustrated in FIGS. 11A and 11C, the first ILD 96 may be formed surrounding the epitaxial source/drain regions 92 and filling the gaps 93. The first ILD 96 may be formed along top surfaces, side surfaces, and bottom surfaces of the epitaxial source/drain regions 92; side surfaces of the first inner spacers 90; side surfaces and top surfaces of the first spacers 80; and top surfaces of the masks 78.

In FIGS. 12A through 12D, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 80 along sidewalls of the masks 78. After the planarization process, top surfaces of the dummy gates 76, the first spacers 80, and the first ILD 96 are level within process variations. Accordingly, the top surfaces of the dummy gates 76 are exposed through the first ILD 96. In some embodiments, the masks 78 may remain, in which case the planarization process levels top surfaces of the first ILD 96 with top surfaces of the masks 78 and the first spacers 80.

In FIGS. 13A through 13D, the dummy gates 76 and the masks 78, if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 80. Each of the second recesses 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

In FIGS. 14A through 14D, the first nanostructures 52 are removed extending the second recesses 98. The first nanostructures 52 may be removed by performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., silicon germanium, and the second nanostructures 54A-C include, e.g., silicon or silicon carbide, hydrogen fluoride, another fluorine-based etchant, or the like may be used to remove the first nanostructures 52. After the first nanostructures 52 are removed, the second nanostructures 54 which are adjacent in a vertical direction (e.g., a direction perpendicular to a major surface of the substrate 50) may be separated from one another by distances equal to the thicknesses of the first nanostructures (e.g., the thicknesses $T_1$).

In FIGS. 15A through 15D, gate dielectric layers 100 and gate electrodes 102 are formed for replacement gates. The gate dielectric layers 100 are deposited conformally in the second recesses 98. The gate dielectric layers 100 may be formed on top surfaces of the substrate 50 and on top surfaces, side surfaces, and bottom surfaces of the second nanostructures 54. The gate dielectric layers 100 may also be deposited on top surfaces of the first ILD 96, top surfaces and side surfaces of the first spacers 80, and side surfaces of the first inner spacers 90. The gate dielectric layers 100 may be deposited by CVD, PVD, ALD, molecular-beam deposition (MBD), PECVD, or the like.

In some embodiments, the gate dielectric layers 100 may comprise materials that are capable of switching between two different polarization directions by applying an appropriate voltage differential across the gate dielectric layers 100. The gate dielectric layers 100 may be high-k dielectric materials, such as a hafnium (Hf) based dielectric material or the like. In some embodiments, the gate dielectric layers 100 comprise ferroelectric (FE) materials, such as hafnium oxide, hafnium zirconium oxide, silicon-doped hafnium oxide, or the like. In some embodiments, the gate dielectric layers 100 may comprise different ferroelectric materials or different types of dielectric materials. In some embodiments, the gate dielectric layers 100 may be multilayer dielectric structures comprising a layer of $SiN_x$ between two $SiO_x$ layers (e.g., ONO structures). The structure of the gate dielectric layers 100 may be the same or different in the n-type region and the p-type region. The gate dielectric layers 100 may have thicknesses ranging from about 5 nm to about 20 nm. Forming the gate dielectric layers 100 with thicknesses less than 5 nm may harm performance, while forming the gate dielectric layers 100 with thicknesses greater than 20 nm may take up an excessive amount of space.

The gate electrodes 102 are deposited over the gate dielectric layers 100 and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 15A through 15D, the gate electrodes 102 may comprise any number of liner layers, any number of work function tuning layers, and a fill material. Any combination of the layers which make up the gate electrodes 102 may be deposited between adjacent ones of the second nanostructures 54 and between the second nanostructures 54A and the substrate 50.

The formation of the gate dielectric layers 100 in the n-type region and the p-type region may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over top surfaces of the first ILD 96 and the first spacers 80. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 14A:
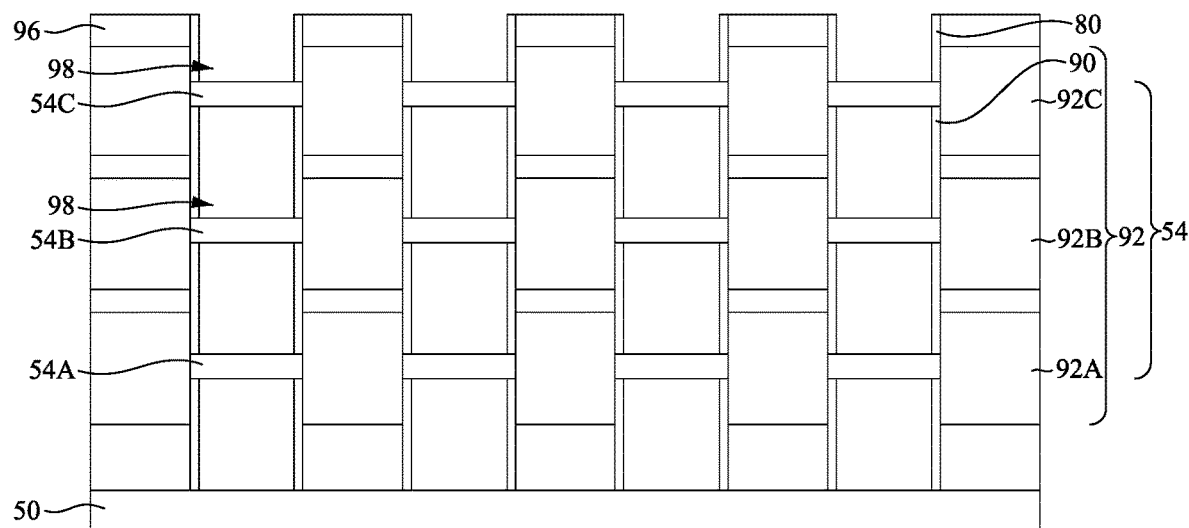
Figure 14B:
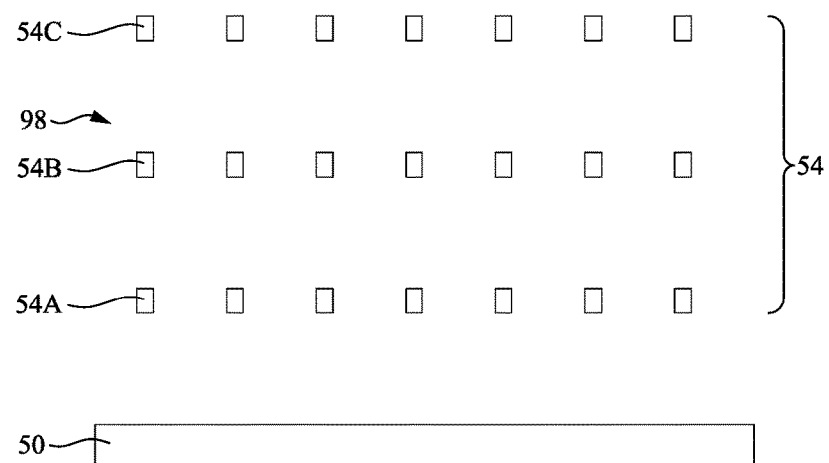
Figure 14C:
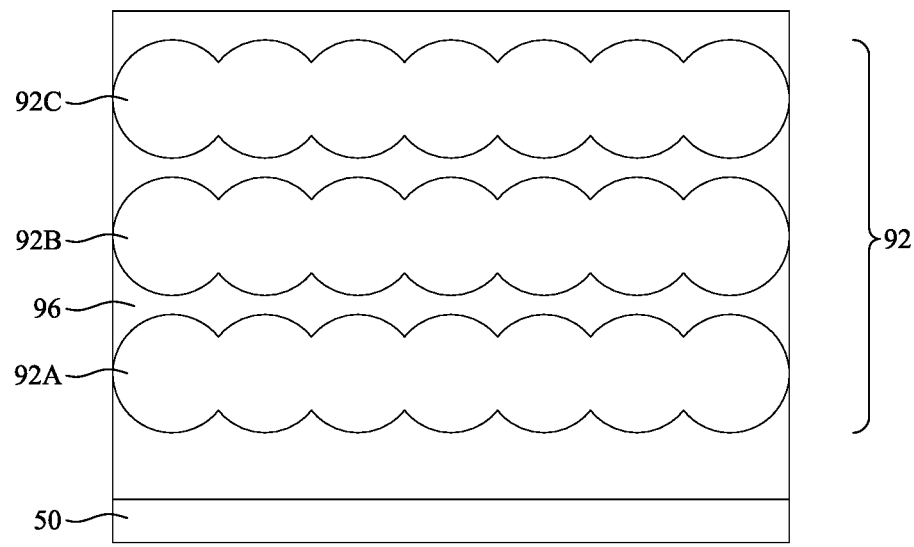
Figure 14D:
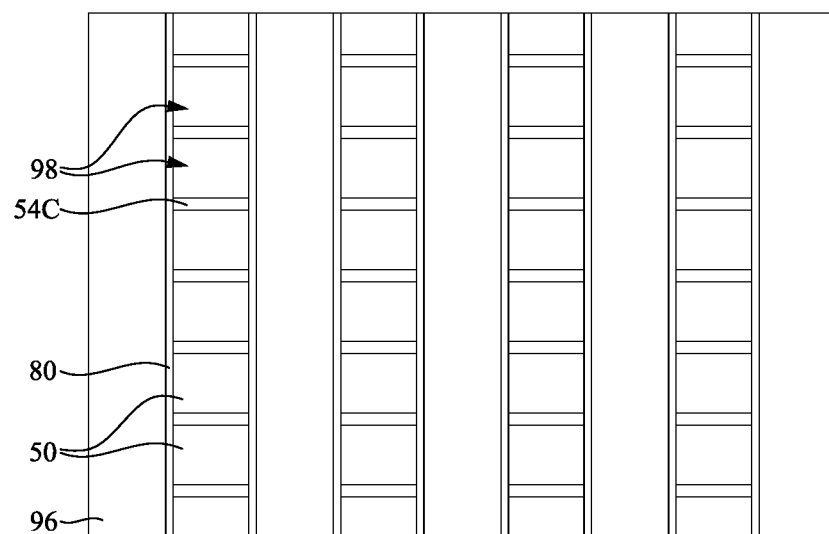
Figure 15A:
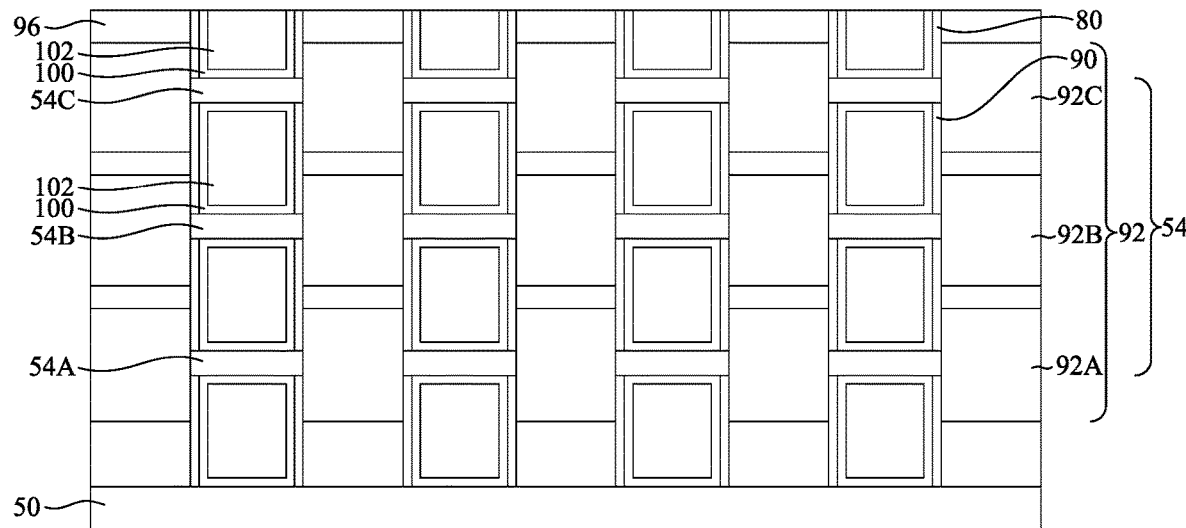
Figure 15B:
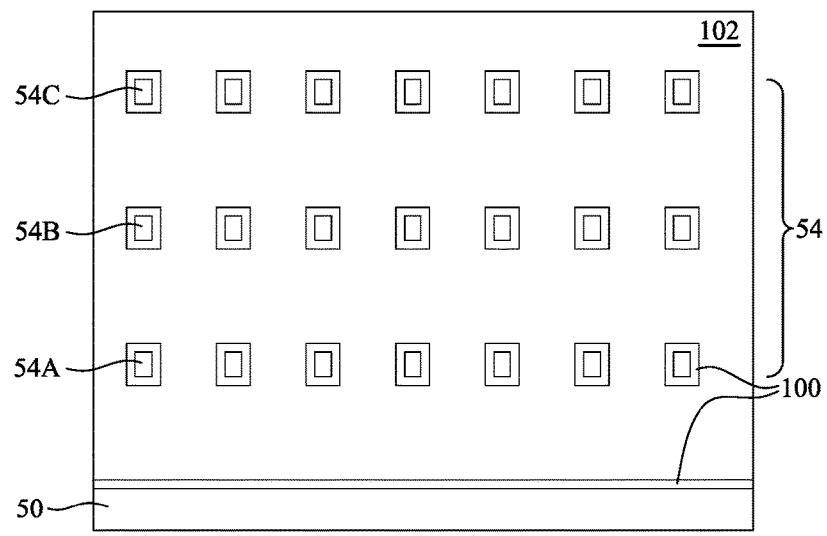
Figure 15C:
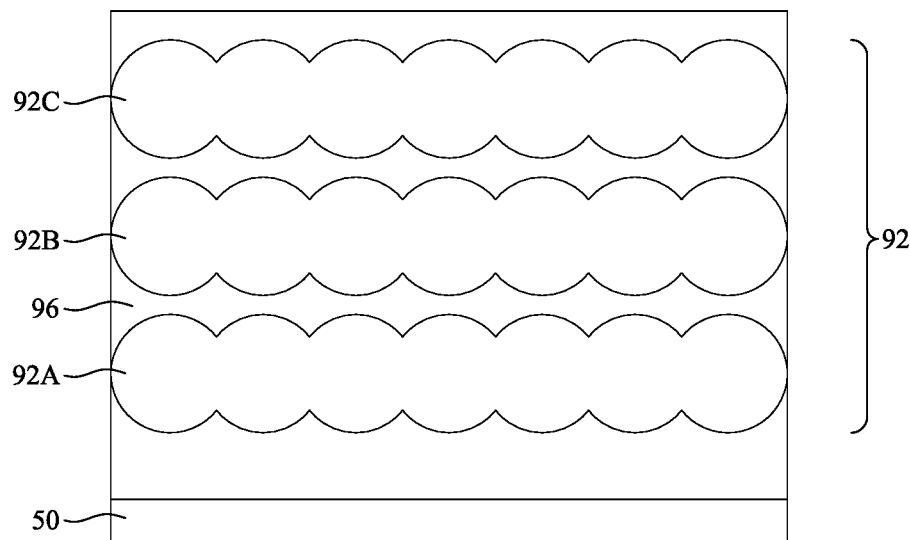
Figure 15D:
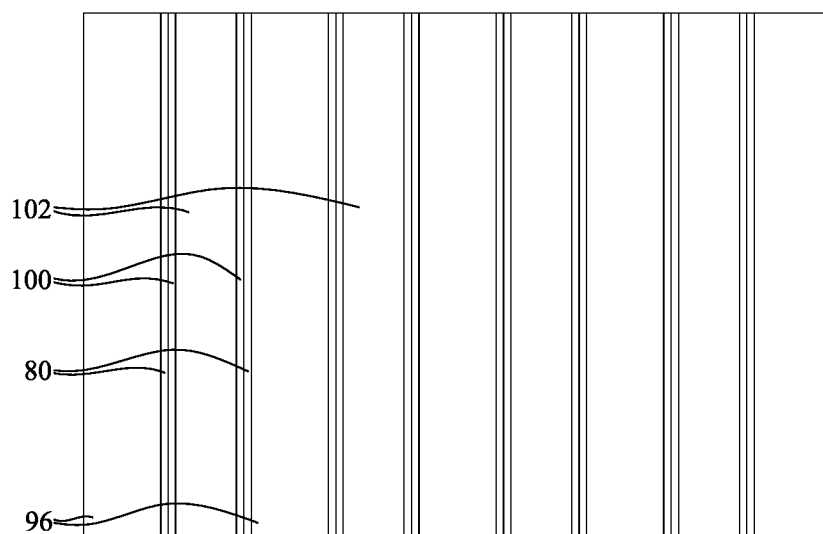
Figure 15E:
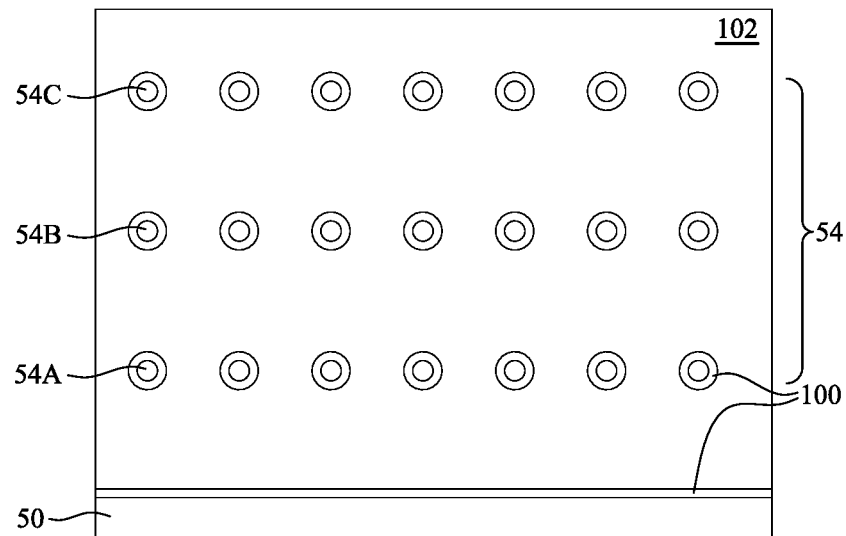
Figure 15F:
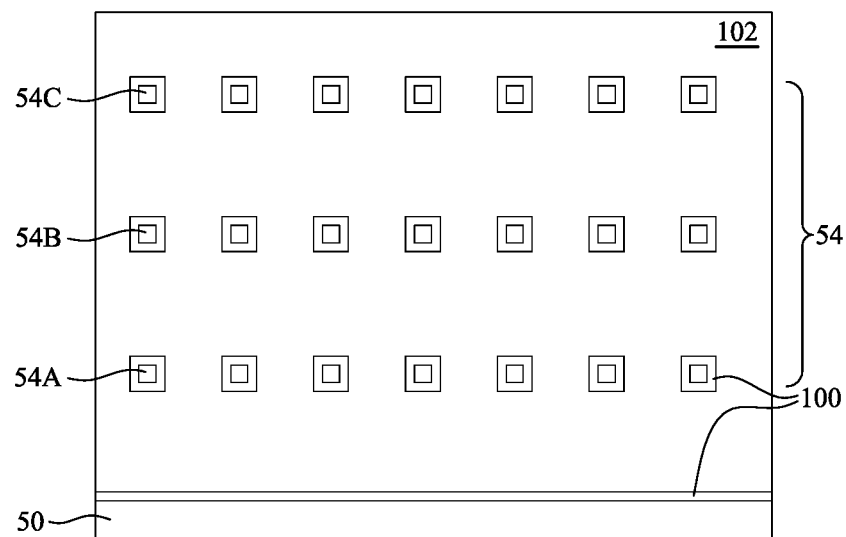
Figure 16A:
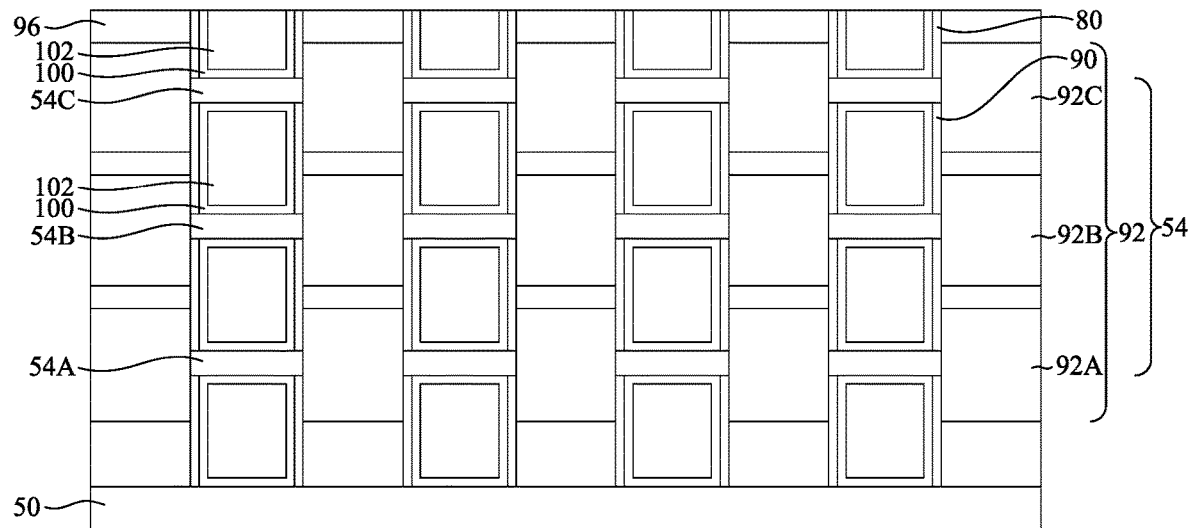
Figure 16B:
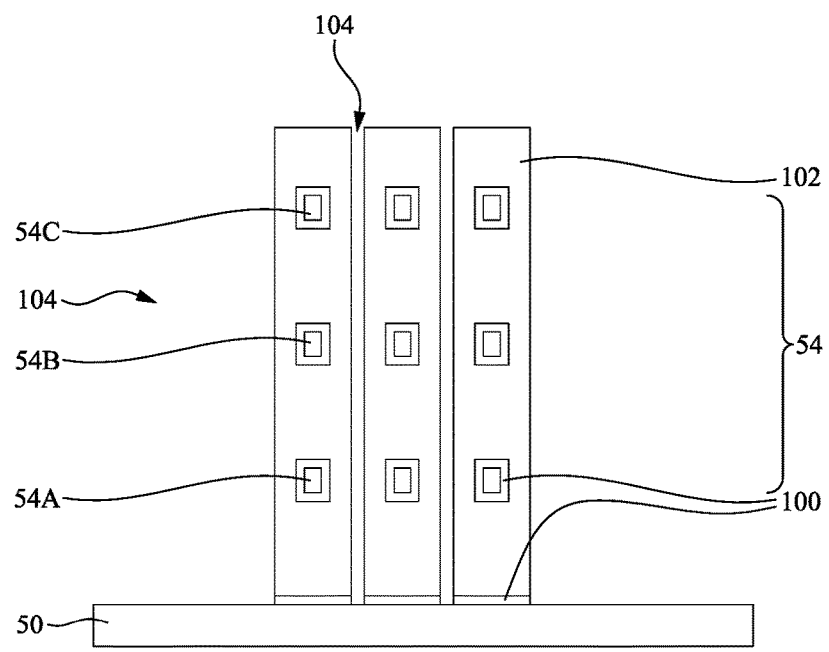
Figure 16C:
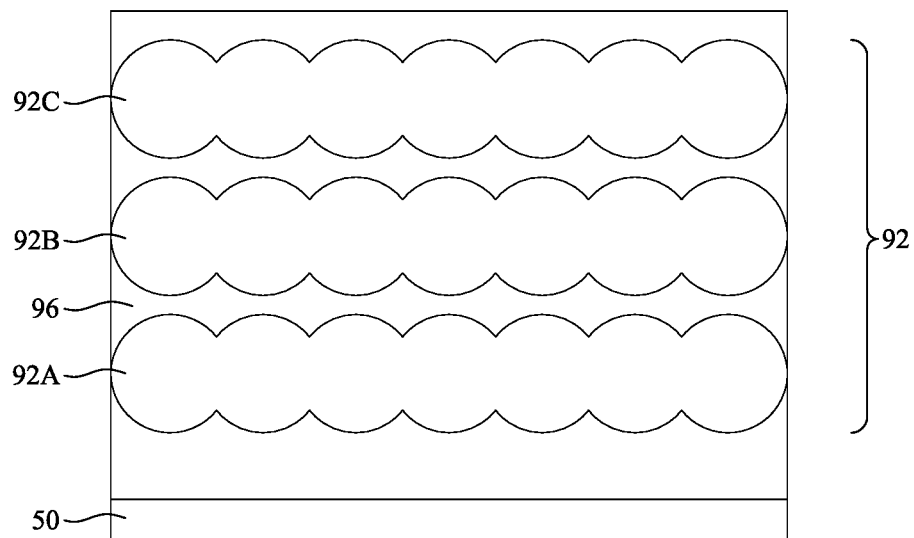
Figure 16D:
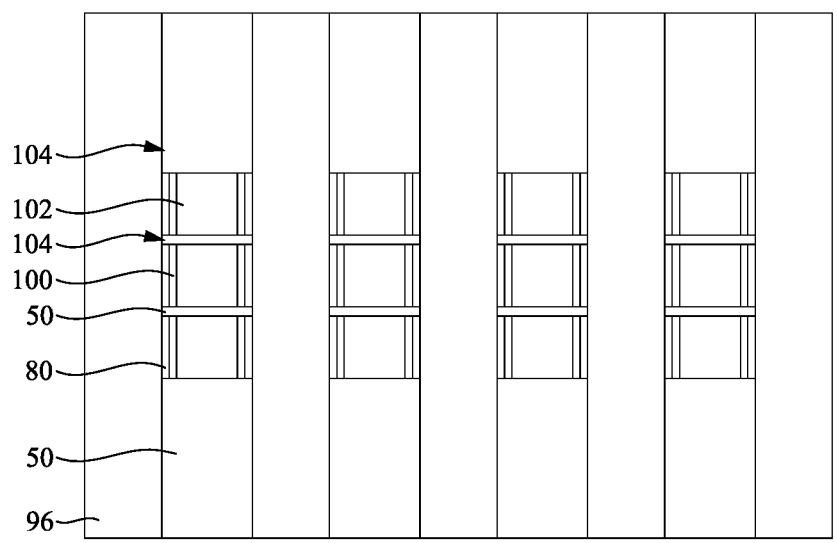
Figure 17A:
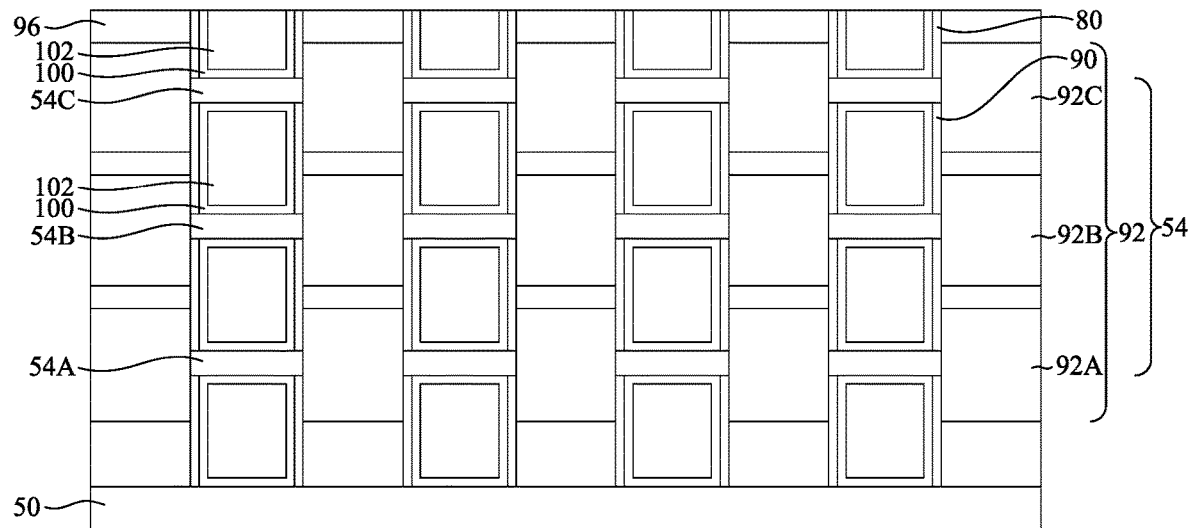
Figure 17B:
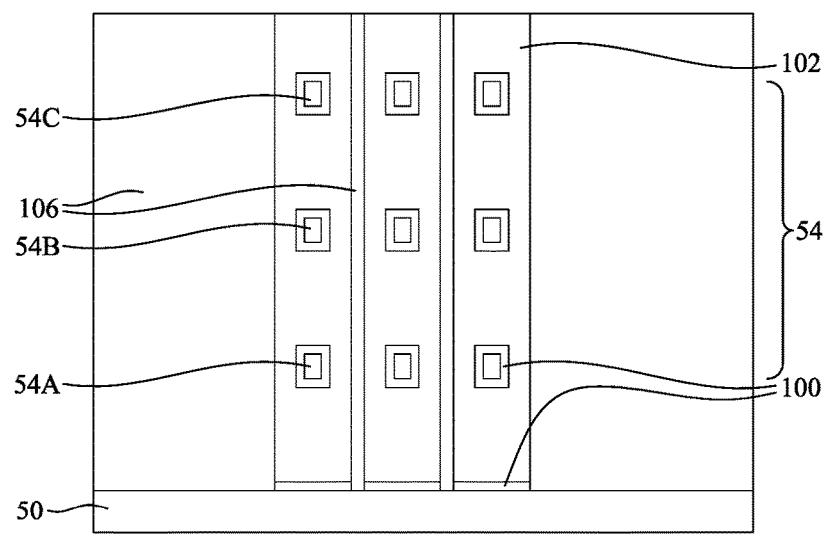
Figure 17C:
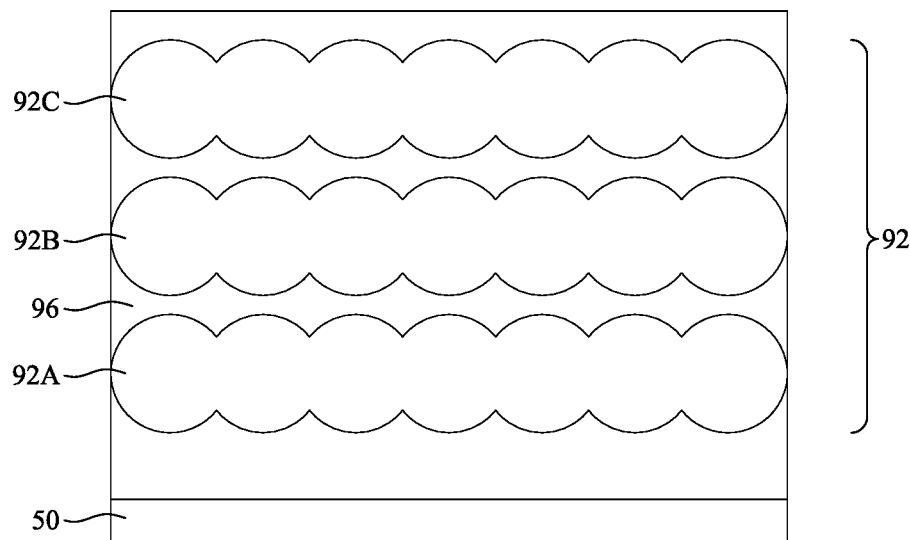
Figure 17D:
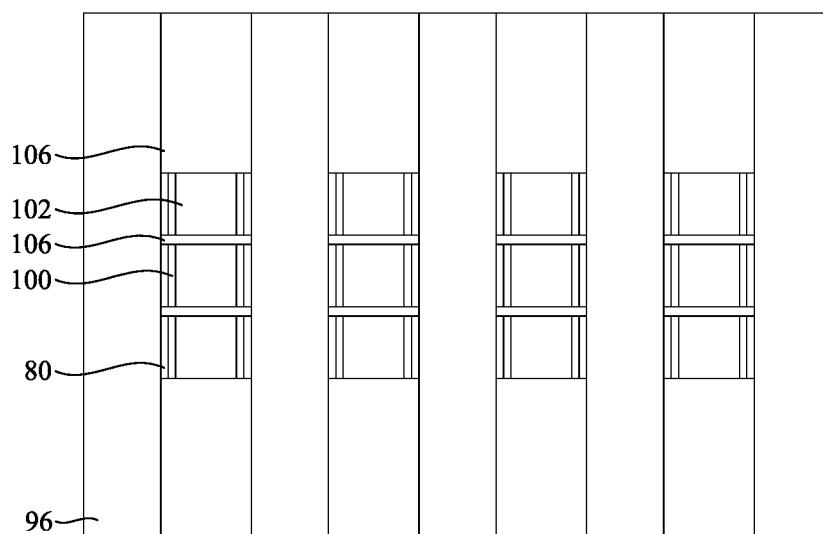
Figure 18A:
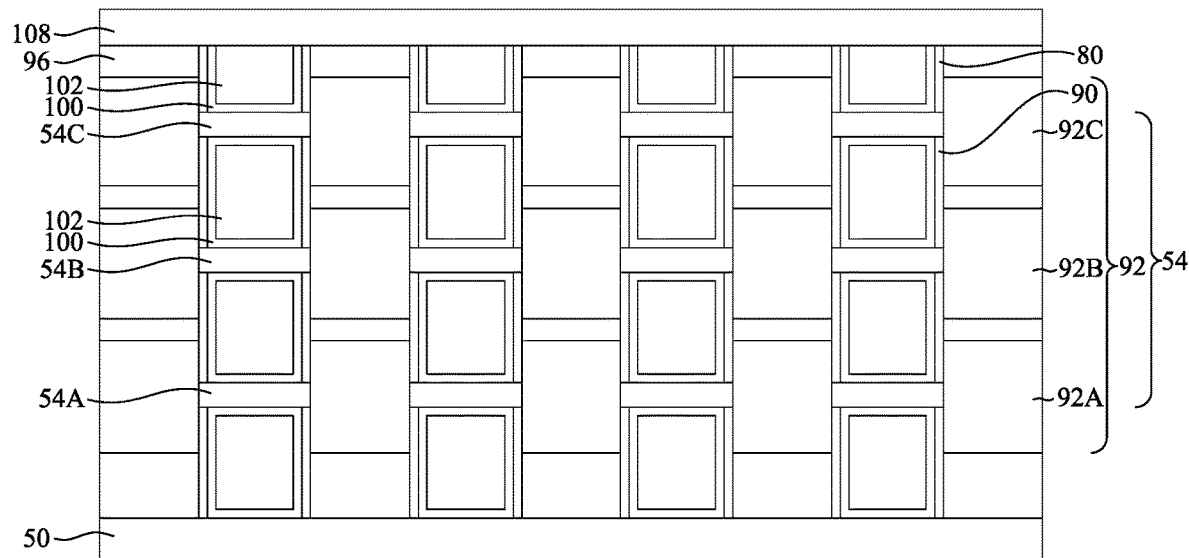
Figure 18B:
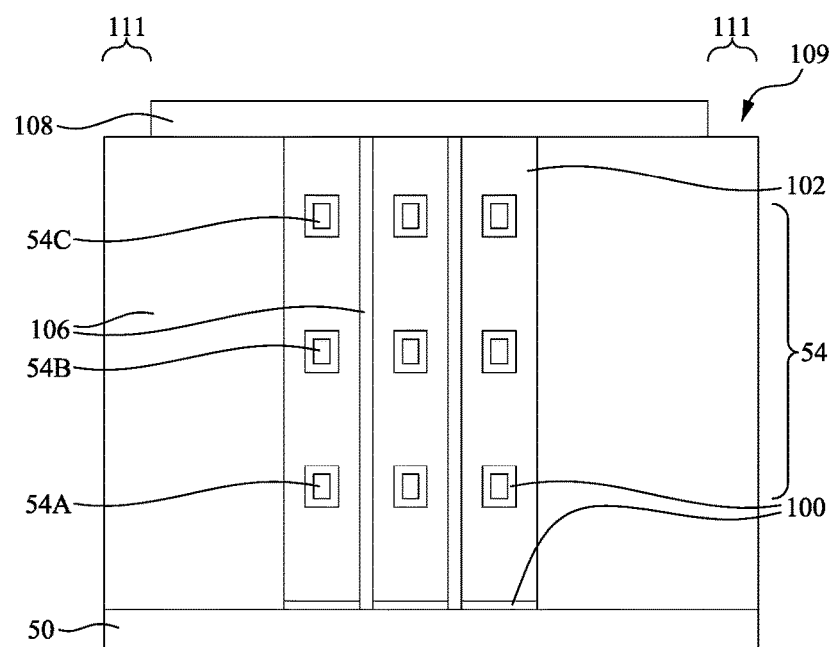
Figure 18C:
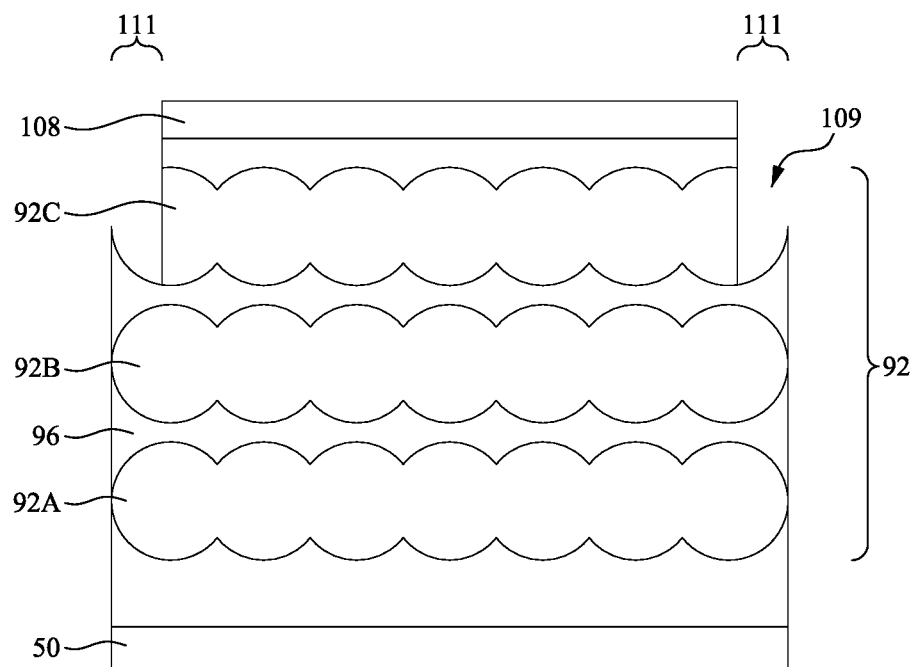
Figure 18D:
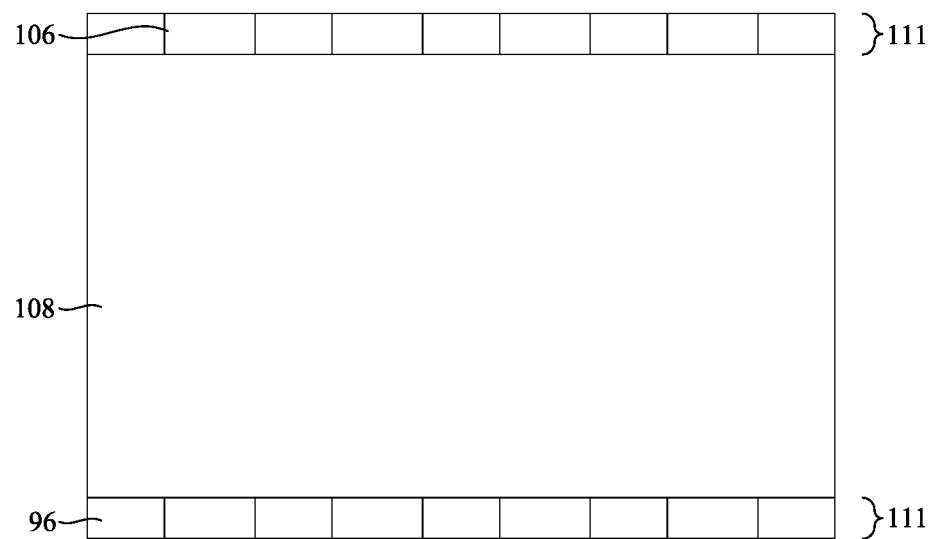
Figure 19A:
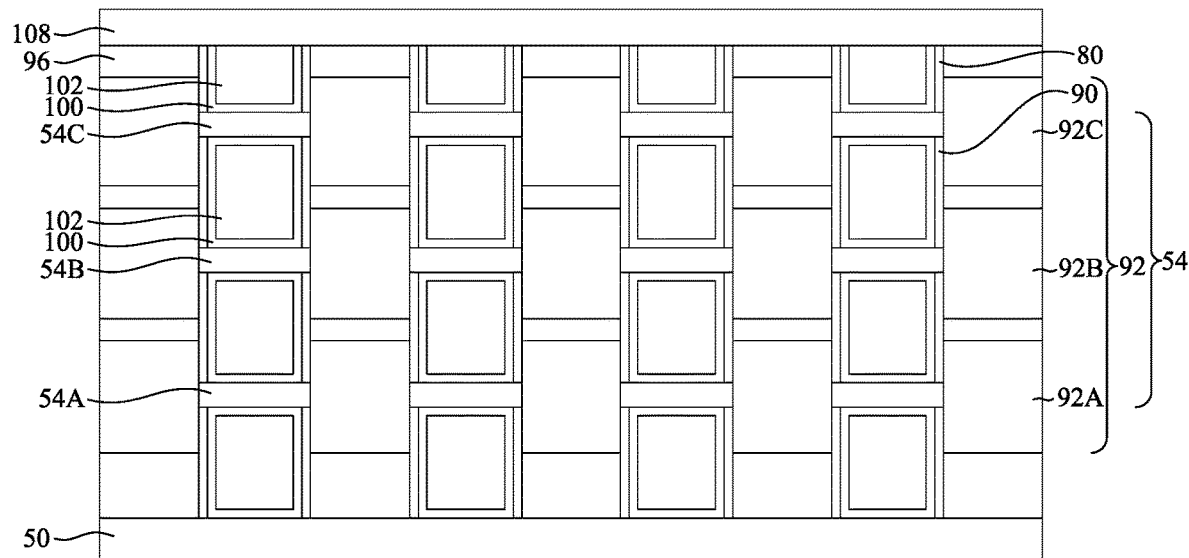
Figure 19B:
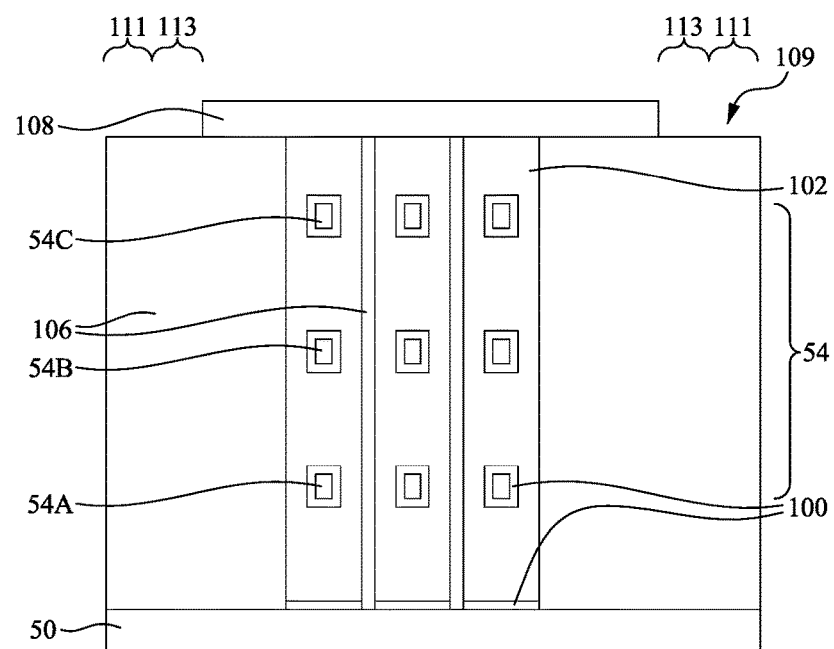
Figure 19C:
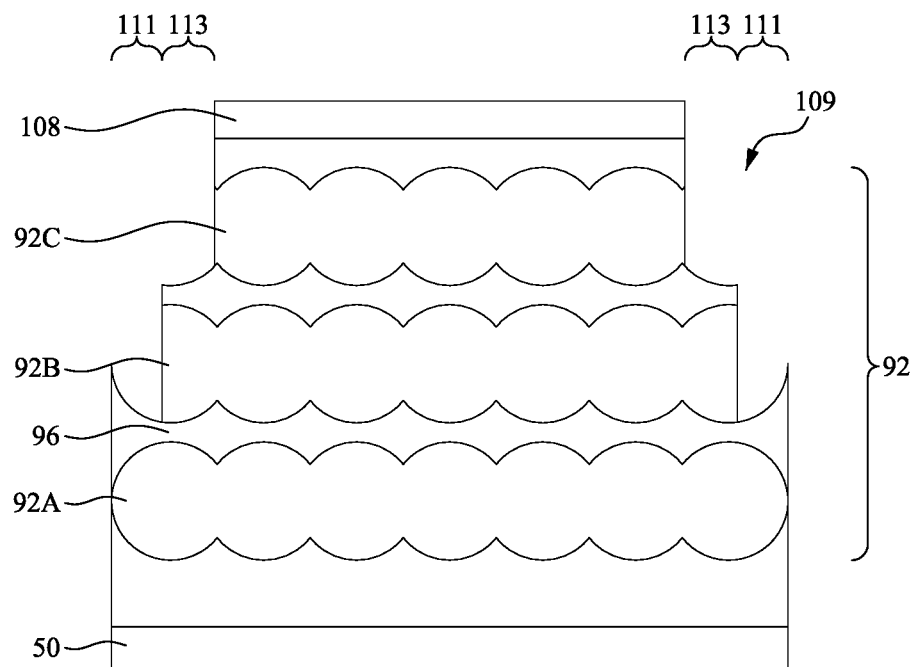
Figure 19D:
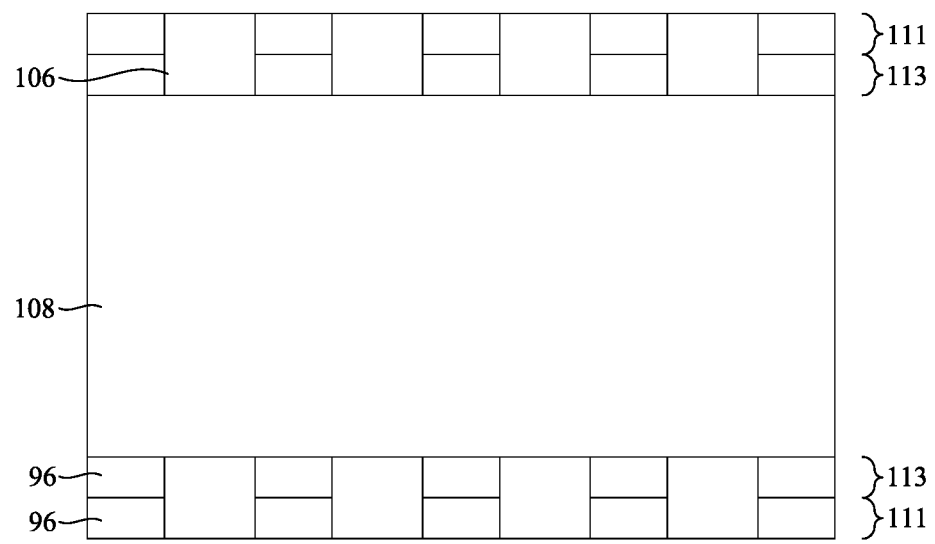
Figure 20A:
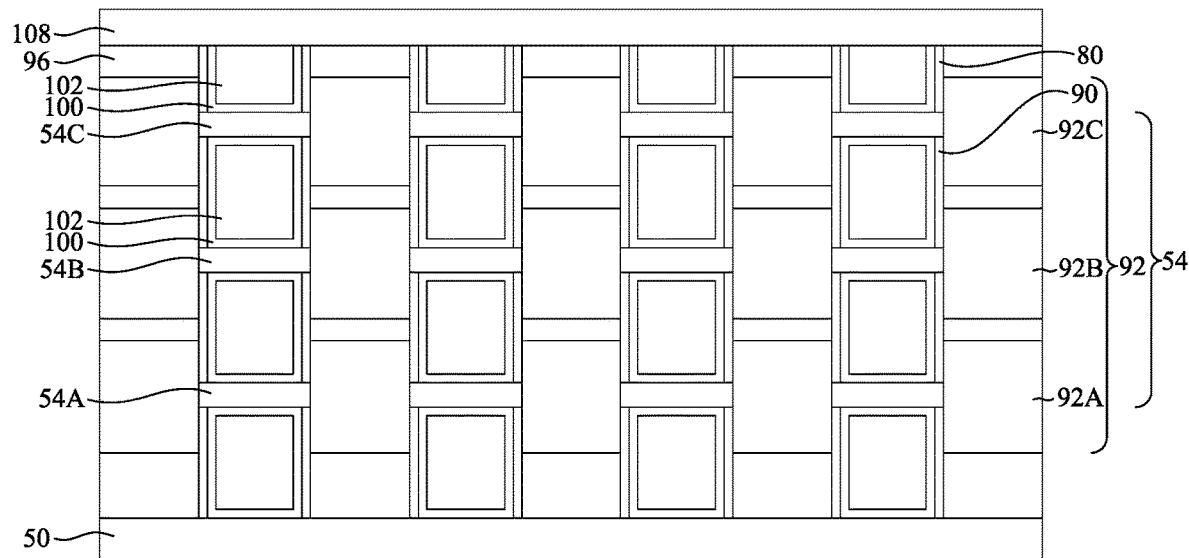
Figure 20B:
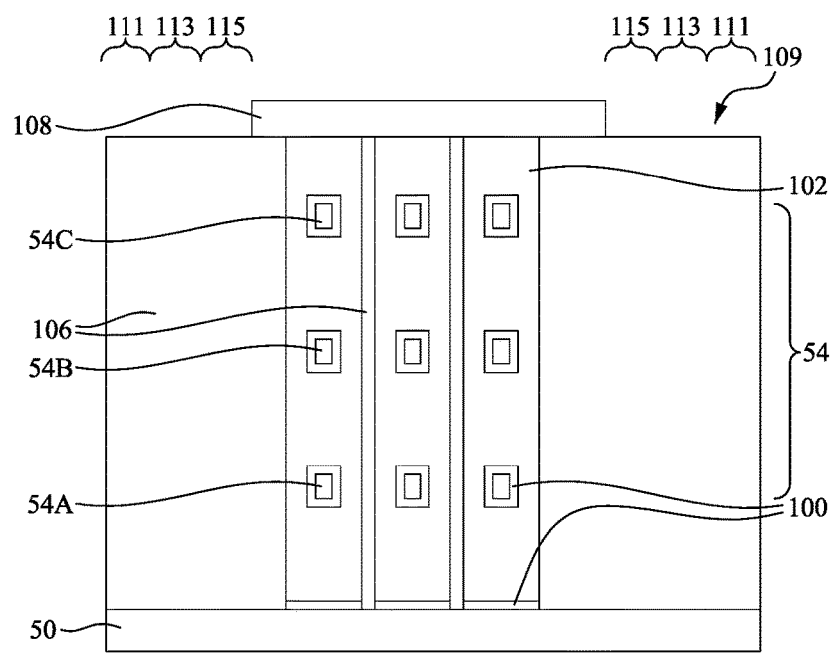
Figure 20C:
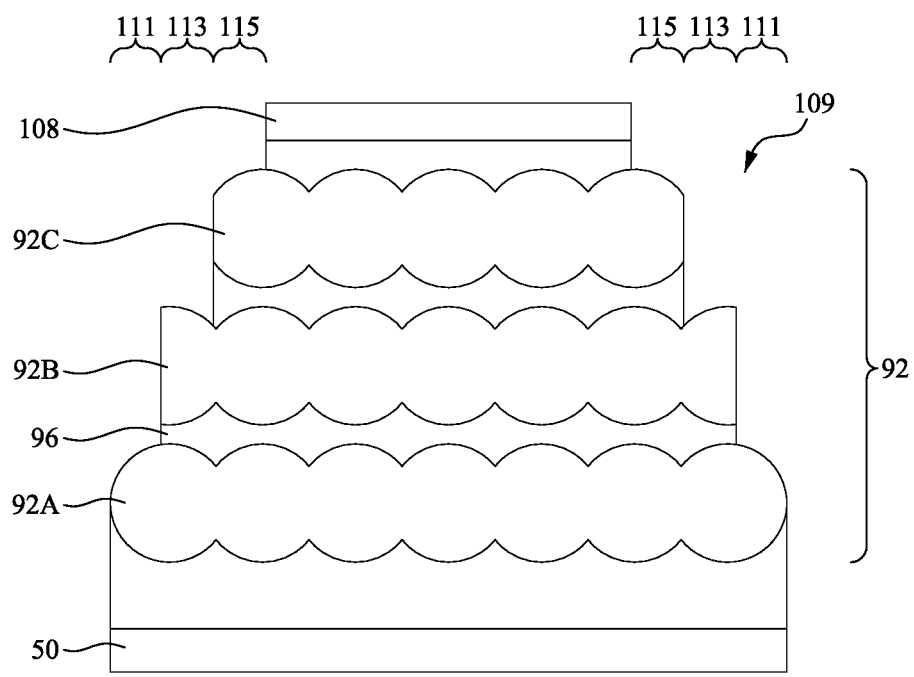
Figure 20D:
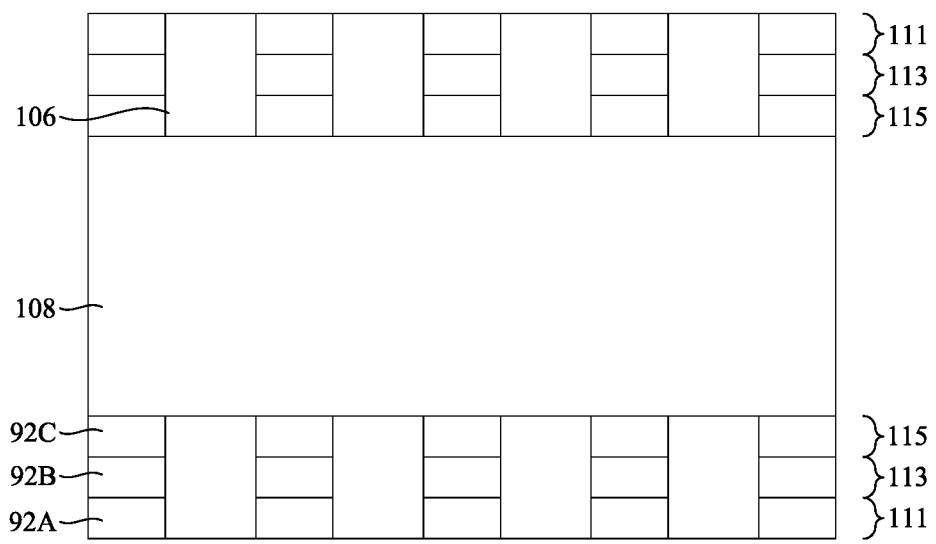

Although the second nanostructures 54 are illustrated as having rectangular cross-sectional shapes in FIGS. 14B and 15B, the second nanostructures 54 may have round, circular, square, or other cross-sectional shapes after removing the dummy gate dielectrics 71, the dummy gates 76, and the first nanostructures 52. As examples, FIG. 15E illustrates an embodiment in which the second nanostructures 54 have circular shapes in a cross-sectional view and FIG. 15F illustrates an embodiment in which the second nanostructures 54 have square shapes in a cross-sectional view. The shapes of the second nanostructures 54 may be controlled by controlling the thicknesses of the second semiconductor layers 53, the widths of the second nanostructures 54, and parameters of the etching processes used to pattern the second nanostructures 54, remove the dummy gate dielectrics 71, the dummy gates 76, and the first nanostructures 52. The gate dielectric layers 100 are formed conformally and thus have cross-sectional shapes similar to the cross-sectional shapes of the second nanostructures 54. For example, in the embodiment illustrated in FIG. 15E, the gate dielectric layers 100 have circular shapes in a cross-sectional view and, in the embodiment illustrated in FIG. 15E, the gate dielectric layers 100 have square shapes in a cross-sectional view.

In FIGS. 16A through 16D, trenches 104 are patterned through the gate electrodes 102, the gate dielectric layers 100, and the first spacers 80. The trenches 104 may also be patterned through the second nanostructures 54. The trenches 104 may be patterned through a combination of photolithography and etching. The etching may be any acceptable etching processes, such as wet or dry etching, RIE, NBE, the like, or a combination thereof. The etching may be anisotropic. The trenches 104 may be disposed between opposing sidewalls of the first ILD 96 and the epitaxial source/drain regions 92 and the trenches 104 may physically separate adjacent stacks of the memory cells 202 in the memory array 200 (see FIG. 1A). The trenches 104 may also be patterned through the gate electrodes 102, the gate dielectric layers 100, the first spacers 80, and the second nanostructures 54 in portions of the structure in which a staircase structure (such as the staircase structure 110, discussed below with respect to FIGS. 21A through 21D) will subsequently be formed.

In FIGS. 17A through 17D, dielectric materials 106 are deposited in and fill the trenches 104. The dielectric materials 106 may include, for example, silicon nitride, silicon oxide, silicon carbonitride, silicon oxycarbonitride, silicon carbide, silicon oxynitride, or the like, which may be deposited by CVD, PVD, ALD, PECVD, or the like. The dielectric materials 106 may fill the trenches 104 and may be deposited extending along top surfaces of the first ILD 96, the first spacers 80, the gate dielectric layers 100, the gate electrodes 102, and the substrate 50 and along sidewalls of the gate dielectric layers 100, the gate electrodes 102, the first ILD 96, and the epitaxial source/drain regions 92. After deposition, a planarization process (e.g., a CMP, an etch-back, or the like) may be performed to remove excess portions of the dielectric materials 106. In the resulting structure, top surfaces of the first ILD 96, the first spacers 80, the gate dielectric layers 100, the gate electrodes 102, and the dielectric materials 106 may be substantially level (e.g., within process variations) with one another.

FIGS. 18A through 21D illustrate patterning the first ILD 96 and the epitaxial source/drain regions 92 to form a staircase structure 110 (illustrated in FIGS. 21A through 21D). In FIGS. 18A through 18D a photoresist 108 is formed over the first ILD 96, the dielectric materials 106, the first spacers 80, the gate dielectric layers 100, and the gate electrodes 102. The photoresist 108 can be formed by using a spin-on technique and can be patterned using acceptable photolithography techniques. Patterning the photoresist 108 may expose portions of the first ILD 96 and the dielectric materials 106 in a region 111, while masking remaining portions of the first ILD 96, the dielectric materials 106, the first spacers 80, the gate dielectric layers 100, and the gate electrodes 102.

Further in FIGS. 18A through 18D, the exposed portions of the first ILD 96 in the region 111 are etched using the photoresist 108 as a mask and portions of the epitaxial source/drain regions 92C underlying the exposed portions of the first ILD 96 in the region 111 are etched using the first ILD 96 as a mask. The etching may be any acceptable etch process, such as wet or dry etching, RIE, NBE, the like, or a combination thereof. The etching may be anisotropic. The etching may remove portions of the first ILD 96 and the epitaxial source/drain regions 92C in the region 111 and define an opening 109. Because the first ILD 96 and the epitaxial source/drain regions 92C have different material compositions, etchants used to remove exposed portions of these layers may be different. In some embodiments, the epitaxial source/drain regions 92C acts as an etch stop layer while etching the first ILD 96, and the first ILD 96 acts as an etch stop layer while etching the epitaxial source/drain regions 92C. As a result, the portions of the first ILD 96 and the epitaxial source/drain regions 92C may be selectively removed without removing remaining portions of the first ILD 96 and the epitaxial source/drain regions 92, and the opening 109 may be extended to a desired depth. Alternatively, a timed etch processes may be used to stop the etching of the opening 109 after the opening 109 reaches a desired depth. In the resulting structure, a portion of the first ILD 96 over the epitaxial source/drain regions 92B is exposed in the region 111.

In FIGS. 19A through 19D, the photoresist 108 is trimmed to expose additional portions of the first ILD 96 and the dielectric materials 106. The photoresist 108 can be trimmed using acceptable photolithography techniques. As a result of the trimming, a width of the photoresist 108 is reduced, and portions of the first ILD 96 and the dielectric materials 106 in the region in and a region 113 are exposed. For example, top surfaces of the first ILD 96 and the dielectric materials 106 in the region 113 and the region 111 may be exposed.

Exposed portions of the first ILD 96 and the epitaxial source/drain regions 92 may then be etched using the photoresist 108 and portions of the first ILD 96 and the epitaxial source/drain regions 92C as masks. The etching may be any suitable etching process, such as wet or dry etching, RIE, NBE, the like, or a combination thereof. The etching process may be anisotropic. The etching may extend the opening 109 further into the first ILD 96 and the epitaxial source/drain regions 92. Because the first ILD 96 and the epitaxial source/drain regions 92 have different material compositions, etchants used to remove exposed portions of these layers may be different. In some embodiments, the epitaxial source/drain regions 92B-C act as etch stop layers while etching portions of the first ILD 96, and portions of the first ILD 96 act as etch stop layers while etching the epitaxial source/drain regions 92B-C. As a result, the first ILD 96 and the epitaxial source/drain regions 92B-C may be selectively etched without etching remaining portions of the first ILD 96 and the epitaxial source/drain regions 92, and the opening 109 may be extended to a desired depth. Alternatively, timed etch processes may be used to stop the etching of the opening 109 after the opening 109 reaches a desired depth. Further, during the etching process, un-etched portions of the first ILD 96 and the epitaxial source/drain regions 92 act as masks for underlying layers, and as a result a previous pattern of the first ILD 96 and the epitaxial source/drain regions 92C (see FIGS. 18A through 18D) may be transferred to the underlying first ILD 96 and the underlying epitaxial source/drain regions 92B. In the resulting structure, a portion of the first ILD 96 over the epitaxial source/drain regions 92A is exposed in the region 111 and a portion of the first ILD 96 over the epitaxial source/drain regions 92B is exposed in the region 113.

In FIGS. 20A through 20D, the photoresist 108 is trimmed to expose additional portions of the first ILD 96 and the dielectric materials 106. The photoresist 108 can be trimmed using acceptable photolithography techniques. As a result of the trimming, a width of the photoresist 108 is reduced, and portions of the first ILD 96 and the dielectric materials 106 in the region in, the region 113, and a region 115 are exposed. For example, top surfaces of the first ILD 96 and the dielectric materials 106 in the region 115, the region 113, and the region 111 may be exposed.

Exposed portions of the first ILD 96 and the epitaxial source/drain regions 92 may then be etched using the photoresist 108, portions of the first ILD 96, the epitaxial source/drain regions 92C, and the epitaxial source/drain regions 92B as masks. The etching may be any suitable etching process, such as wet or dry etching, RIE, NBE, the like, or a combination thereof. The etching process may be anisotropic. The etching may extend the opening 109 further into the first ILD 96 and the epitaxial source/drain regions 92. Because the first ILD 96 and the epitaxial source/drain regions 92 have different material compositions, etchants used to remove exposed portions of these layers may be different. In some embodiments, the epitaxial source/drain regions 92A-C act as etch stop layers while etching portions of the first ILD 96, and portions of the first ILD 96 act as etch stop layers while etching the epitaxial source/drain regions 92A-C. As a result, the first ILD 96 and the epitaxial source/drain regions 92A-C may be selectively etched without etching remaining portions of the first ILD 96, and the opening 109 may be extended to a desired depth. Alternatively, timed etch processes may be used to stop the etching of the opening 109 after the opening 109 reaches a desired depth. Further, during the etching process, un-etched portions of the first ILD 96 and the epitaxial source/drain regions 92 act as masks for underlying layers, and as a result a previous pattern of the first ILD 96 and the epitaxial source/drain regions 92B-C (see FIGS. 19A through 19D) may be transferred to the underlying first ILD 96 and the underlying epitaxial source/drain regions 92A-B. In the resulting structure, a portion of the first ILD 96 over the substrate 50 is exposed in the region 111, a portion of the first ILD 96 over the epitaxial source/drain regions 92A is exposed in the region 113 and a portion of the first ILD 96 over the epitaxial source/drain regions 92B is exposed in the region 115.

Figure 21A:
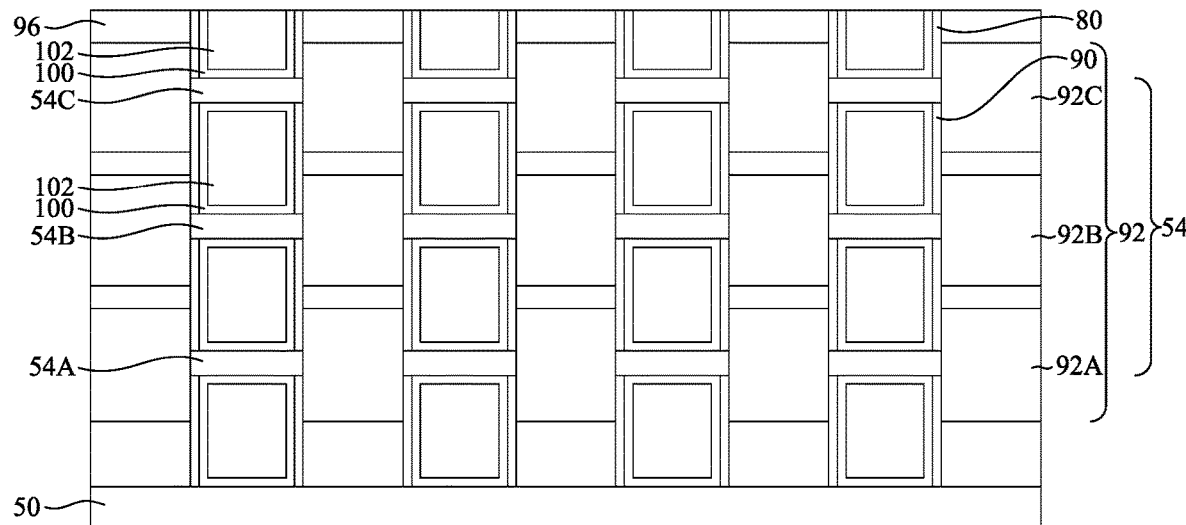
Figure 21B:
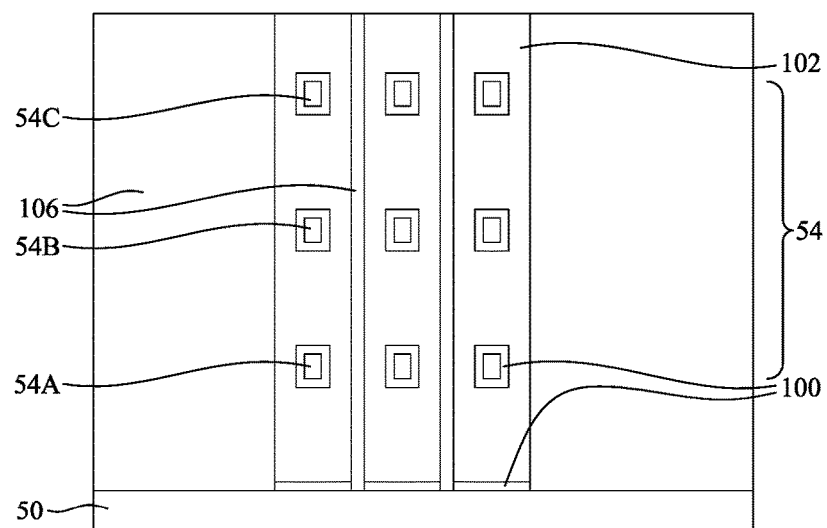
Figure 21C:
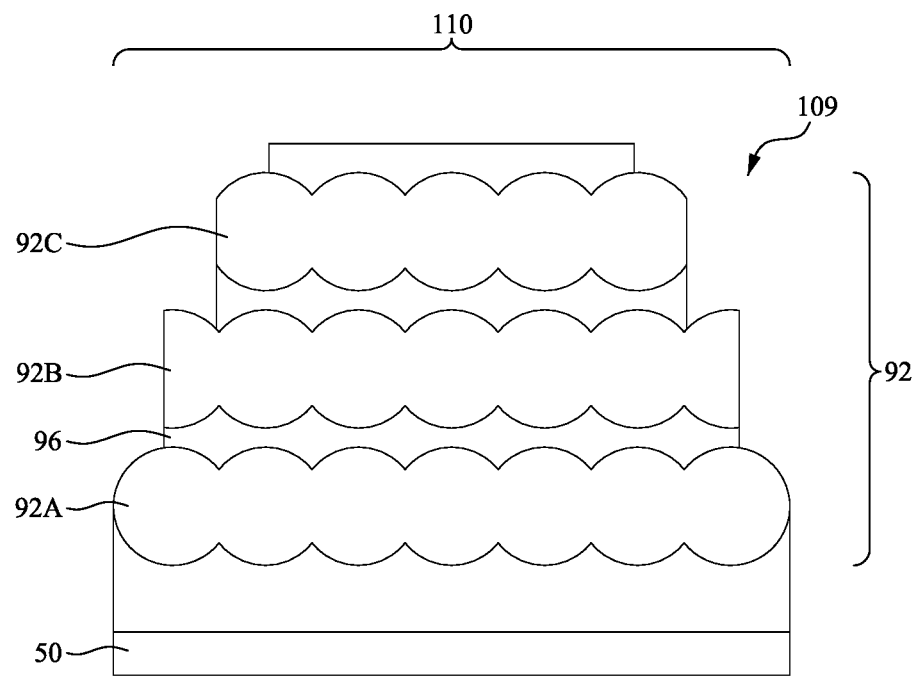
Figure 21D:
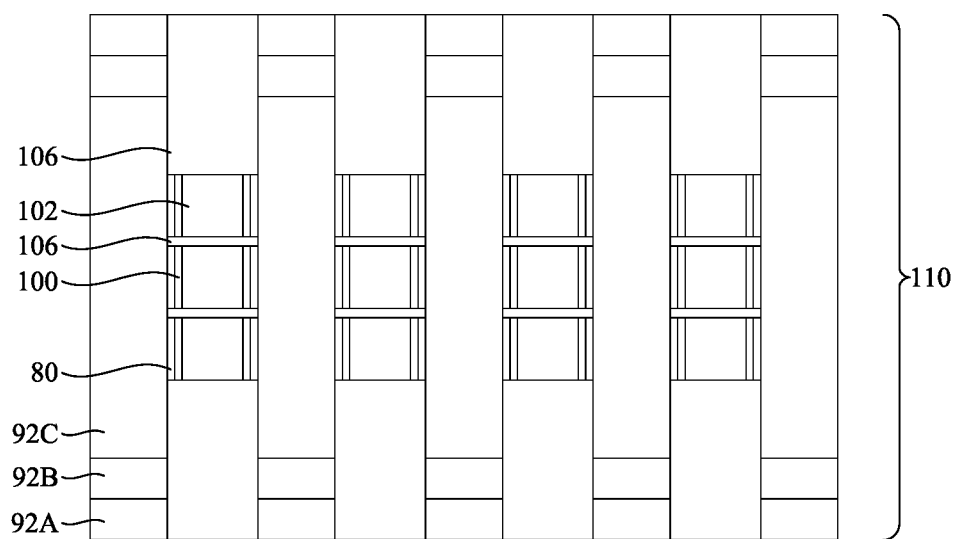

In FIGS. 21A through 21D the photoresist 108 is removed by an acceptable ashing or wet strip process. Thus, a staircase structure 110 is formed. The staircase structure 110 comprises a stack of alternating layers of the first ILD 96 and the epitaxial source/drain regions 92. As illustrated in FIG. 21C, the lengths of the epitaxial source/drain regions 92 increase in a direction towards the substrate 50 such that the epitaxial source/drain regions 92A are longer and extend laterally past the epitaxial source/drain regions 92B and the epitaxial source/drain regions 92B are longer and extend laterally past the epitaxial source/drain regions 92C. As a result, conductive contacts can be made from above the staircase structure 110 to each of the epitaxial source/drain regions 92 in subsequent processing steps.

In FIGS. 22A through 22D, an inter-metal dielectric (IMD) 112 is deposited over the structure of FIGS. 21A through 21D. The IMD 112 may be formed along top surfaces of the first ILD 96, the first spacers 80, the gate dielectric layers 100, the gate electrodes 102, the dielectric materials 106, and the epitaxial source/drain regions 92A-C and along side surfaces of the first ILD 96 and the epitaxial source/drain regions 92A-C. The IMD 112 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 112 may comprise an oxide (e.g., silicon oxide or the like), a nitride (e.g., silicon nitride or the like), a combination thereof or the like. Other dielectric materials formed by any acceptable process may be used.

Further in FIGS. 22A through 22D, contacts 114 and contacts 116 are formed extending to and electrically coupled to the epitaxial source/drain regions 92 and the gate electrodes 102, respectively. The staircase shape of the epitaxial source/drain regions 92 provides surfaces on each of the epitaxial source/drain regions 92 for the contacts 114 to land on. Forming the contacts 114 and the contacts 116 may include patterning openings in the IMD 112 to expose portions of the epitaxial source/drain regions 92 and the gate electrodes 102 using a combination of photolithography and etching, for example. In some embodiments, the openings in the IMD 112 may be formed by a process having high etch selectivity to materials of the IMD 112. As such, the openings in the IMD 112 may be formed without significantly removing materials of the epitaxial source/drain regions 92 and the gate electrodes 102.

In some embodiments, openings exposing each of the epitaxial source/drain regions 92A-C may be formed simultaneously. Because of variations in the thickness of the IMD 112 overlying each of the epitaxial source/drain regions 92A-C, the epitaxial source/drain regions 92C may be exposed to the etching for a longer duration than the epitaxial source/drain regions 92B, which are exposed to the etching for a longer duration than the 92A. Exposure to the etching may cause some material loss, pitting, or other damage in the epitaxial source/drain regions 92 such that the epitaxial source/drain regions 92C are damaged to a greatest extent, the epitaxial source/drain regions 92B are damaged to a decreasing extent, and the epitaxial source/drain regions 92A are damaged to a least extent. Openings exposing the gate electrodes 102 may be formed simultaneously with the openings exposing the epitaxial source/drain regions 92, or by separate etching processes similar to or the same as those used to form the openings exposing the epitaxial source/drain regions 92.

Figure 22A:
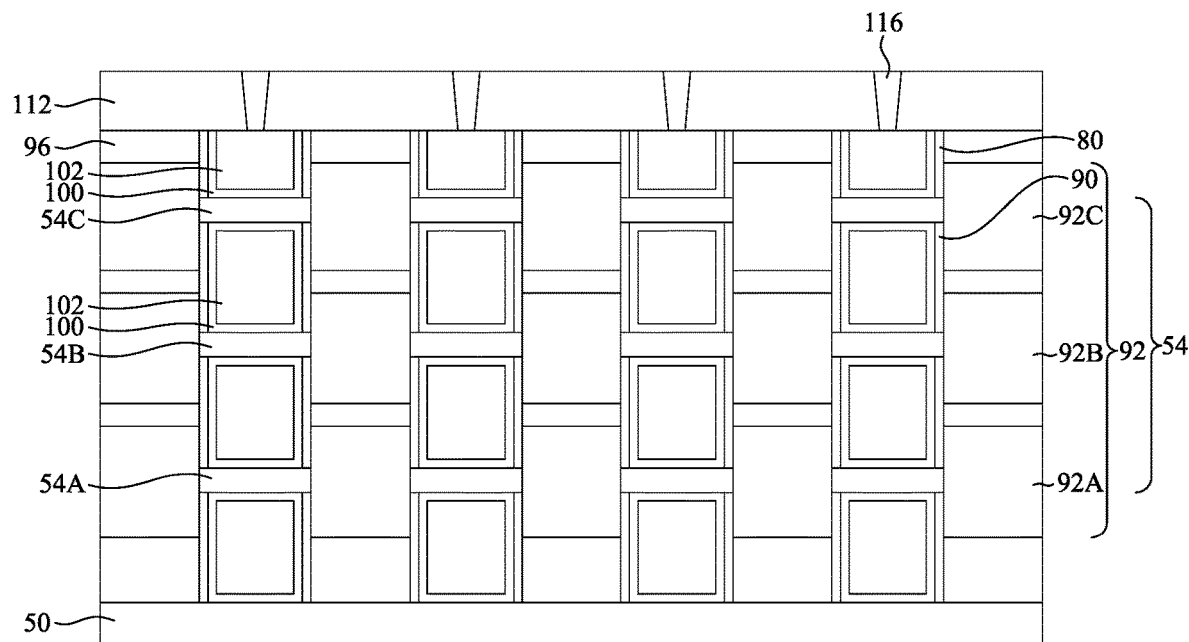
Figure 22B:
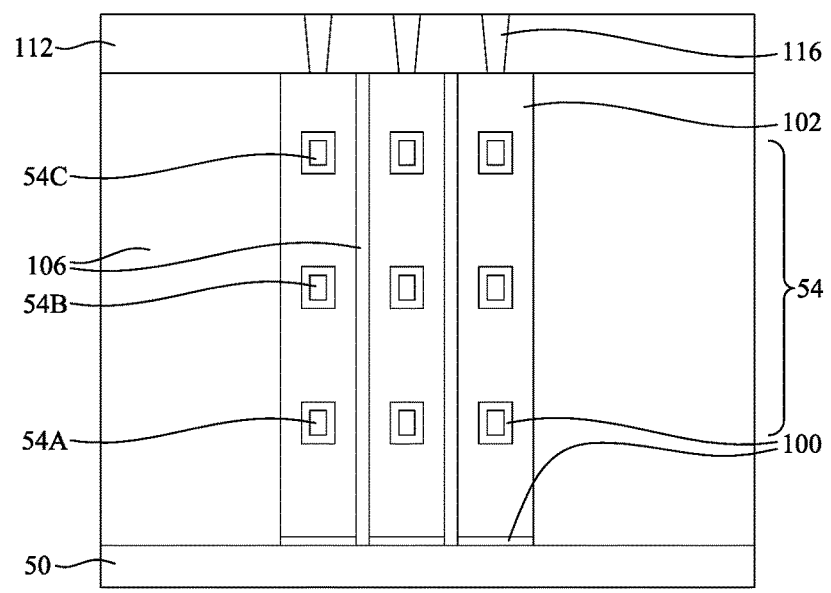
Figure 22C:
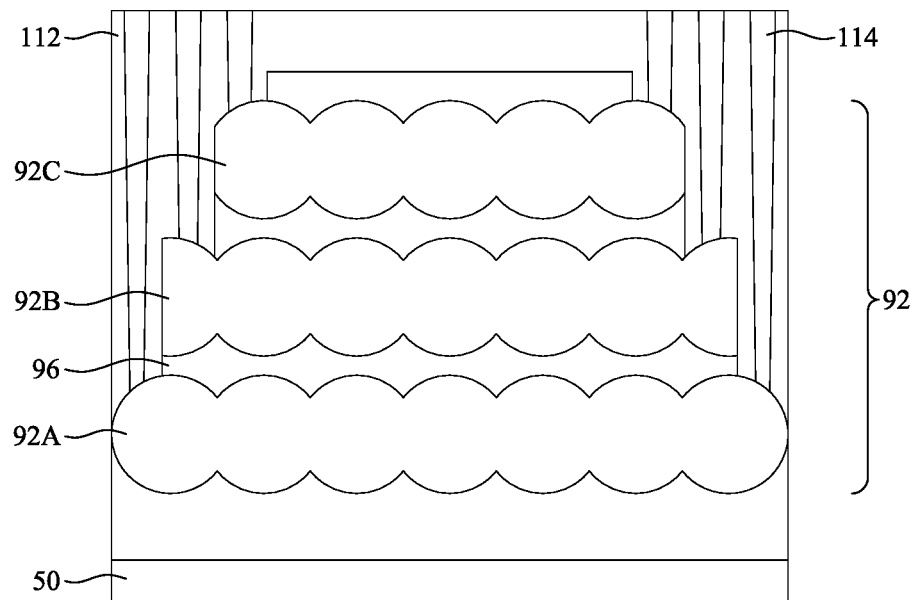
Figure 22D:
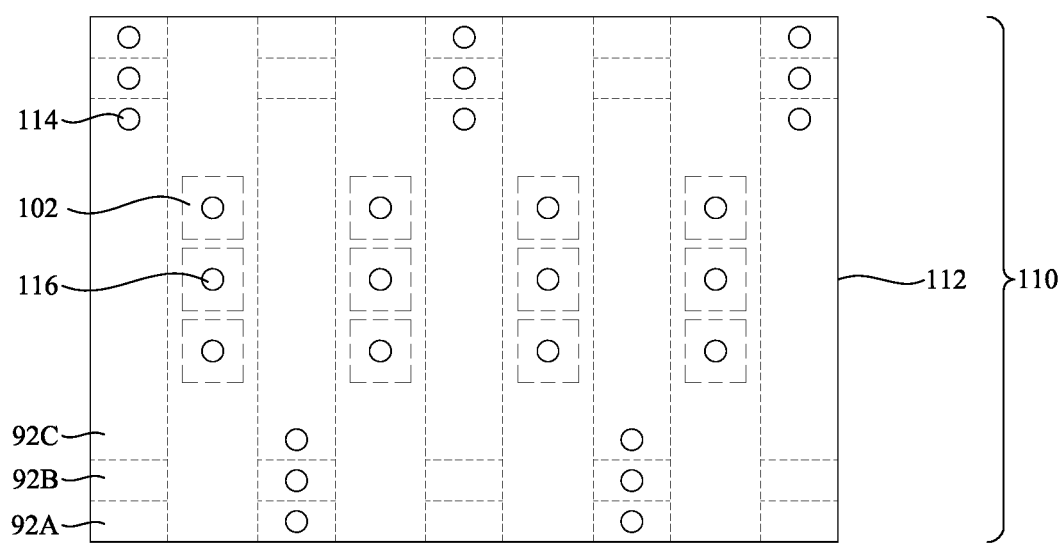

A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, titanium nitride, tantalum nitride, or the like. The contacts 114 and the contacts 116 may be formed simultaneously or separately. A planarization process, such as a CMP, may be performed to remove excess material from a surface of the IMD 112. The remaining liner and conductive material form the contacts 114 and the contacts 116 in the openings. As illustrated in FIG. 22C, the contacts 114 may extend to each of the epitaxial source/drain regions 92A-C. As illustrated in FIG. 22B, the contacts 116 extend to each of the gate electrodes 102.

Figure 23:
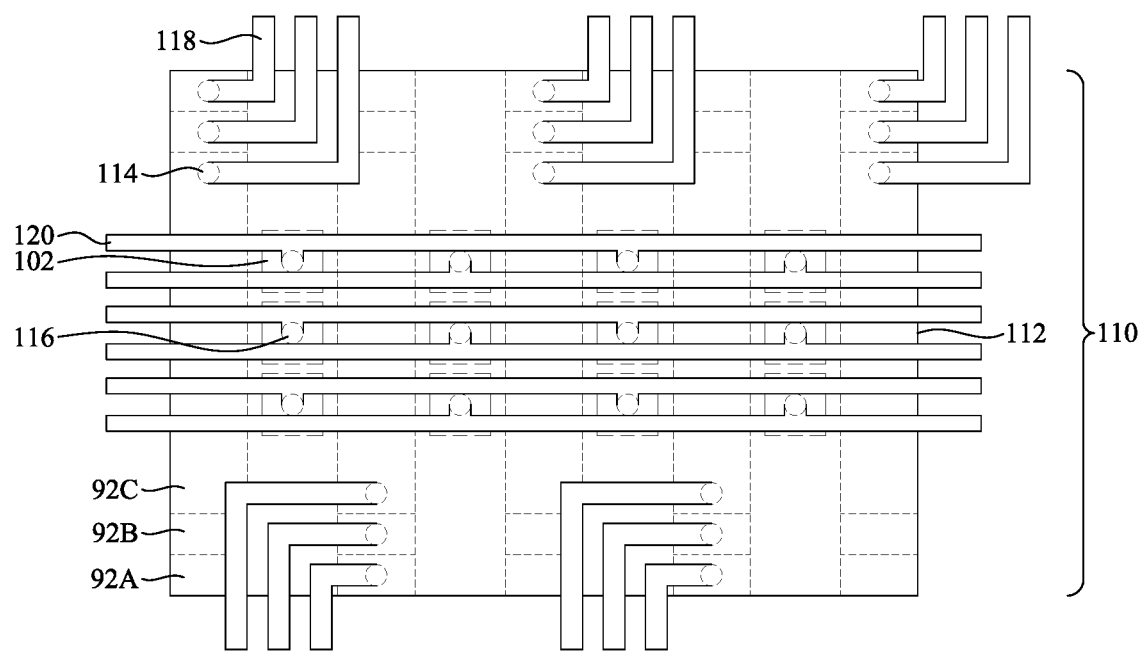

In FIG. 23, conductive lines 118 and conductive lines 120 are formed over and electrically coupled to the contacts 114 and the contacts 116, respectively. The conductive lines 118 and the conductive lines 120 may be formed over the IMD 112. In some embodiments, the conductive lines 118 and the conductive lines 120 may be formed in additional IMD layers, which are formed over the IMD 112 by processes and with materials the same as or similar to those used for the IMD 112. In some embodiments, the conductive lines 118 and the conductive lines 120 may be formed using a damascene process in which an additional IMD layer over the IMD 112 is patterned utilizing a combination of photolithography and etching techniques to form trenches corresponding to the desired pattern of the conductive lines 118 and the conductive lines 120. An optional diffusion barrier and/or optional adhesion layer may be deposited in the trenches and the trenches may then be filled with a conductive material. Suitable materials for the barrier layer include titanium, titanium nitride, titanium oxide, tantalum, tantalum nitride, tantalum oxide, or other alternatives. Suitable materials for the conductive material include copper, a copper alloy, silver, gold, tungsten, cobalt, aluminum, nickel, titanium nitride, tantalum nitride, combinations thereof, or the like. In an embodiment, the conductive lines 118 and the conductive lines 120 may be formed by depositing a seed layer of copper or a copper alloy, and filling the trenches using electroplating. A chemical mechanical planarization (CMP) process or the like may be used to remove excess conductive material from surfaces of the additional IMD layer and to planarize surfaces of the conductive lines 118 and the conductive lines 120 and the additional IMD layer for subsequent processing.

As illustrated in FIG. 23, the gate electrodes 102 which are adjacent in a direction perpendicular to lengthwise directions of the epitaxial source/drain regions 92 may be electrically coupled to different ones of the conductive lines 120. Each of the contacts 114 may be electrically coupled to one of the conductive lines 118. In some embodiments, the gate electrodes 102 may be word lines, which are connected to word signals through the contacts 116 and the conductive lines 120. The epitaxial source/drain regions 92 on a first side of the staircase structure 110 may be source lines, which are electrically coupled to a voltage source through the contacts 114 and the conductive lines 118 and the epitaxial source/drain regions 92 on a first side of the staircase structure 110 may be bit lines, which are electrically coupled to a ground through the contacts 114 and the conductive lines 118.

Forming the epitaxial source/drain regions 92 which are horizontally merged and vertically isolated from one another allows for separate connections to be made to each of the epitaxial source/drain regions 92A-C in the staircase structure 110. This increases the number of devices that can be provided in a given area (e.g., improves device density) and reduces costs.

Figure 24A:
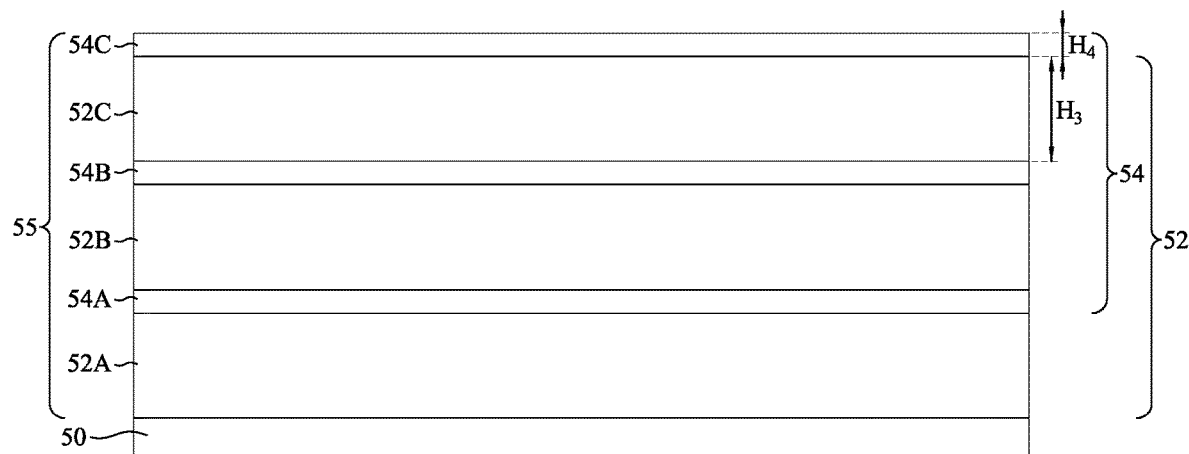
Figure 24B:
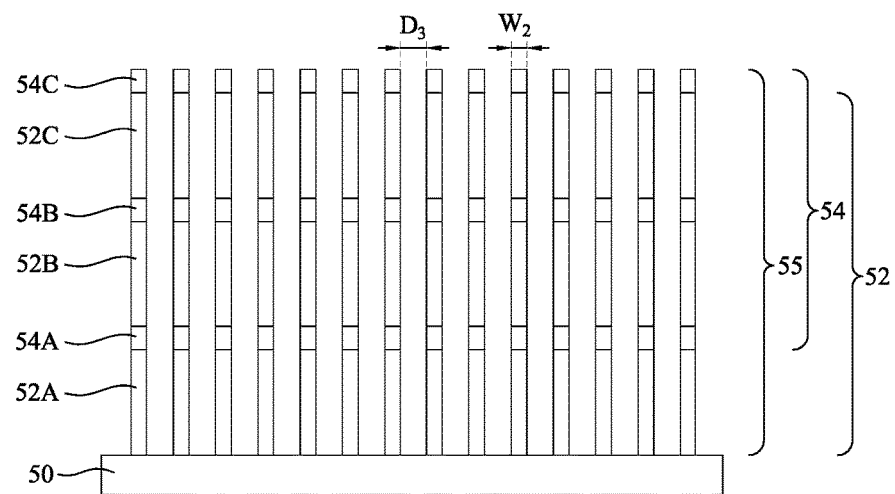
Figure 24C:
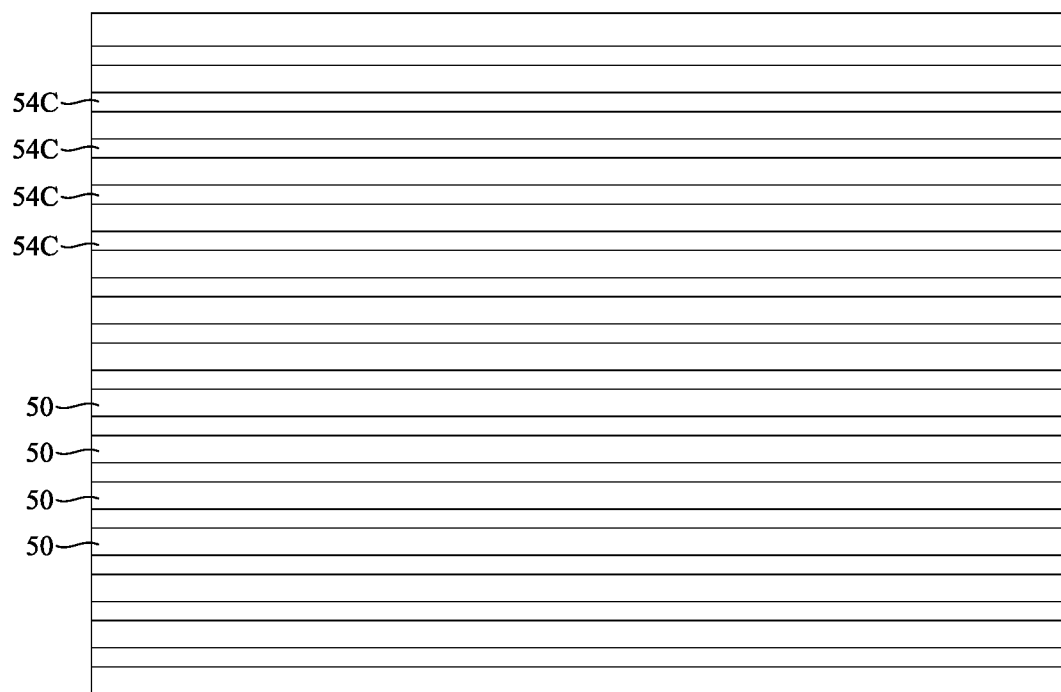

FIGS. 24A through 32 illustrate an embodiment in which second nanostructures 54 of adjacent gate structures are staggered from one another. FIGS. 24A through 24C illustrate nanostructures 55 after steps similar to or the same as those illustrated in FIGS. 3 through 4C and discussed above have been performed. The nanostructures 55 may be formed with widths and pitches different from those discussed above with respect to the embodiment of FIGS. 3 through 4C. For example, the nanostructures 55 may have widths $W_2$ ranging from about 10 nm to about 50 nm. The nanostructures 55 may be separated by distances $D_3$ ranging from about 20 nm to about 300 nm. Forming the first nanostructures 55 with the prescribed widths and pitches may help to allow horizontally adjacent ones of subsequently formed epitaxial source/drain regions (such as the epitaxial source/drain regions 92, discussed below with respect to FIGS. 29A through 29D) to merge, while vertically adjacent ones of the subsequently formed epitaxial source/drain regions are unmerged. This allows for the horizontally merged epitaxial source/drain regions to be used as source lines and bit lines and prevents shorts between vertically adjacent epitaxially source/drain regions. Using the merged epitaxial source/drain regions as source lines and bit lines reduces device size, improves device density, and reduces costs.

The nanostructures 55 may include first nanostructures 52A-C (collectively referred to as first nanostructures 52) and second nanostructures 54A-C (collectively referred to as second nanostructures 54) similar to or the same as those discussed above. The first nanostructures 52 may be formed with heights $H_3$ ranging from about 100 nm to about 500 nm, while the second nanostructures 54 may be formed with heights $H_4$ ranging from about 10 nm to about 50 nm. In some embodiments, a ratio of the heights $H_3$ of the first nanostructures 52 to the heights $H_4$ of the second nanostructures 54 may range from about 2 to about 10. Forming the first nanostructures 52 and the second nanostructures 54 with the prescribed thicknesses may help to allow horizontally adjacent ones of subsequently formed epitaxial source/drain regions (such as the epitaxial source/drain regions 92, discussed below with respect to FIGS. 29A through 29D) to merge, while vertically adjacent ones of the subsequently formed epitaxial source/drain regions are unmerged. This allows for the horizontally merged epitaxial source/drain regions to be used as source lines and bit lines and prevents shorts between vertically adjacent epitaxially source/drain regions. Using the merged epitaxial source/drain regions as source lines and bit lines reduces device size, improves device density, and reduces costs.

Figure 25A:
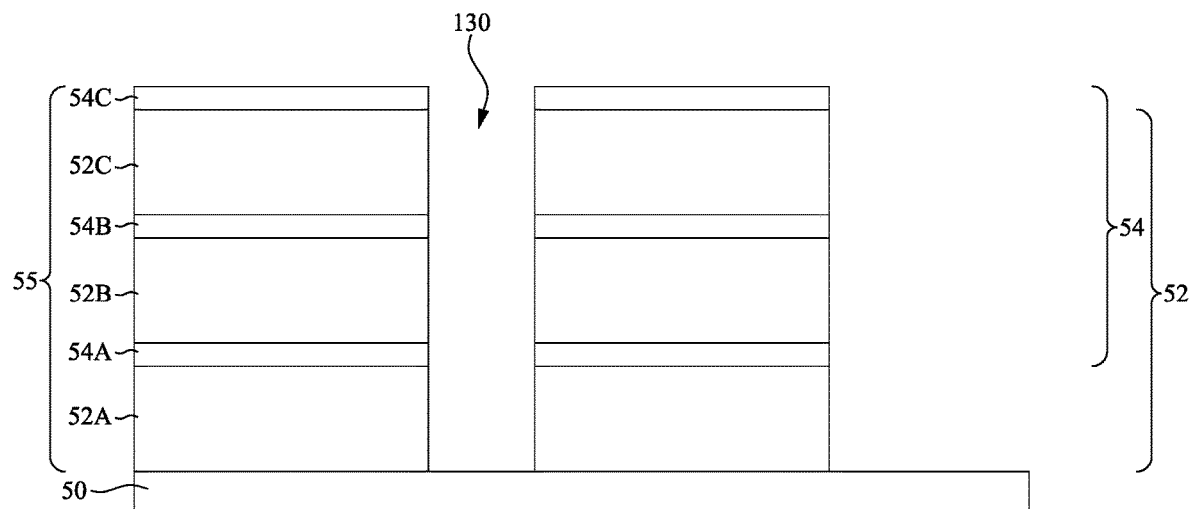
Figure 25B:
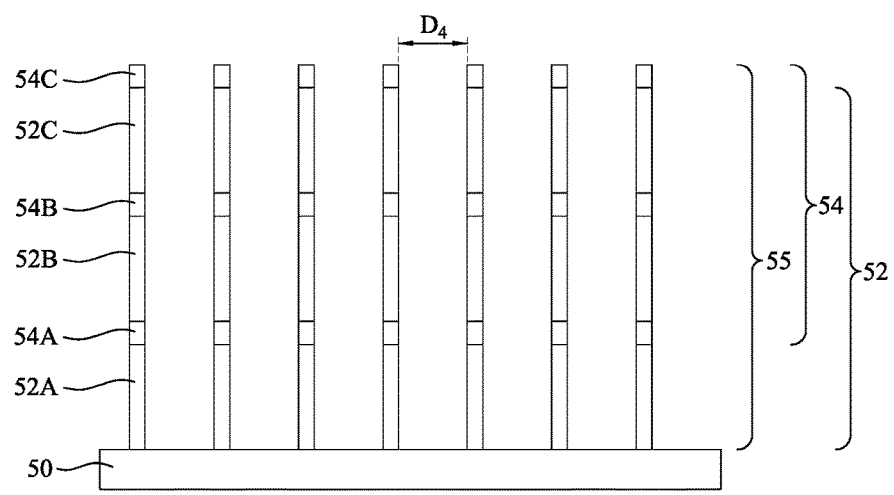
Figure 25C:
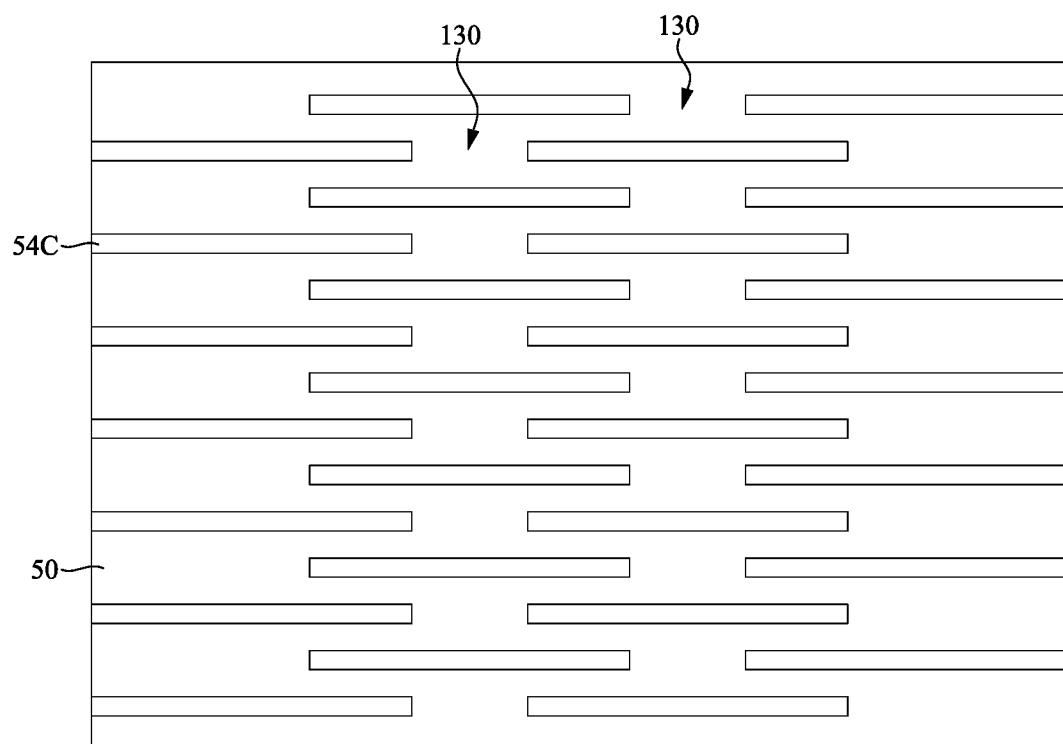

In FIGS. 25A through 25C, the nanostructures 55 are patterned to form gaps 130 in each of the nanostructures 55. The gaps 130 may extend through the second nanostructures 54A-C and the first nanostructures 52A-C and may expose surfaces of the substrate 50. The nanostructures 55 may be patterned using processes the same as or similar to those discussed above with respect to FIGS. 4A through 4C. In some embodiments, the nanostructures 55 may be formed and patterned to form the gaps 130 in a single processing step. As illustrated in FIG. 25C, the gaps 130 formed in adjacent ones of the nanostructures 55 may be staggered and remaining portions of adjacent ones of the nanostructures 55 may also be staggered. Portions of the remaining portions of adjacent ones of the nanostructures 55 may overlap one another. Forming the nanostructures 55 in a staggered configuration may simplify connections made to the second nanostructures 54 in subsequent steps, reducing costs and reducing device defects. Following the patterning of the nanostructures 55, portions of the nanostructures 55 which subsequently form channel regions of the transistors 204 may be separated from one another in a direction perpendicular to longitudinal axes of the nanostructures 55 by a distance $D_4$ ranging from about 50 nm to about 200 nm.

Figure 26A:
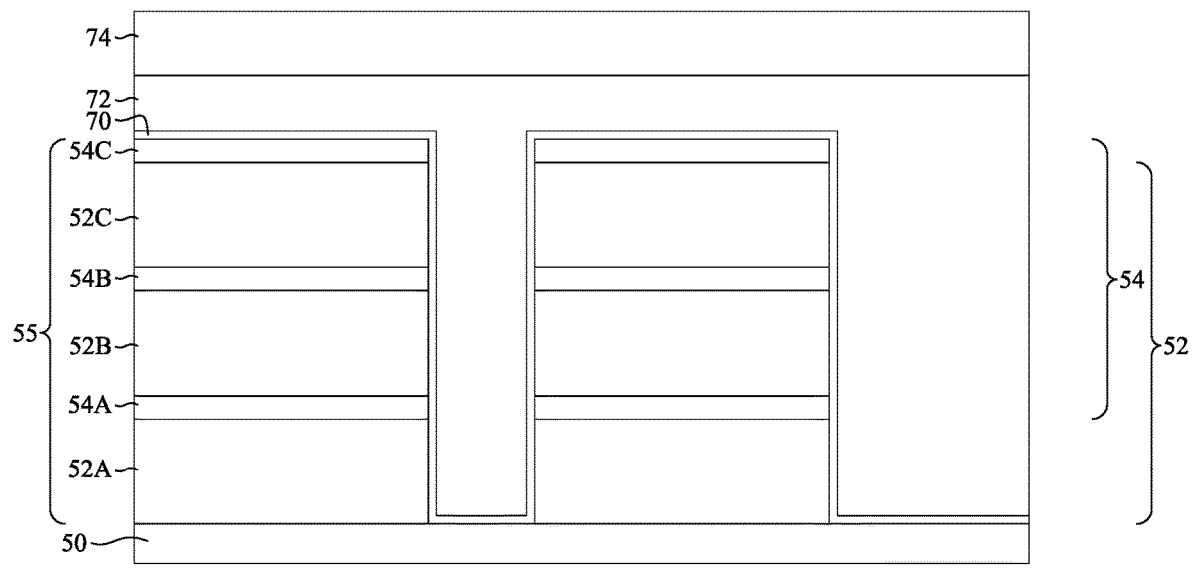
Figure 26B:
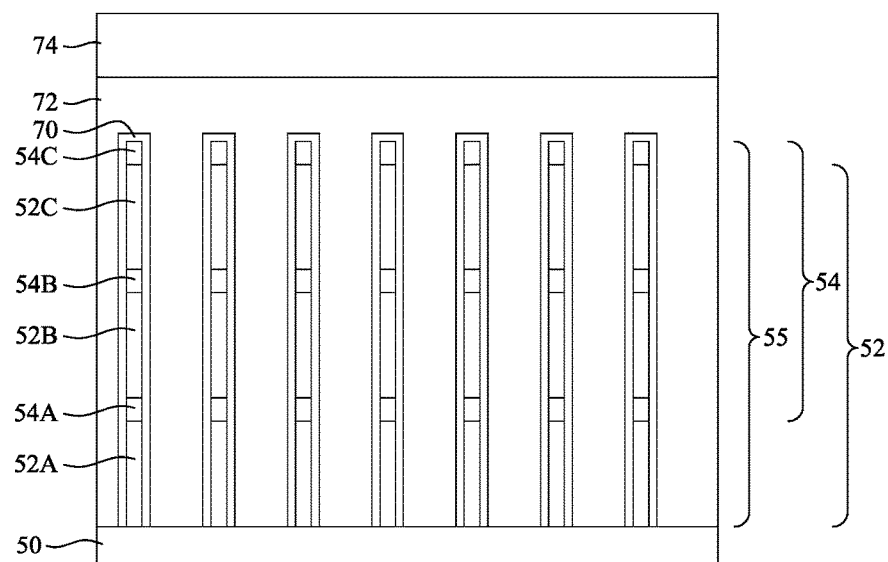
Figure 26C:
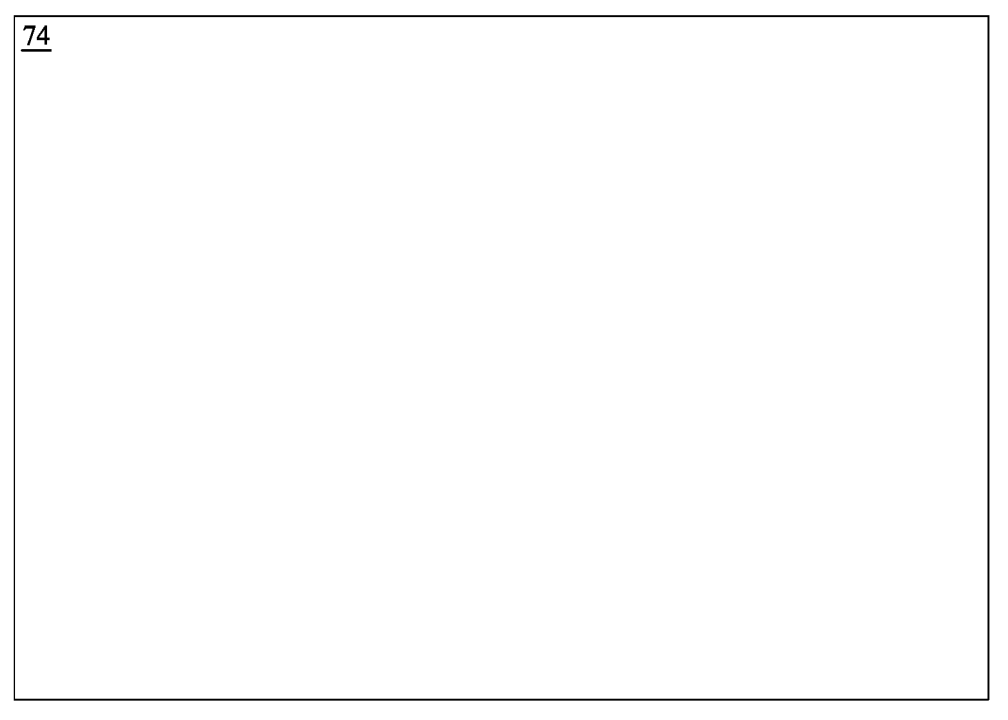

In FIGS. 26A through 26C, a dummy dielectric layer 70 is formed on the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region and the p-type region. It is noted that the dummy dielectric layer 70 is shown covering only the nanostructures 55 for illustrative purposes only. In some embodiments, the dummy dielectric layer 70 may be deposited such that the dummy dielectric layer 70 covers the substrate 50, such that the dummy dielectric layer 70 extends between the dummy gate layer 72 and the substrate 50.

Figure 27A:
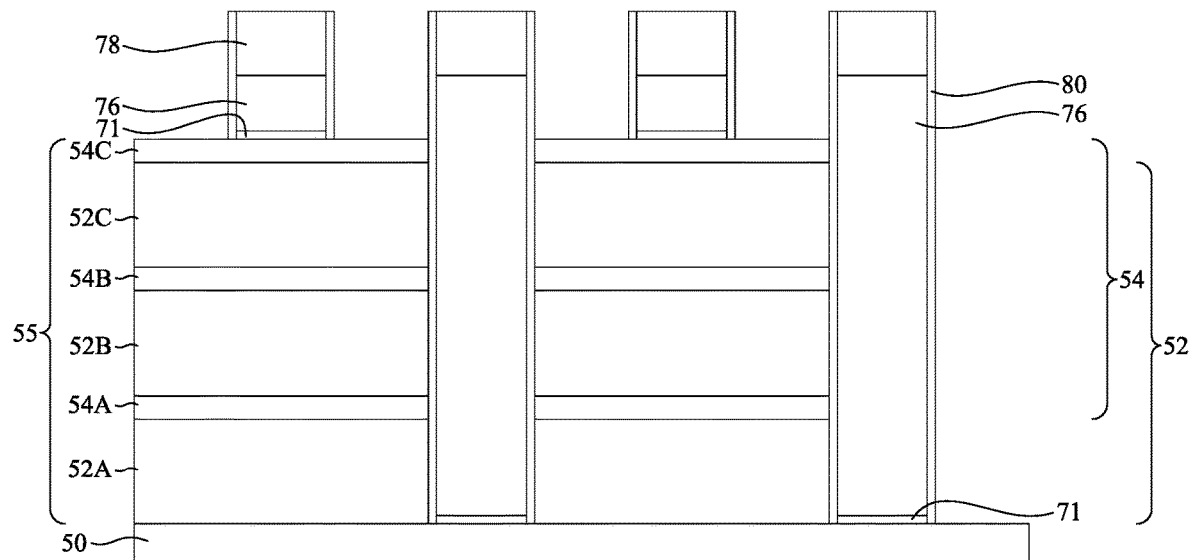
Figure 27B:
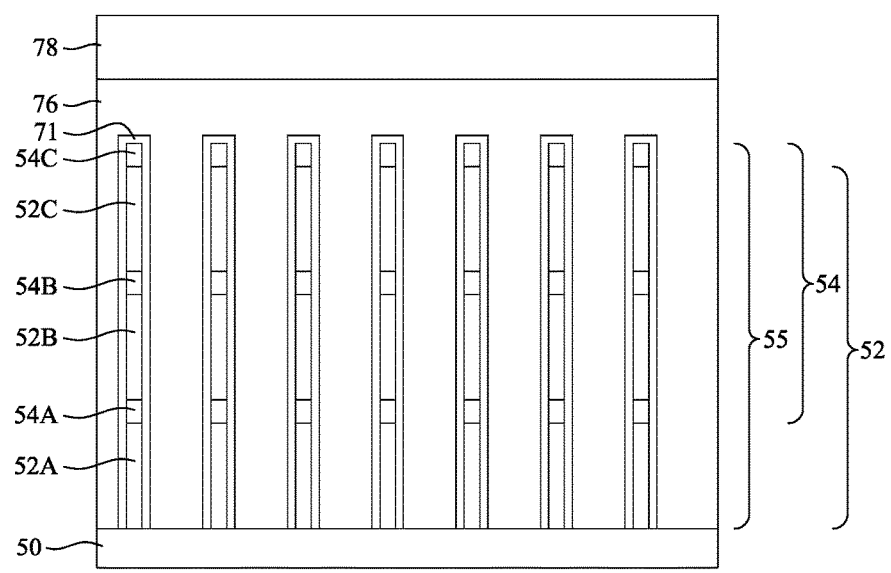
Figure 27C:
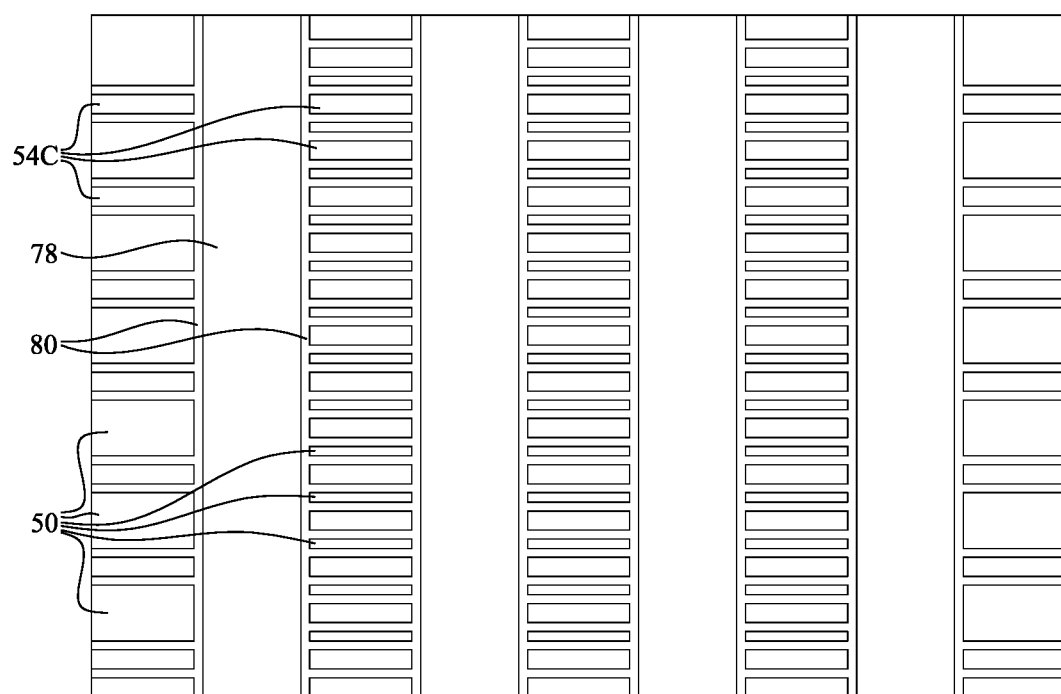

In FIGS. 27A through 27C, the mask layer 74 (see FIGS. 26A through 26C) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective nanostructures 55.

Further in FIGS. 27A through 27C, first spacers 80 are formed over the nanostructures 55, adjacent the dummy gate dielectrics 71, the dummy gates 76, and the masks 78. The first spacers 80 may act as spacers for forming self-aligned source/drain regions. The first spacers 80 may be formed by depositing a first spacer layer (not separately illustrated) on top surfaces of the substrate 50; top surfaces and sidewalls of the nanostructures 55 and the masks 78; and sidewalls of the dummy gates 76 and the dummy gate dielectric 71. The first spacer layer may be formed of silicon oxide, silicon nitride, silicon oxynitride, or the like, using techniques such as thermal oxidation or deposited by CVD, ALD, or the like. The first spacer layer may then be etched to form the first spacers 80. As will be discussed in greater detail below, the first spacers 80 act to self-align subsequently formed source drain regions, as well as to protect sidewalls of the nanostructure 55 during subsequent processing. The first spacer layer may be etched using a suitable etching process, such as an isotropic etching process (e.g., a wet etching process), an anisotropic etching process (e.g., a dry etching process), or the like. As illustrated in FIG. 27A, the first spacers 80 may be disposed on sidewalls of the masks 78, the dummy gates 76, and the dummy gate dielectrics 71. As illustrated in FIG. 27C, the first spacers 80 may be further disposed on sidewalls of the nanostructures 55.

As illustrated in FIG. 27A, the first spacers 80 may be formed extending along end surfaces of the first nanostructures 52 and the second nanostructures 54. In some embodiments, the dummy gates 76 may be formed extending along the end surfaces of the first nanostructures 52 and the second nanostructures 54 and the first spacers 80 may be formed over the second nanostructures 54C.

Although the nanostructures 55 are described as being patterned to form the gaps 130 prior to forming and patterning the dummy gates 76, the dummy gate dielectrics 71, and the masks 78, in some embodiments, the nanostructures 55 may be patterned to form the gaps 130 after forming and patterning the dummy gates 76, the dummy gate dielectrics 71, and the masks 78. Further, the nanostructures 55 may be patterned to form the gaps 130 before or after forming the first spacers 80.

Figure 28A:
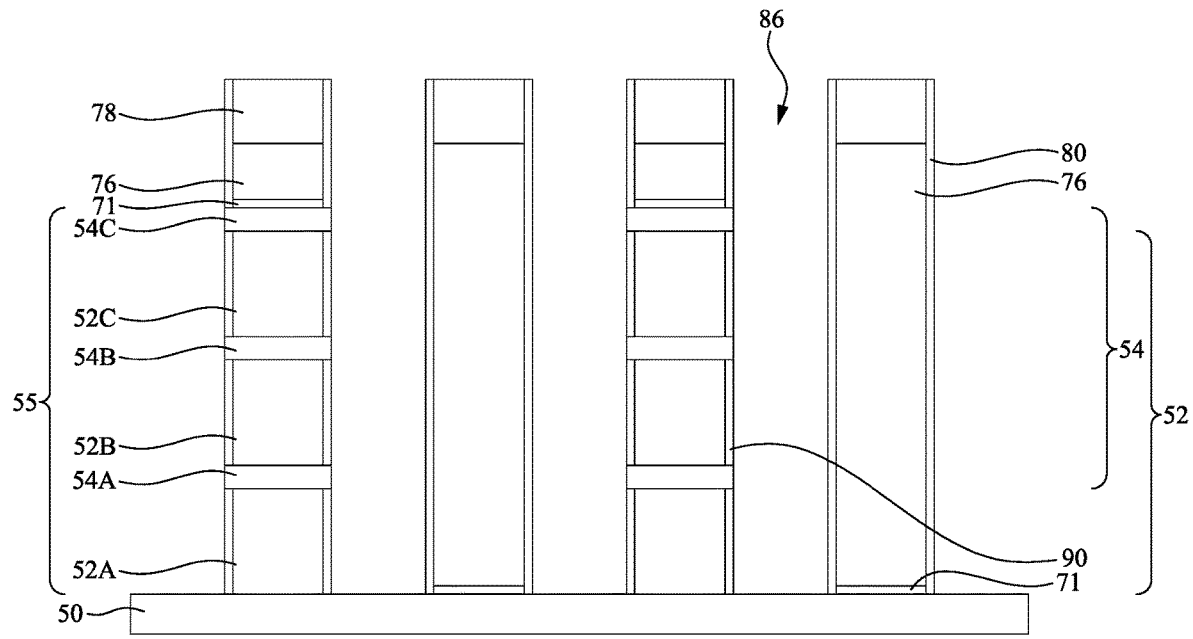
Figure 28B:
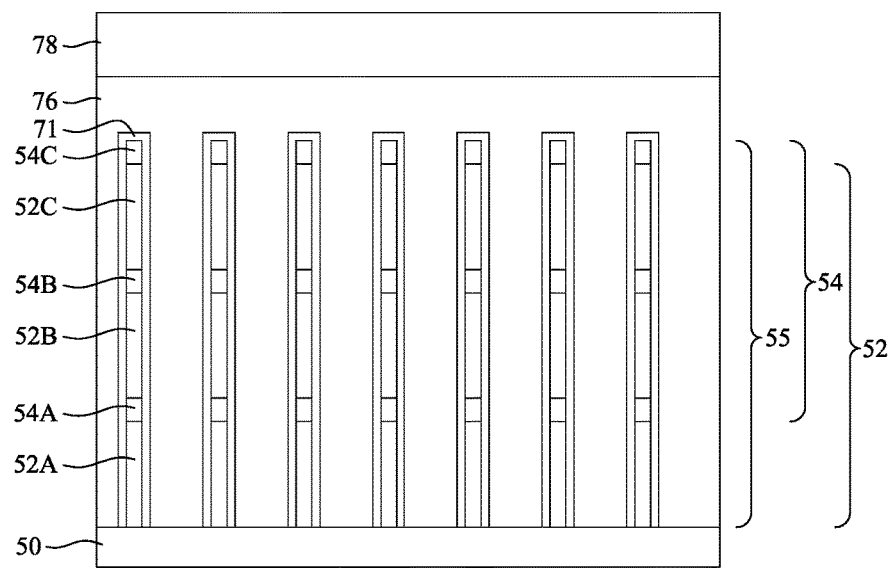
Figure 28C:
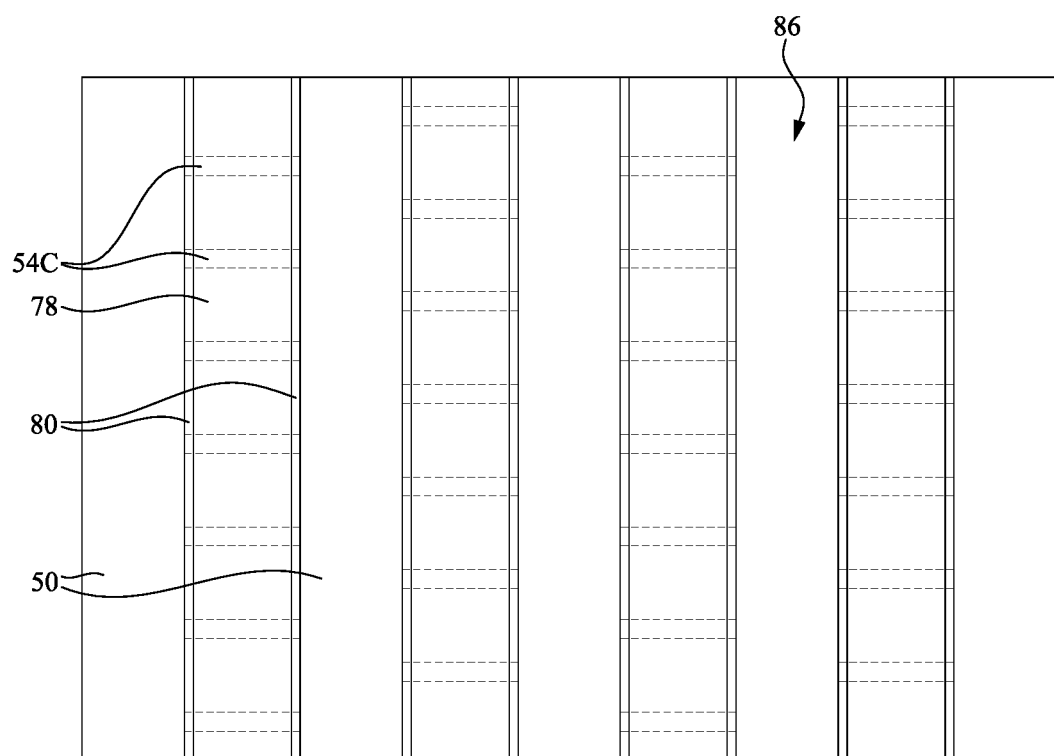

In FIGS. 28A through 28C, first recesses 86 are formed in the nanostructures 55. In some embodiments, the first recesses 86 may also extend at least partially into the substrate 50. Epitaxial source/drain regions will be subsequently formed in the first recesses 86. The first recesses 86 may extend through the first nanostructures 52 and the second nanostructures 54. As illustrated in FIG. 28A, the first recesses 86 may extend to top surfaces of the substrate 50. The first recesses 86 may be formed by etching the nanostructures 55 using anisotropic etching processes, such as RIE, NBE, or the like. The first spacers 80 and the masks 78 mask portions of the nanostructures 55 during the etching processes used to form the first recesses 86. A single etch process or multiple etch processes may be used to etch each layer of the nanostructures 55. Timed etch processes may be used to stop the etching of the first recesses 86 after the first recesses 86 reach a desired depth.

Further in FIGS. 28A through 28C, portions of sidewalls of the first nanostructures 52 exposed by the first recesses 86 are replaced by first inner spacers 90. The first nanostructures 52 may be etched using processes the same as or similar to those discussed above with respect to FIG. 8. The first inner spacers 90 may then be formed using processes and materials the same as or similar to those discussed above with respect to FIG. 9A or 9B.

Figure 29A:
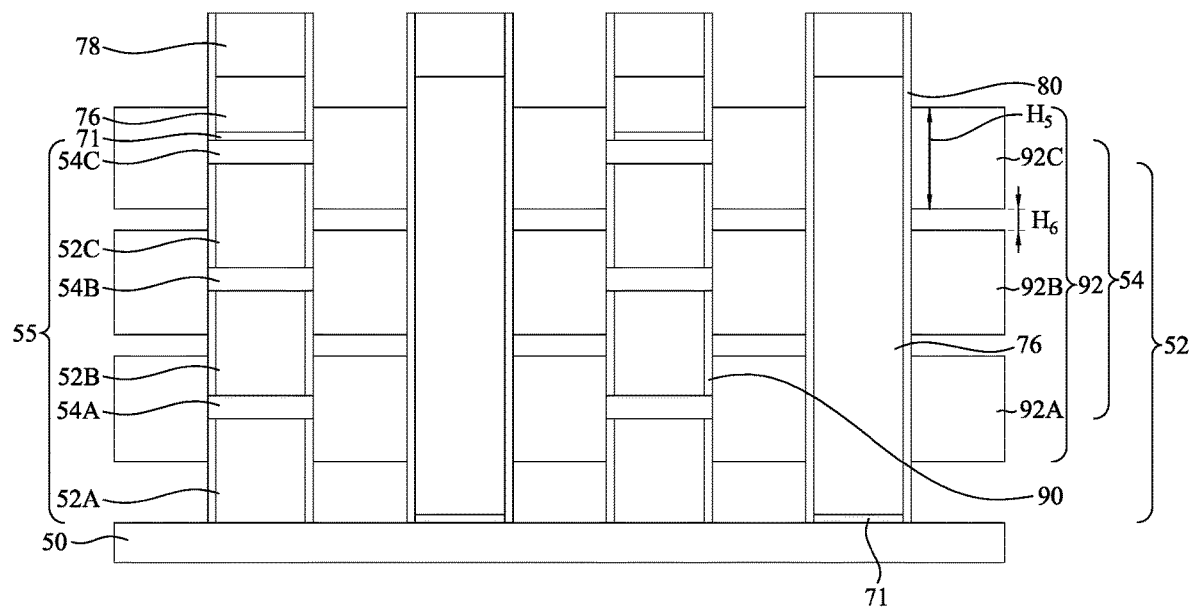
Figure 29B:
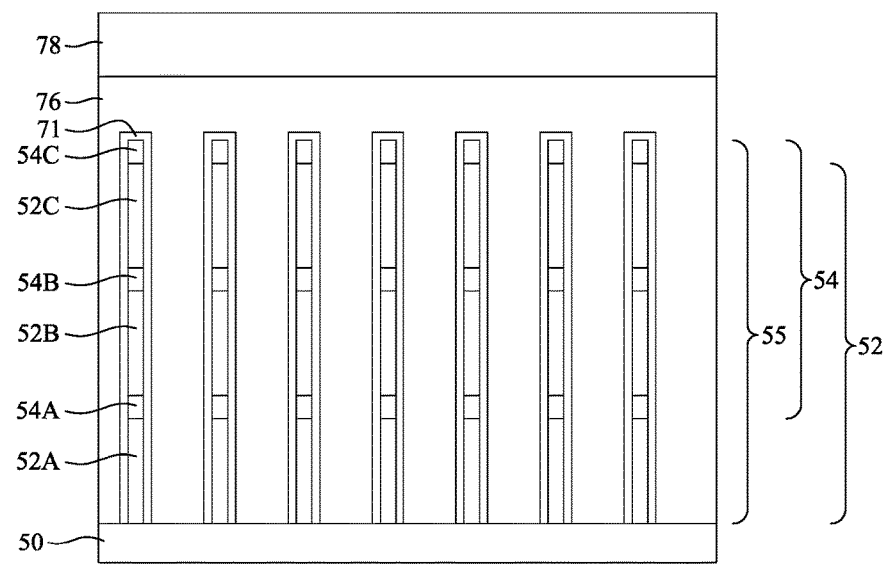

In FIGS. 29A through 29D, epitaxial source/drain regions 92A-C are formed in the first recesses 86. The epitaxial source/drain regions 92A-C may be collectively referred to as epitaxial source/drain regions 92. In some embodiments, the epitaxial source/drain regions 92 may exert stress on the second nanostructures 54, thereby improving performance. As illustrated in FIG. 29A, the epitaxial source/drain regions 92 are formed in the first recesses 86 such that each dummy gate 76 is disposed between respective neighboring pairs of the epitaxial source/drain regions 92. In some embodiments, the first spacers 80 are used to separate the epitaxial source/drain regions 92 from the dummy gates 76 and the first inner spacers 90 are used to separate the epitaxial source/drain regions 92 from the first nanostructures 52 by appropriate lateral distances so that the epitaxial source/drain regions 92 do not short out with subsequently formed gates of the resulting nano-FETs.

Figure 29C:
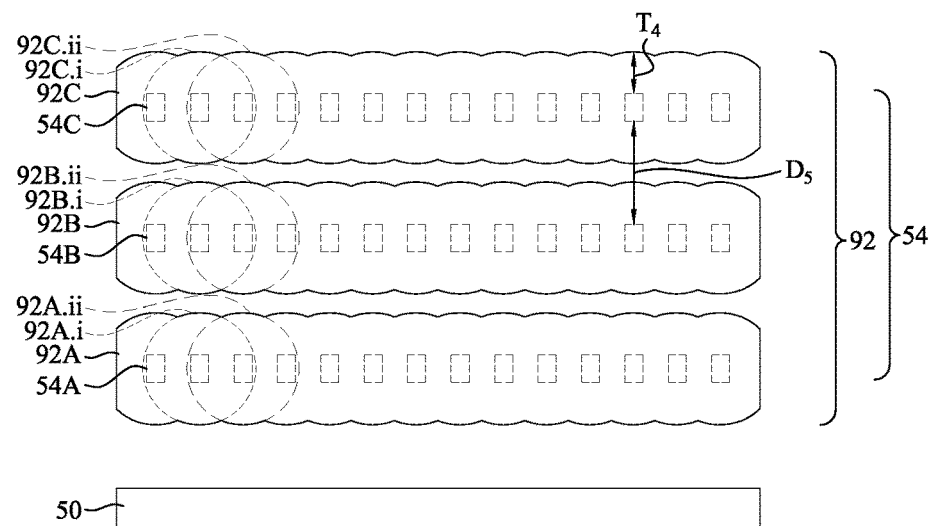
Figure 29D:
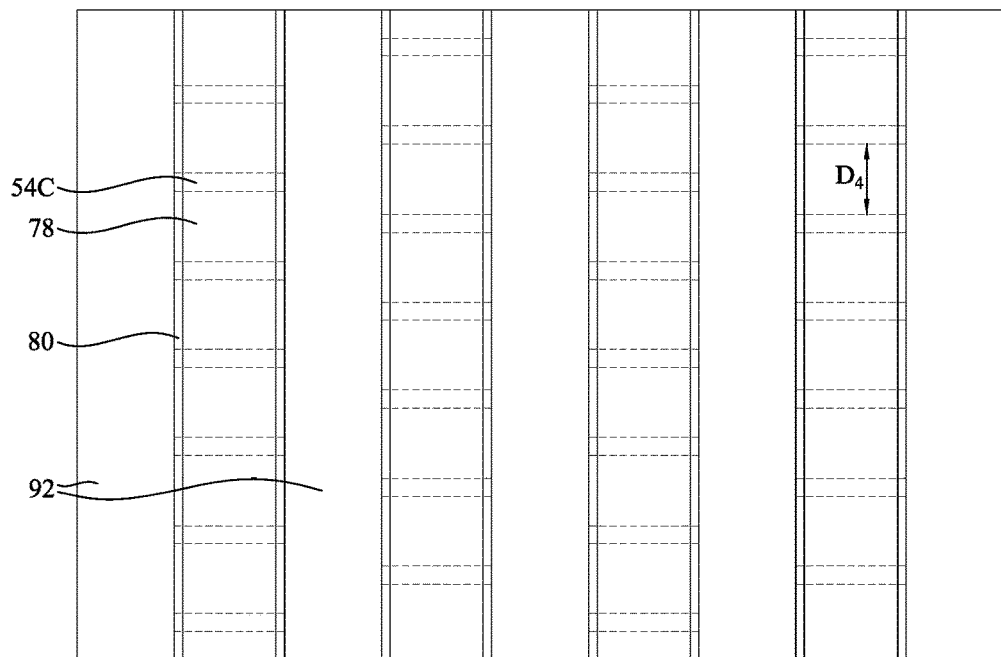
Figure 30A:
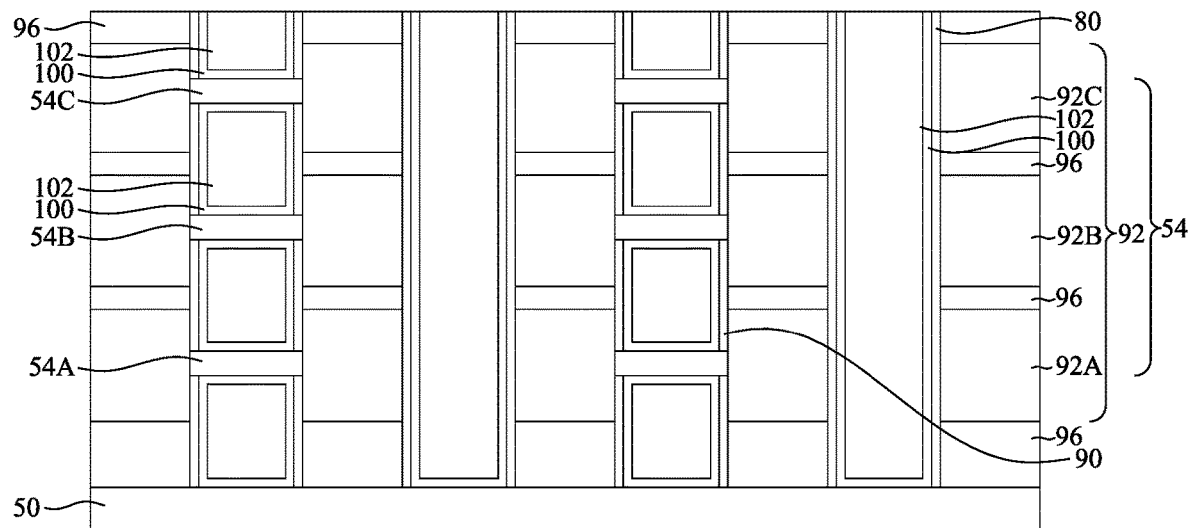
Figure 30B:
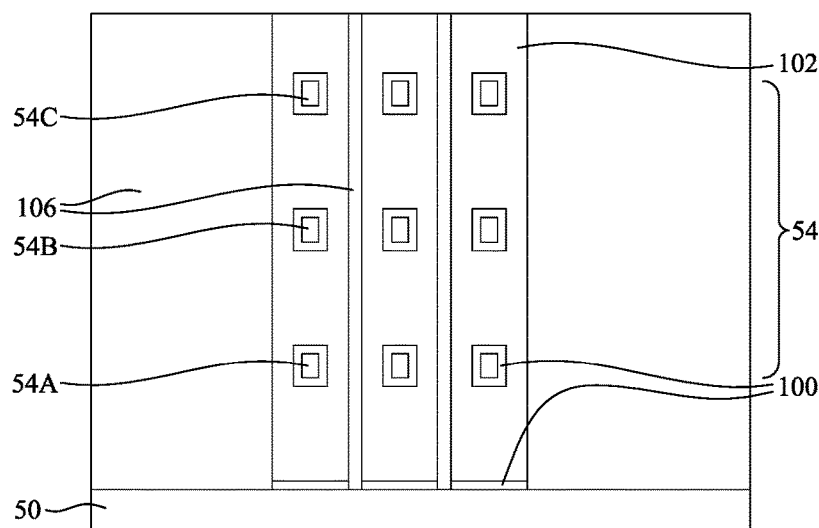
Figure 30C:
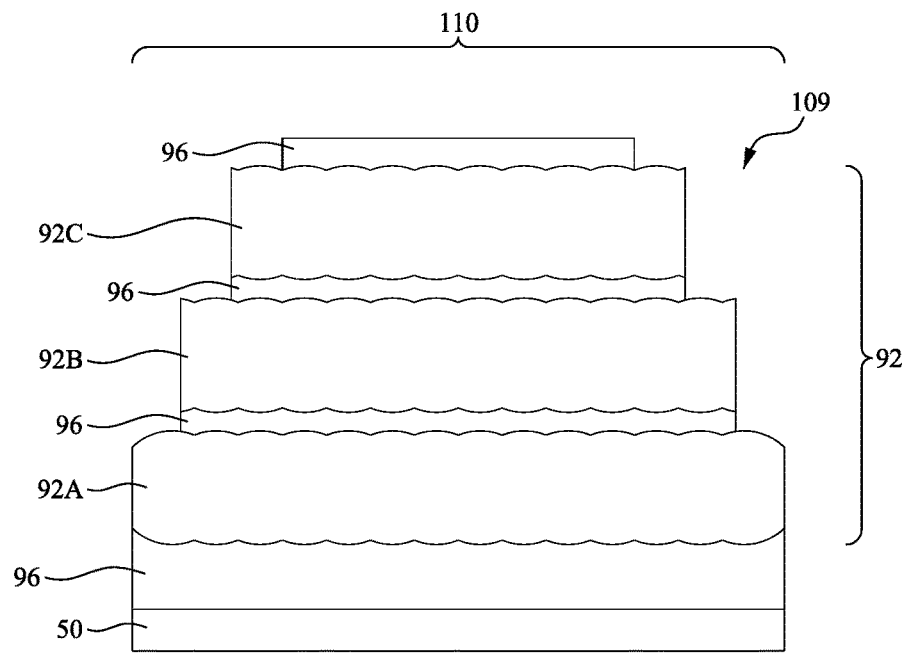
Figure 30D:
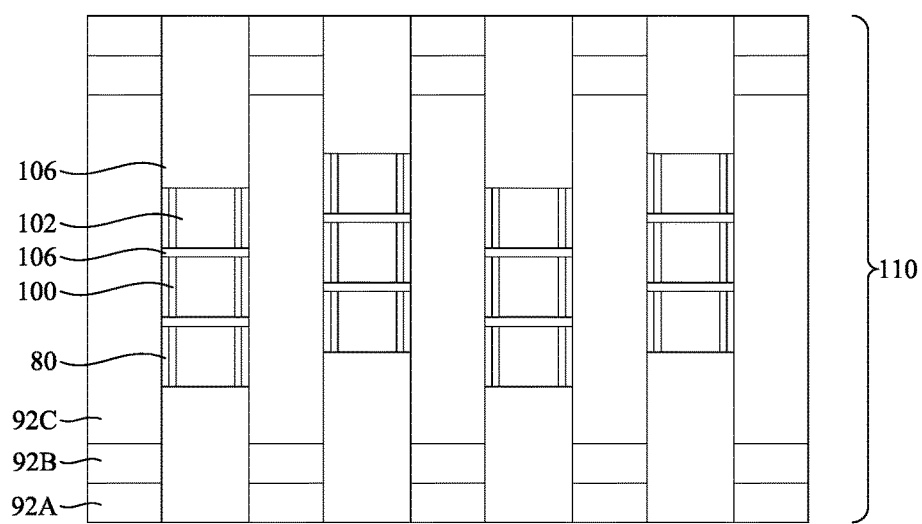

As illustrated in FIGS. 29A, 29C, and 29D, the epitaxial source/drain regions 92A-C may be epitaxially grown from the second nanostructures 54A-C, respectively. The epitaxial source/drain regions 92 may be grown such that horizontally adjacent epitaxial source/drain regions 92 (e.g., epitaxial source/drain regions 92 which are adjacent to one another in a direction parallel to a major surface of the substrate 50), exemplified by epitaxial source/drain regions 92A.i and 92A.ii, epitaxial source/drain regions 92B.i and 92B.ii, epitaxial source/drain regions 92C.i and 92C.ii, and corresponding dashed lines, merge with one another. On the other hand, vertically adjacent epitaxial source/drain regions 92 (e.g., epitaxial source/drain regions 92 which are directly over/under one another in a direction perpendicular to the major surface of the substrate 50), exemplified by the epitaxial source/drain regions 92A-C, remain separated from one another. The epitaxial source/drain regions 92 may extend from sidewalls of the second nanostructures 54 and may extend along sidewalls of the first inner spacers 90 and the first spacers 80.

The epitaxial source/drain regions 92 may be epitaxially grown to have thicknesses $T_4$ ranging from about 30 nm to about 200 nm. The epitaxial source/drain regions 92 may have heights $H_5$ ranging from about 50 nm to about 400 nm and may be separated from one another by gaps 93 having heights $H_6$ ranging from about 50 nm to about 200 nm. The spacing and dimensions of the first nanostructures 52 and the second nanostructures 54 may be selected along with the thickness $T_4$ in order to allow the horizontally adjacent epitaxial source/drain regions 92 to merge with one another, while the vertically adjacent epitaxial source/drain regions 92 remain unmerged. In some embodiments, this may be accomplished by forming the first nanostructures 52 with heights $H_3$ greater than distances $D_4$ between adjacent ones of the nanostructures 55, such that horizontally adjacent ones of the second nanostructures 54 are spaced closer together than vertically adjacent ones of the second nanostructures 54. Horizontally adjacent second nanostructures 54 may be separated from one another by distances $D_4$ ranging from about 50 nm to about 200 nm, while vertically adjacent second nanostructures 54 may be separated from one another by distances $D_5$ which are more than the distances $D_4$ and range from about 100 nm to about 500 nm. This allows for the horizontally merged epitaxial source/drain regions 92 to be used as source lines and bit lines and prevents shorts between vertically adjacent epitaxially source/drain regions 92. Using the merged epitaxial source/drain regions 92 as source lines and bit lines reduces device size, improves device density, and reduces costs.

Although the epitaxial source/drain regions 92 are illustrated as having rectangular shapes in the cross-sectional view illustrated in FIG. 29A and round shapes in the cross-sectional view illustrated in FIG. 29C, the epitaxial source/drain regions 92 may have any appropriate cross-sectional shapes, such as hexagonal, octagonal, or other shapes. In some embodiments, the epitaxial source/drain regions 92 may have facets. In some embodiments, the epitaxial source/drain regions 92 in both the n-type region and the p-type region may include materials such as silicon, silicon carbide, phosphorous doped silicon carbide, silicon phosphide, silicon-germanium, boron doped silicon-germanium, germanium, germanium tin, or the like The epitaxial source/drain regions 92 in the n-type region, e.g., the NMOS region, may be formed by masking the p-type region, e.g., the PMOS region. Then, the epitaxial source/drain regions 92 are epitaxially grown in the first recesses 86 in the n-type region. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like.

The epitaxial source/drain regions 92 in the p-type region, e.g., the PMOS region, may be formed by masking the n-type region, e.g., the NMOS region. Then, the epitaxial source/drain regions 92 are epitaxially grown in the first recesses 86 in the p-type region. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like.

The epitaxial source/drain regions 92, second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

FIGS. 30A through 30D illustrate the structures after the steps illustrated in FIGS. 11A through 21D have been performed, as discussed above. Specifically, a first ILD 96 is formed surrounding the epitaxial source/drain regions 92, the dummy gate structures are replaced by gate structures including gate electrodes 102 and gate dielectric layers 100, portions of the gate structures are replaced by dielectric materials 106, and a staircase structure 110 is formed in the epitaxial source/drain regions 92 and the first ILD 96.

In FIGS. 31A through 31D, an inter-metal dielectric (IMD) 112 is deposited over the structure of FIGS. 30A through 30D. The IMD 112 may be formed along top surfaces of the first ILD 96, the first spacers 80, the gate dielectric layers 100, the gate electrodes 102, the dielectric materials 106, and the epitaxial source/drain regions 92A-C and along side surfaces of the first ILD 96 and the epitaxial source/drain regions 92A-C. The IMD 112 may be formed of a dielectric material, and may be deposited by any suitable method, such as CVD, PECVD, flowable CVD (FCVD), or the like. The dielectric materials may include phosphosilicate glass (PSG), boro-silicate glass (BSG), boron-doped phospho-silicate glass (BPSG), undoped silicate glass (USG), or the like. In some embodiments, the IMD 112 may comprise an oxide (e.g., silicon oxide or the like), a nitride (e.g., silicon nitride or the like), a combination thereof or the like. Other dielectric materials formed by any acceptable process may be used.

Further in FIGS. 31A through 31D, contacts 114 and contacts 116 are formed extending to and electrically coupled to the epitaxial source/drain regions 92 and the gate electrodes 102, respectively. The staircase shape of the epitaxial source/drain regions 92 provides surfaces on each of the epitaxial source/drain regions 92 for the contacts 114 to land on. Forming the contacts 114 and the contacts 116 may include patterning openings in the IMD 112 to expose portions of the epitaxial source/drain regions 92 and the gate electrodes 102 using a combination of photolithography and etching, for example. In some embodiments, the openings in the IMD 112 may be formed by a process having high etch selectivity to materials of the IMD 112. As such, the openings in the IMD 112 may be formed without significantly removing materials of the epitaxial source/drain regions 92 and the gate electrodes 102.

In some embodiments, openings exposing each of the epitaxial source/drain regions 92A-C may be formed simultaneously. Because of variations in the thickness of the IMD 112 overlying each of the epitaxial source/drain regions 92A-C, the epitaxial source/drain regions 92C may be exposed to the etching for a longer duration than the epitaxial source/drain regions 92B, which are exposed to the etching for a longer duration than the 92A. Exposure to the etching may cause some material loss, pitting, or other damage in the epitaxial source/drain regions 92 such that the epitaxial source/drain regions 92C are damaged to a greatest extent, the epitaxial source/drain regions 92B are damaged to a decreasing extent, and the epitaxial source/drain regions 92A are damaged to a least extent. Openings exposing the gate electrodes 102 may be formed simultaneously with the openings exposing the epitaxial source/drain regions 92, or by separate etching processes similar to or the same as those used to form the openings exposing the epitaxial source/drain regions 92.

Figure 31A:
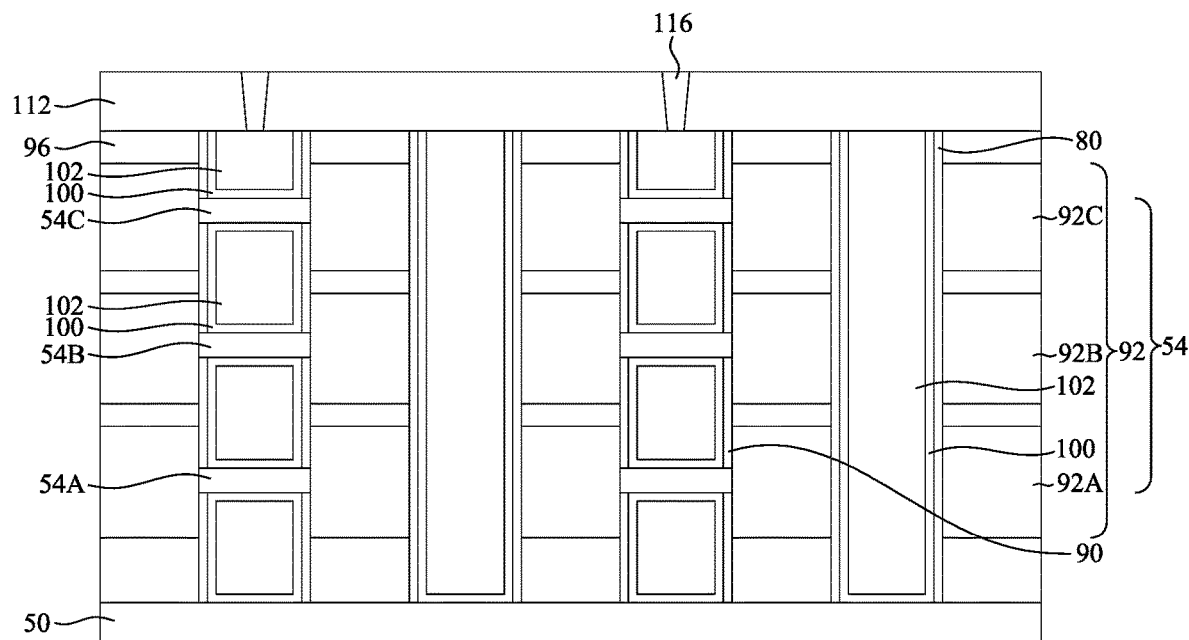
Figure 31B:
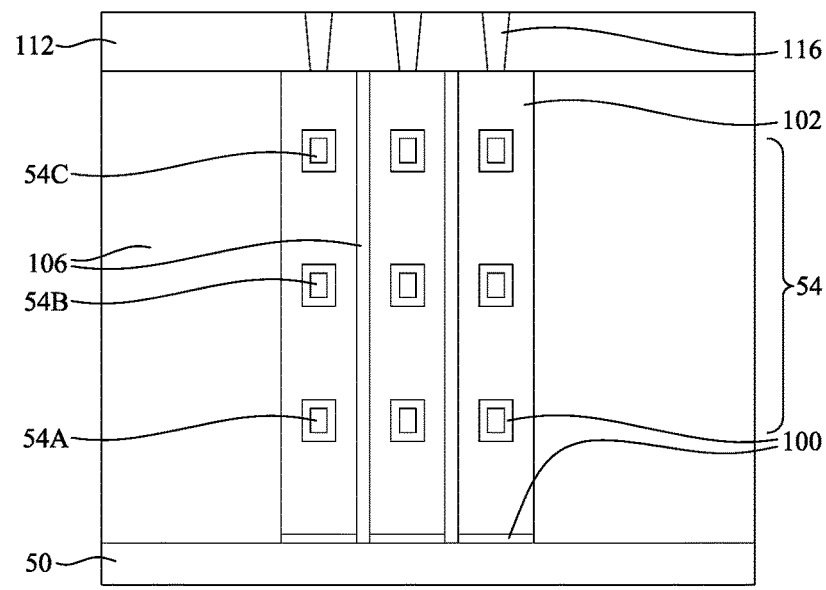
Figure 31C:
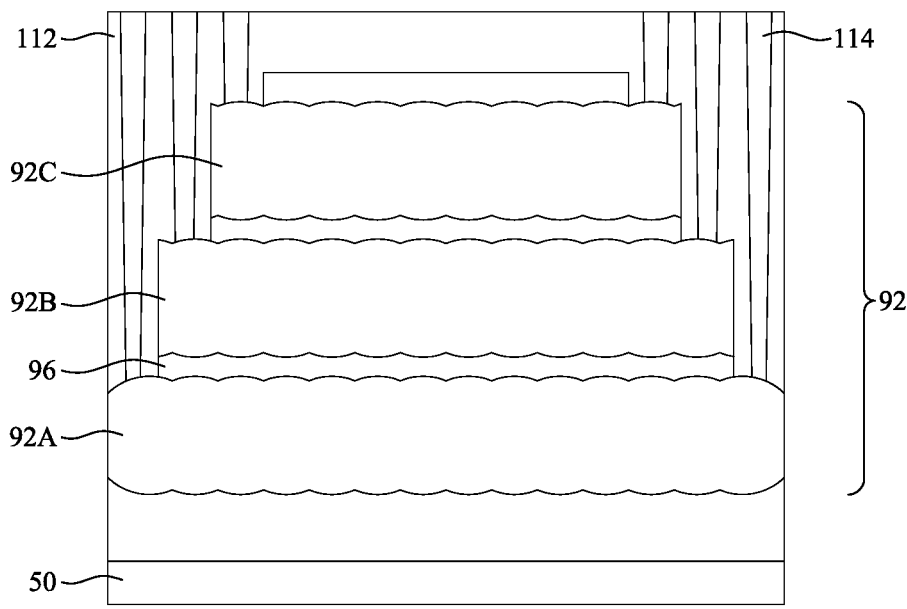
Figure 31D:
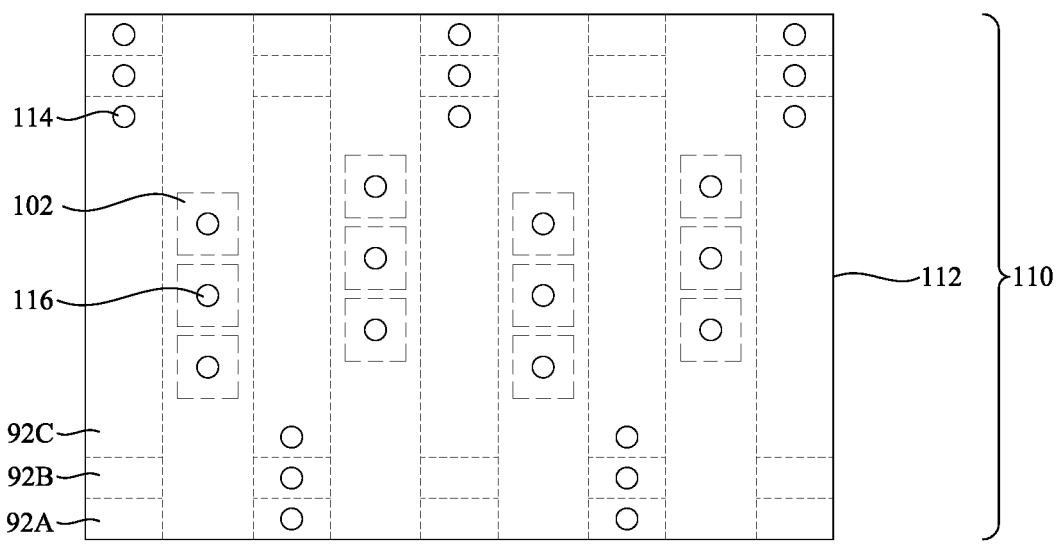

A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, titanium nitride, tantalum nitride, or the like. The contacts 114 and the contacts 116 may be formed simultaneously or separately. A planarization process, such as a CMP, may be performed to remove excess material from a surface of the IMD 112. The remaining liner and conductive material form the contacts 114 and the contacts 116 in the openings. As illustrated in FIG. 22C, the contacts 114 may extend to each of the epitaxial source/drain regions 92A-C. As illustrated in FIG. 31B, the contacts 116 extend to each of the gate electrodes 102.

Figure 32:
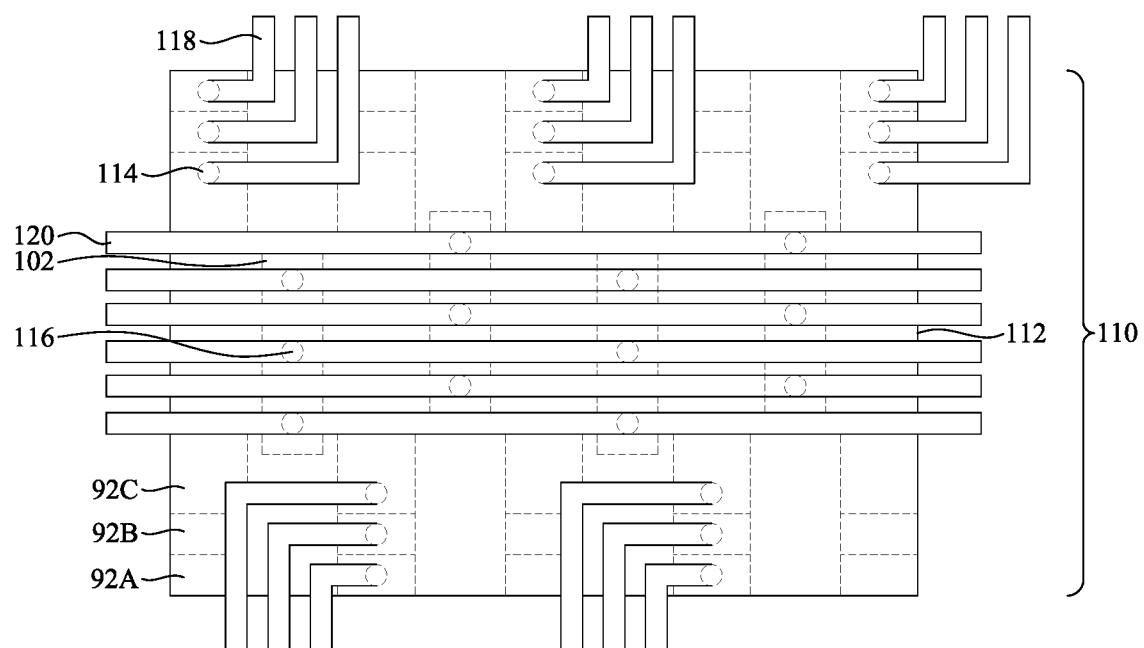

In FIG. 32, conductive lines 118 and conductive lines 120 are formed over and electrically coupled to the contacts 114 and the contacts 116, respectively. The conductive lines 118 and the conductive lines 120 may be formed over the IMD 112. In some embodiments, the conductive lines 118 and the conductive lines 120 may be formed in additional IMD layers, which are formed over the IMD 112 by processes and with materials the same as or similar to those used for the IMD 112. In some embodiments, the conductive lines 118 and the conductive lines 120 may be formed using a damascene process in which an additional IMD layer over the IMD 112 is patterned utilizing a combination of photolithography and etching techniques to form trenches corresponding to the desired pattern of the conductive lines 118 and the conductive lines 120. An optional diffusion barrier and/or optional adhesion layer may be deposited in the trenches and the trenches may then be filled with a conductive material. Suitable materials for the barrier layer include titanium, titanium nitride, titanium oxide, tantalum, tantalum nitride, titanium oxide, or other alternatives. Suitable materials for the conductive material include copper, a copper alloy, silver, gold, tungsten, cobalt, aluminum, nickel, titanium nitride, tantalum nitride, combinations thereof, or the like. In an embodiment, the conductive lines 118 and the conductive lines 120 may be formed by depositing a seed layer of copper or a copper alloy, and filling the trenches using electroplating. A chemical mechanical planarization (CMP) process or the like may be used to remove excess conductive material from surfaces of the additional IMD layer and to planarize surfaces of the conductive lines 118 and the conductive lines 120 and the additional IMD layer for subsequent processing.

As illustrated in FIG. 32, the gate electrodes 102 which were formed from each stack of the first nanostructures 52 (illustrated in FIGS. 24A through 24C) may be electrically coupled to the same conductive lines 120. The gate electrodes 102 which were formed from adjacent first nanostructures 52 are connected to adjacent ones of the conductive lines 120. Each of the contacts 114 may be electrically coupled to one of the conductive lines 118. In some embodiments, the gate electrodes 102 may be word lines, which are connected to word signals through the contacts 116 and the conductive lines 120. The epitaxial source/drain regions 92 on a first side of the staircase structure 110 may be source lines, which are electrically coupled to a voltage source through the contacts 114 and the conductive lines 118 and the epitaxial source/drain regions 92 on a first side of the staircase structure 110 may be bit lines, which are electrically coupled to a ground through the contacts 114 and the conductive lines 118. Forming the nanostructures 55 in the staggered configuration of FIGS. 25A through 25C allows for single conductive lines 120 to be electrically coupled to the gate electrodes 102 formed from each stack of the first nanostructures 52, which simplifies the connection layout, reduces costs, and reduces device defects.

Embodiments may achieve various advantages. For example, forming the epitaxial source/drain regions 92 which are horizontally merged and vertically isolated from one another allows for separate connections to be made to each of the epitaxial source/drain regions 92A-C in the staircase structure 110. This increases the number of devices that can be provided in a given area (e.g., improves device density) and reduces costs.

In accordance with an embodiment, a memory array includes a first channel region over a semiconductor substrate; a first epitaxial region electrically coupled to the first channel region; a second epitaxial region directly over the first epitaxial region in a direction perpendicular to a major surface of the semiconductor substrate; a dielectric material between the first epitaxial region and the second epitaxial region, the second epitaxial region being isolated from the first epitaxial region by the dielectric material; a gate dielectric surrounding the first channel region; and a gate electrode surrounding the gate dielectric. In an embodiment, the memory array further includes a second channel region directly over the first channel region in the direction perpendicular to the major surface of the semiconductor substrate, the second channel region being electrically coupled to the second epitaxial region, the gate dielectric further surrounding the second channel region. In an embodiment, a ratio of a distance between the first channel region and the second channel region in the direction perpendicular to the major surface of the semiconductor substrate to heights of the first channel region and the second channel region is from 2 to 10. In an embodiment, the memory array further includes a second channel region directly over the first channel region in the direction perpendicular to the major surface of the semiconductor substrate, the second channel region being electrically coupled to the second epitaxial region; and a third channel region adjacent the first channel region in a direction parallel to the major surface of the semiconductor substrate, the third channel region being electrically coupled to the first epitaxial region. In an embodiment, a distance between the first channel region and the second channel region in the direction perpendicular to the major surface of the semiconductor substrate is greater than a distance between the first channel region and the third channel region in the direction parallel to the major surface of the semiconductor substrate. In an embodiment, a distance between the second epitaxial region and the semiconductor substrate is greater than a distance between the first epitaxial region and the semiconductor substrate, and a length of the second epitaxial region is less than a length of the first epitaxial region. In an embodiment, the gate dielectric includes a ferroelectric material.

In accordance with another embodiment, a semiconductor device includes a first channel region over a semiconductor substrate; a second channel region directly over the first channel region in a vertical direction; a first gate structure surrounding the first channel region and the second channel region; a third channel region adjacent the first channel region in a horizontal direction; a first source/drain region electrically coupled to the first channel region and the third channel region; and a second source/drain region electrically coupled to the second channel region and isolated from the first source/drain region, a first dielectric material extending between the first source/drain region and the second source/drain region. In an embodiment, a second gate structure surrounds the third channel region, the second gate structure being separated from the first gate structure by a second dielectric material. In an embodiment, the second source/drain region has a length less than a length of the first source/drain region. In an embodiment, the first source/drain region and the second source/drain region are bit lines or source lines, and the first gate structure is a word line. In an embodiment, the semiconductor device further includes a third source/drain region electrically coupled to the first channel region and the third channel region, the third source/drain region being disposed on a side of the first channel region and the third channel region opposite the first source/drain region, the first source/drain region being a source line, and the third source/drain region being a bit line. In an embodiment, the semiconductor device further includes a fourth channel region electrically coupled to the first source/drain region, a longitudinal axis of the fourth channel region being aligned with a longitudinal axis of the first channel region; a second gate structure surrounding the fourth channel region; a first conductive line electrically coupled to the first gate structure, the first conductive line being disposed on a first side of the first channel region and the fourth channel region in the horizontal direction; and a second conductive line electrically coupled to the second gate structure, the second conductive line being disposed on a second side of the first channel region and the fourth channel region opposite the first side in the horizontal direction. In an embodiment, the semiconductor device further includes a fourth channel region electrically coupled to the first source/drain region opposite the first channel region, a longitudinal axis of the fourth channel region being aligned with the first gate structure; and a second gate structure surrounding the fourth channel region, a longitudinal axis of the first channel region being aligned with the second gate structure.

In accordance with yet another embodiment, a method includes forming a multi-layer stack over a semiconductor substrate, the multi-layer stack including alternating layers of a first semiconductor material and a second semiconductor material; patterning the multi-layer stack to form a first plurality of nanostructures including the first semiconductor material and a second plurality of nanostructures including the second semiconductor material, the second plurality of nanostructures including a first nanostructure, a second nanostructure adjacent the first nanostructure in a direction parallel to a major surface of the semiconductor substrate and a third nano structure directly over the first nano structure in a direction perpendicular to the major surface of the semiconductor substrate; forming a gate structure over the multi-layer stack; etching the multi-layer stack to form a first recess adjacent the gate structure; and epitaxially growing source/drain regions from the second plurality of nanostructures, a first source/drain region epitaxially grown from the first nanostructure and a second source/drain region epitaxially grown from the second nano structure merging with one another, and a third source/drain region epitaxially grown from the third nanostructure being isolated from the first source/drain region after epitaxially growing the source/drain regions. In an embodiment, longitudinal axes of the first plurality of nanostructures and longitudinal axes of the second plurality of nanostructures extend parallel to a first direction, and after patterning the multi-layer stack, the first plurality of nanostructures and the second plurality of nanostructures form a first stack and a second stack separated from the first stack in the first direction. In an embodiment, after patterning the multi-layer stack, the first plurality of nanostructures and the second plurality of nanostructures further form a third stack separated from the first stack and the second stack in a second direction perpendicular to the first direction, a first end surface of the third stack being between opposite end surfaces of the first stack in the first direction, and a second end surface of the third stack opposite the first end surface being between opposite end surfaces of the second stack in the first direction. In an embodiment, the method further includes removing the first plurality of nanostructures and the gate structure to form a second recess; and forming a replacement gate structure in the second recess. In an embodiment, the method further includes patterning the replacement gate structure to form a third recess separating a first replacement gate structure from a second replacement gate structure; and forming a dielectric material in the third recess. In an embodiment, the method further includes forming a dielectric material between the first source/drain region and the third source/drain region, the dielectric material isolating the first source/drain region from the third source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
   a first channel region over a semiconductor substrate;
   a second channel region directly over the first channel region in a direction perpendicular to the major surface of the semiconductor substrate, wherein a ratio of a distance between the first channel region and the second channel region in the direction perpendicular to the major surface of the semiconductor substrate to heights of the first channel region and the second channel region is from 2 to 10;
   a third channel region adjacent the first channel region in a direction parallel to the major surface of the semiconductor substrate;
   a first epitaxial region electrically coupled to the first channel region and the third channel region;
   a second epitaxial region directly over the first epitaxial region in a direction perpendicular to a major surface of the semiconductor substrate, the second epitaxial region being electrically coupled to the second channel region;
   a dielectric material between the first epitaxial region and the second epitaxial region, wherein the second epitaxial region is isolated from the first epitaxial region by the dielectric material;
   a gate dielectric surrounding the first channel region; and
   a gate electrode surrounding the gate dielectric.

2. The memory array of claim 1, wherein the gate dielectric further surrounds the second channel region.

3. The memory array of claim 1, wherein a distance between the first channel region and the second channel region in the direction perpendicular to the major surface of the semiconductor substrate is greater than a distance between the first channel region and the third channel region in the direction parallel to the major surface of the semiconductor substrate.

4. The memory array of claim 1, wherein a distance between the second epitaxial region and the semiconductor substrate is greater than a distance between the first epitaxial region and the semiconductor substrate, and wherein a length of the second epitaxial region is less than a length of the first epitaxial region.

5. The memory array of claim 1, wherein the gate dielectric comprises a ferroelectric material.

6. The memory array of claim 1, further comprising:
   a second gate dielectric surrounding the third channel region; and
   a second gate electrode surrounding the second gate dielectric, the second gate electrode being separated from the gate electrode by a second dielectric material.

7. A semiconductor device comprising:
   a first channel region over a semiconductor substrate;
   a second channel region directly over the first channel region in a vertical direction;
   a first gate structure surrounding the first channel region and the second channel region;
   a third channel region adjacent the first channel region in a horizontal direction;
   a first source/drain region electrically coupled to the first channel region and the third channel region; and
   a second source/drain region electrically coupled to the second channel region and isolated from the first source/drain region, wherein a first dielectric material extends between the first source/drain region and the second source/drain region, wherein the first source/drain region and the second source/drain region are bit lines or source lines, and wherein the first gate structure is a word line, wherein a distance between the first channel region and the second channel region in the vertical direction is greater than a distance between the first channel region and the third channel region in the horizontal direction.

8. The semiconductor device of claim 7, wherein a second gate structure surrounds the third channel region, the second gate structure being separated from the first gate structure by a second dielectric material.

9. The semiconductor device of claim 7, wherein the second source/drain region has a length less than a length of the first source/drain region.

10. The semiconductor device of claim 7, further comprising a third source/drain region electrically coupled to the first channel region and the third channel region, the third source/drain region being disposed on a side of the first channel region and the third channel region opposite the first source/drain region, wherein the first source/drain region is a source line, and wherein the third source/drain region is a bit line.

11. The semiconductor device of claim 7, further comprising:
a fourth channel region electrically coupled to the first source/drain region, wherein a longitudinal axis of the fourth channel region is aligned with a longitudinal axis of the first channel region;
a second gate structure surrounding the fourth channel region;
a first conductive line electrically coupled to the first gate structure, the first conductive line being disposed on a first side of the first channel region and the fourth channel region in the horizontal direction; and
a second conductive line electrically coupled to the second gate structure, the second conductive line being disposed on a second side of the first channel region and the fourth channel region opposite the first side in the horizontal direction.

12. The semiconductor device of claim 7, further comprising:
a fourth channel region electrically coupled to the first source/drain region opposite the first channel region, wherein a longitudinal axis of the fourth channel region is aligned with the first gate structure; and
a second gate structure surrounding the fourth channel region, wherein a longitudinal axis of the first channel region is aligned with the second gate structure.

13. A semiconductor device comprising:
a plurality of nanostructures on a semiconductor substrate, the nanostructures comprising a first semiconductor material, the nanostructures comprising a first nanostructure, a second nanostructure adjacent the first nanostructure in a direction parallel to a major surface of the semiconductor substrate, and a third nanostructure on the first nanostructure in a direction perpendicular to the major surface of the semiconductor substrate;
a first gate structure surrounding the first nanostructure and the third nanostructure;
a first source/drain region extending from the first nanostructure to the second nanostructure; and
a second source/drain region extending from the third nanostructure, wherein the second source/drain region is isolated from the first source/drain region, wherein a ratio of a distance between the first nanostructure and the third nanostructure in the direction perpendicular to the major surface of the semiconductor substrate to heights of the first nanostructure and the third nanostructure is from 2 to 10.

14. The semiconductor device of claim 13, further comprising:
a first source/drain contact electrically coupled to the first source/drain region, the first source/drain contact having a first height between a first top surface and a first bottom surface; and
a second source/drain contact electrically coupled to the second source/drain region, the second source/drain contact having a second height between a second top surface and a second bottom surface, the second height being less than the first height.

15. The semiconductor device of claim 13, further comprising a dielectric material between the first source/drain region and the second source/drain region, the dielectric material isolating the first source/drain region from the second source/drain region.

16. The semiconductor device of claim 13, wherein the first source/drain region has a first length in a first direction parallel to the major surface of the semiconductor substrate greater than a second length of the second source/drain region in the first direction.

17. The semiconductor device of claim 13, further comprising a second gate structure surrounding the second nanostructure and isolated from the first gate structure.

18. The semiconductor device of claim 13, wherein a longitudinal axis of the first gate structure extends perpendicular to the major surface of the semiconductor substrate, and wherein a longitudinal axis of the first source/drain region extends parallel to the major surface of the semiconductor substrate.

19. The semiconductor device of claim 7, wherein a ratio of the distance between the first channel region and the second channel region in the direction perpendicular to the major surface of the semiconductor substrate to heights of the first nanostructure and the second nanostructure is from 2 to 10.

20. The semiconductor device of claim 8, wherein the second dielectric material comprises a ferroelectric material.

* * * * *